United States Patent
Singh et al.

(10) Patent No.: US 12,293,913 B1
(45) Date of Patent: May 6, 2025

(54) DIRECTED SELF-ASSEMBLY ENABLED SUBTRACTIVE METAL PATTERNING

(71) Applicant: INTEL CORPORATION, Santa Clara, CA (US)

(72) Inventors: Gurpreet Singh, Portland, OR (US); Richard E. Schenker, Portland, OR (US); Nityan Labros Nair, Portland, OR (US); Nafees A. Kabir, Portland, OR (US); Gauri Nabar, Hillsboro, OR (US); Eungnak Han, Portland, OR (US); Xuanxuan Chen, Hillsboro, OR (US); Tayseer Mahdi, Beaverton, OR (US); Brandon Jay Holybee, Portland, OR (US); Charles Henry Wallace, Portland, OR (US); Paul A. Nyhus, Portland, OR (US); Manish Chandhok, Beaverton, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 366 days.

(21) Appl. No.: 17/559,363

(22) Filed: Dec. 22, 2021

(51) Int. Cl.
  *H01L 23/532* (2006.01)
  *H01L 21/027* (2006.01)

(52) U.S. Cl.
  CPC .... *H01L 21/0271* (2013.01); *H01L 23/53209* (2013.01)

(58) Field of Classification Search
  CPC ............... H01L 21/0271; H01L 23/528; H01L 21/76808; H01L 23/5226; H01L 21/823475; H01L 21/823871; H01L 23/522; H01L 24/19; H01L 21/76877; H01L 21/76885; H01L 23/485
  See application file for complete search history.

(56) References Cited

U.S. PATENT DOCUMENTS

| | | | | |
|---|---|---|---|---|
| 5,032,491 | A * | 7/1991 | Okumura | H01L 21/0271 257/E21.256 |
| 8,446,762 | B2 * | 5/2013 | Tang | H10B 12/20 438/257 |
| 8,692,788 | B2 * | 4/2014 | Cho | G06F 3/0443 349/110 |
| 9,543,193 | B2 * | 1/2017 | Lu | H01L 21/31144 |
| 10,283,526 | B2 * | 5/2019 | Zhu | H01L 23/5386 |
| 10,522,395 | B1 * | 12/2019 | Light | H01L 21/76816 |
| 10,629,527 | B2 * | 4/2020 | Liu | H01L 21/76807 |
| 2008/0035956 | A1 * | 2/2008 | Manning | G11C 11/4097 438/587 |
| 2019/0363008 | A1 * | 11/2019 | Gstrein | H01L 21/76877 |

(Continued)

*Primary Examiner* — Jay C Chang
(74) *Attorney, Agent, or Firm* — Akona IP PC

(57) ABSTRACT

Described herein are IC devices include tight-pitched patterned metal layers, such as metal gratings, and processes for forming such patterned metal layers. The processes include subtractive metal patterning, where portions of a metal layer are etched and replaced with an insulator to form the metal grating. Masks for etching portions of the metal layer are generated using directed self-assembly (DSA). In some examples, multiple etching steps are performed, e.g., to generate metal lines at a first pitch, and to add additional lines at half of the first pitch. In some examples, additive metal patterning is performed in addition to subtractive metal patterning.

20 Claims, 45 Drawing Sheets

(56) References Cited

U.S. PATENT DOCUMENTS

2020/0365519 A1* 11/2020 Cheng .................. H01L 23/544
2020/0388565 A1* 12/2020 Lin ..................... H01L 23/5222
2021/0090952 A1*  3/2021 Freed ................ H01L 21/76897
2022/0320000 A1* 10/2022 Yokoyama ............. H10B 12/50

* cited by examiner

| | 202 |
| | 204 |
| | 208 |
| | 210 |
| | 212 |

DIRECTED SELF-ASSEMBLY ENABLED SUBTRACTIVE METAL PATTERNING

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
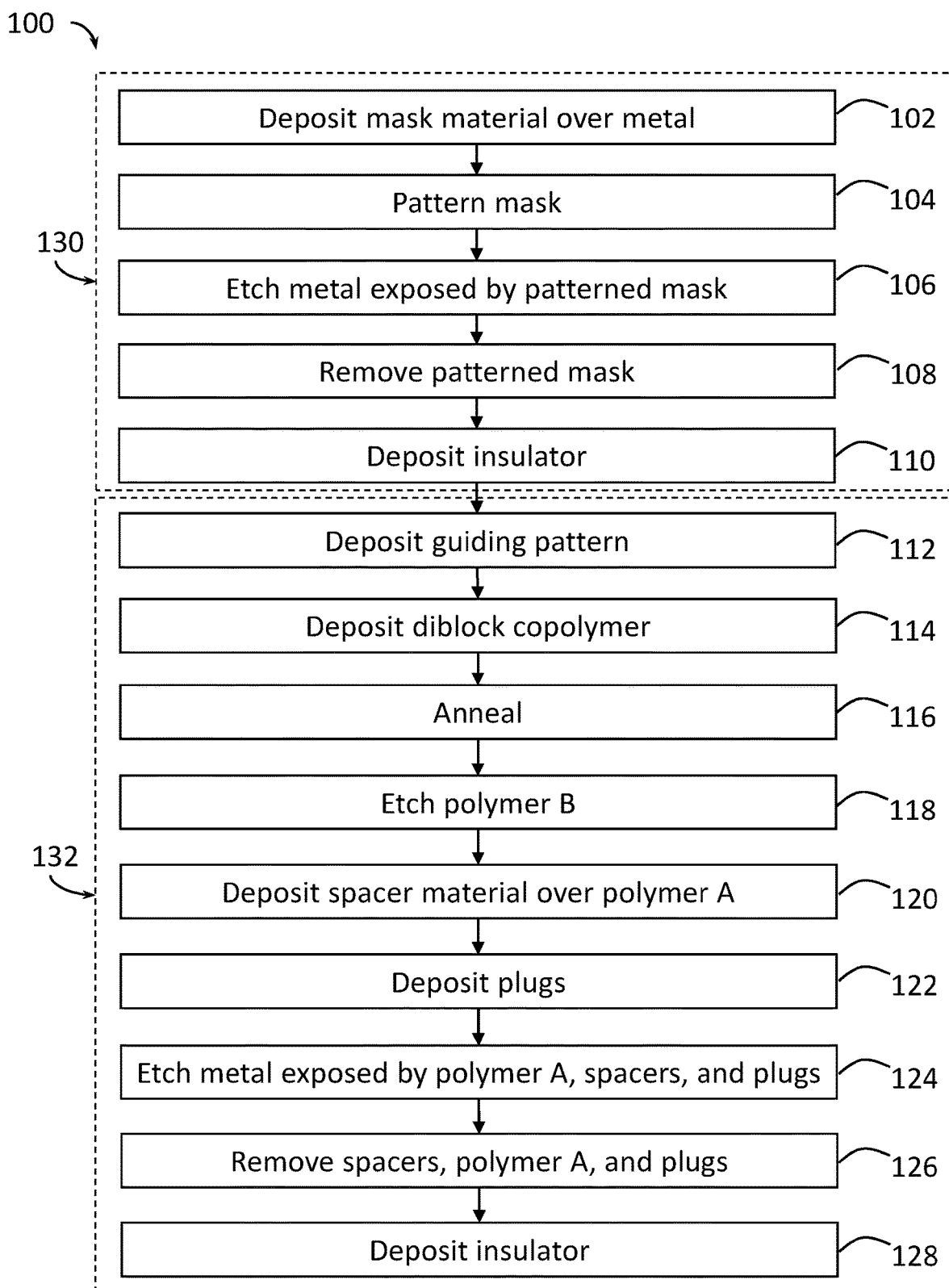
FIG. 1 is a flow chart illustrating a first process for generating a patterned metal layer using directed self-assembly (DSA), according to some embodiments of the present disclosure.

Integrated circuits commonly include electrically conductive microelectronic structures to electrically connect different portions of the circuits. Electrically conductive structures include metal lines, which are typically formed within a given layer (e.g., a metal layer), and vias, which connect to metal lines or other interconnects in layers above or below the vias. Metal structures are typically formed by a lithographic process. For example, a photoresist layer may be spin coated over a dielectric layer, the photoresist layer may be exposed to patterned actinic radiation through a patterned mask, and then the exposed layer may be developed to form openings (e.g., lines openings for metal lines or hole openings for vias) in the photoresist layer. Next, openings may be etched in the dielectric layer by using the opening in the photoresist layer as an etch mask. Finally, the openings may be filled with one or more metals or other conductive materials to form the electrically conductive structures.

In the past, the sizes and the spacing of electrically conductive structures has progressively decreased, and it is expected that in the future the sizes and the spacing of the structures will continue to progressively decrease, for at least some types of integrated circuits (e.g., advanced microprocessors, chipset components, graphics chips, etc.). One measure of the size of the electrically conductive structures is the critical dimension, e.g., a diameter or some other transverse cross-sectional dimension of the structure. Another measure of the spacing of the electronic structures is the pitch, representing the center-to-center distance between the closest adjacent structures.

When patterning extremely small structures with extremely small pitches by such lithographic processes, several challenges present themselves. One such challenge is that the overlay between adjacent layers, e.g., an overlay between a metal interconnect layer and a via layer, generally need to be controlled to high tolerances on the order of a quarter of the pitch. As pitches in microelectronic devices scale ever smaller over time, the overlay tolerances tend to scale with them at an even greater rate than lithographic equipment.

Another such challenge is that the critical dimensions of the openings generally tend to scale faster than the resolution capabilities of the lithographic scanners. Rectification technologies exist to reduce critical dimensions, however, the reduced amount tends to be limited by the minimum pitch, as well as by the ability of the opening rectification process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the openings decrease to maintain the same overall fraction of the critical dimension budget. However, currently the LWR and/or CDU characteristics of most photoresists are not improving as rapidly as the critical dimensions of the structures are decreasing.

A further such challenge is that the extremely small pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print line and via openings at these extremely small pitches using EUV scanners. Even though EUV defined line and via openings offer a lot of design flexibility and helps save number of masks, EUV defined openings show a lot of variability in LWR and/or CDU due to stochastic nature of the process. The variability increases with decreasing critical dimensions. Additionally, the opening critical dimensions needed are beyond what EUV can do currently.

As described herein, various processes may use directed self-assembly (DSA) to form metal patterns, such as tightly-pitched or variably-pitched metal gratings. DSA enables the formation of patterns and structures with very low variability, providing a high degree of control at very small pitches, e.g., to generate structures with pitches below 30 nanometers or below 20 nanometers. DSA is used in combination with subtractive metal patterning, or a combination of subtractive metal patterning and additive metal patterning, to generate metal patterns. For example, a DSA process can be performed over a metal layer, and the DSA process can generate a pattern over the metal layer. The pattern can be used to selectively etch portions of the metal layer to form a metal grating.

The DSA approaches described herein involve depositing a diblock copolymer over a guiding pattern to generate various linear structures or other types of patterns. A diblock copolymer is a polymeric molecule formed of a chain of covalently bonded monomers. In a diblock copolymer, there are two different types of monomers, and these different types of monomers are primarily included within different blocks or contiguous sequences of monomers, e.g., a block of polymer A, and a block of polymer B. The two different monomers making up the diblock copolymer may have different chemical properties, e.g., polymer A may be relatively more hydrophobic, and polymer B may be relatively more hydrophilic.

In addition to the DSA process for forming tight-pitch patterns, additional processing steps can be performed to adjust the placement and widths of various features. For example, spacers and plugs may be deposited over a pattern formed using DSA to produce narrower structures than DSA alone allows. As another example, multiple DSA patterns may be formed to generate very small pitches, e.g., a first DSA pattern may be used to generate a first set of lines at a first pitch in a structure, and a second DSA pattern may be used to generate a second set of lines at the first pitch in the structure, where the second set of lines are positioned between the first set of lines. This approach may be referred to as pitch-halving, because the second set of lines generate a pattern with half the pitch of the first set of lines. In some embodiments, the first set of lines are produced by subtractive metal patterning, and the second set of lines are produced by additive metal patterning.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with structures formed using the DSA process described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Process for Generating a Patterned Metal Layer with Multiple Line Widths and Multiple Pitches FIG. 1 is a flow chart illustrating a first process 100 for generating a patterned metal layer using DSA, according to some embodiments of the present disclosure. The process 100 may be used to generate a patterned metal layer with a high degree of customization. For example, the patterned metal layer may have multiple pitches and/or multiple line widths across the layer. The patterned metal layer also has a high degree of precision at tight pitches, e.g., at pitches less than 30 nanometers.

Figure 2A:
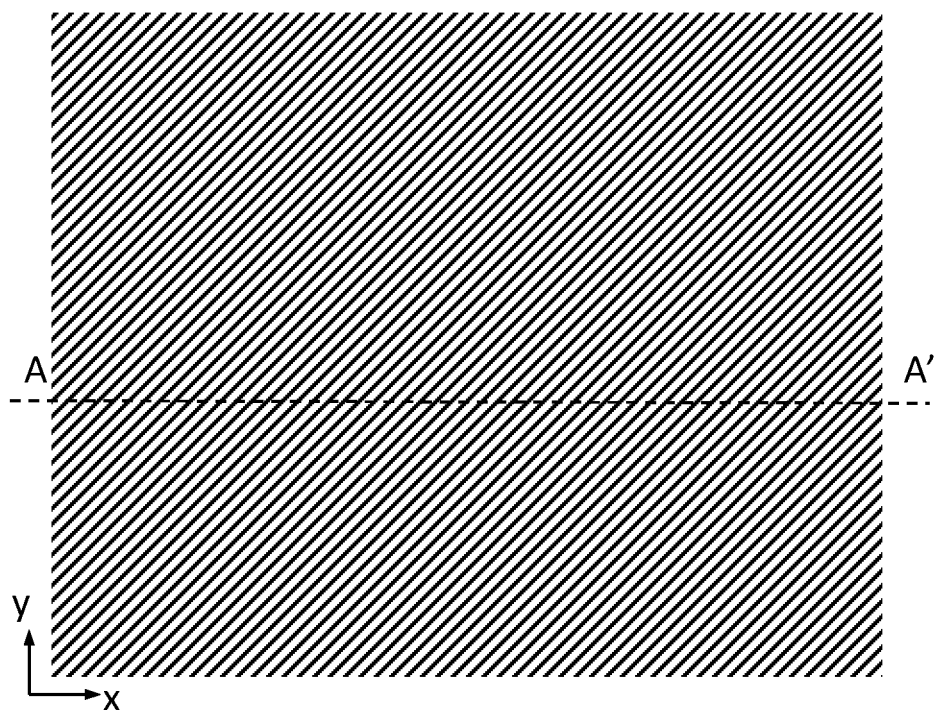
FIGS. 2A-2N illustrate various stages in the process of generating the patterned metal layer according to the process of FIG. 1, according to some embodiments of the present disclosure.
Figure 2A:
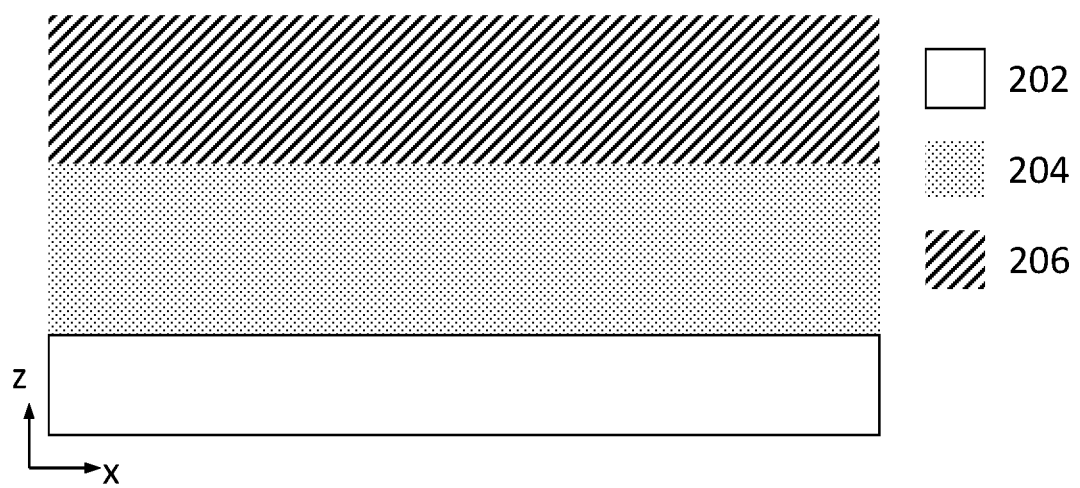
Figure 2B:
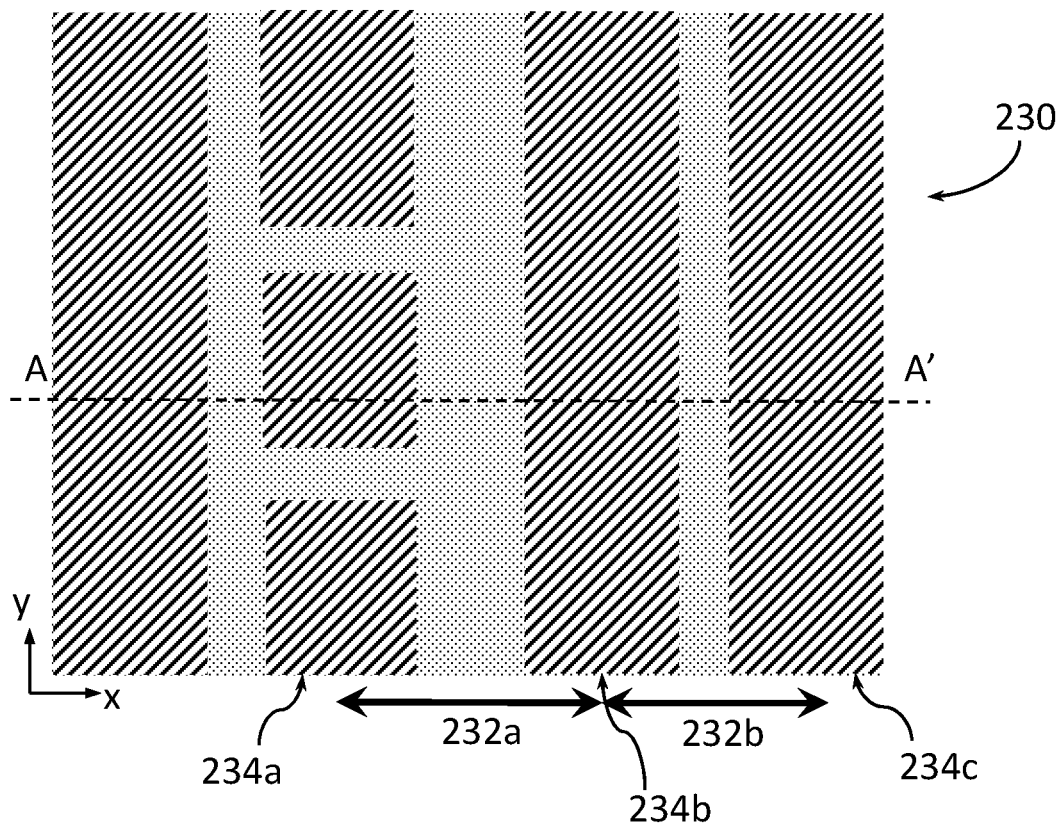
Figure 2B:
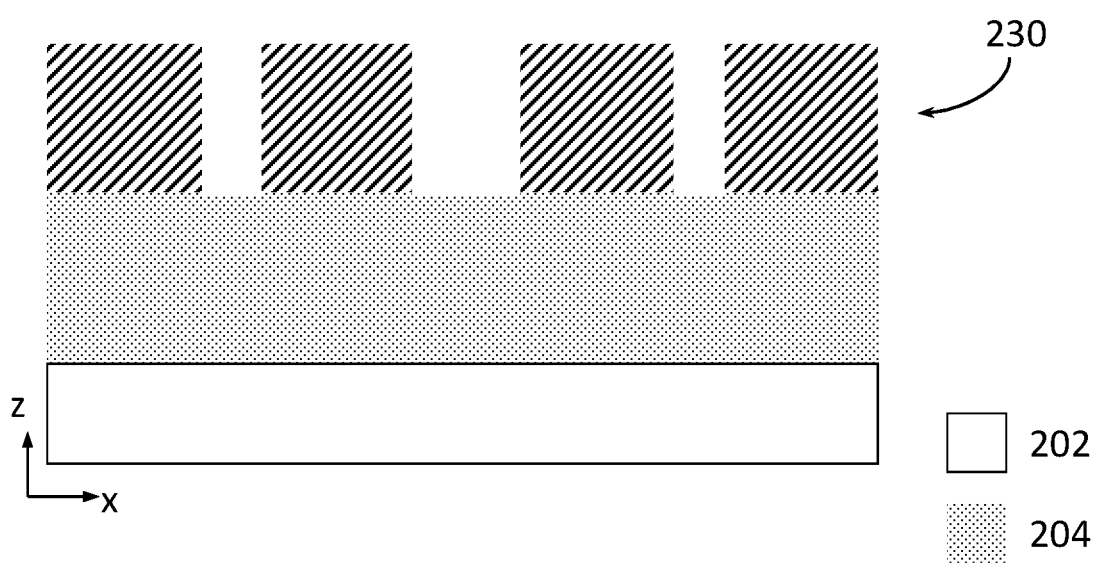
Figure 2C:
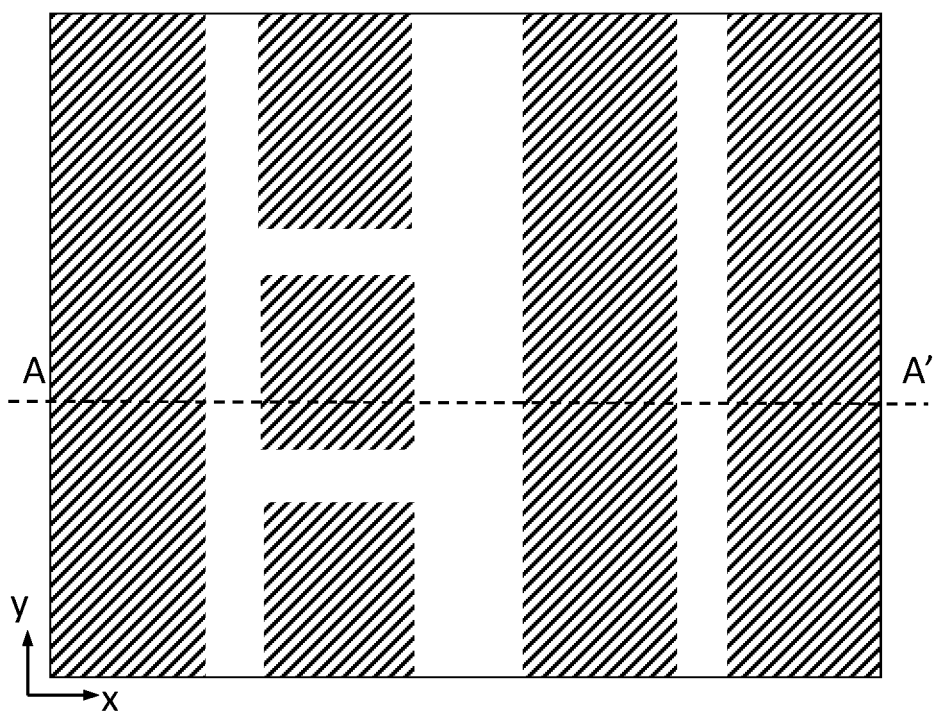
Figure 2C:
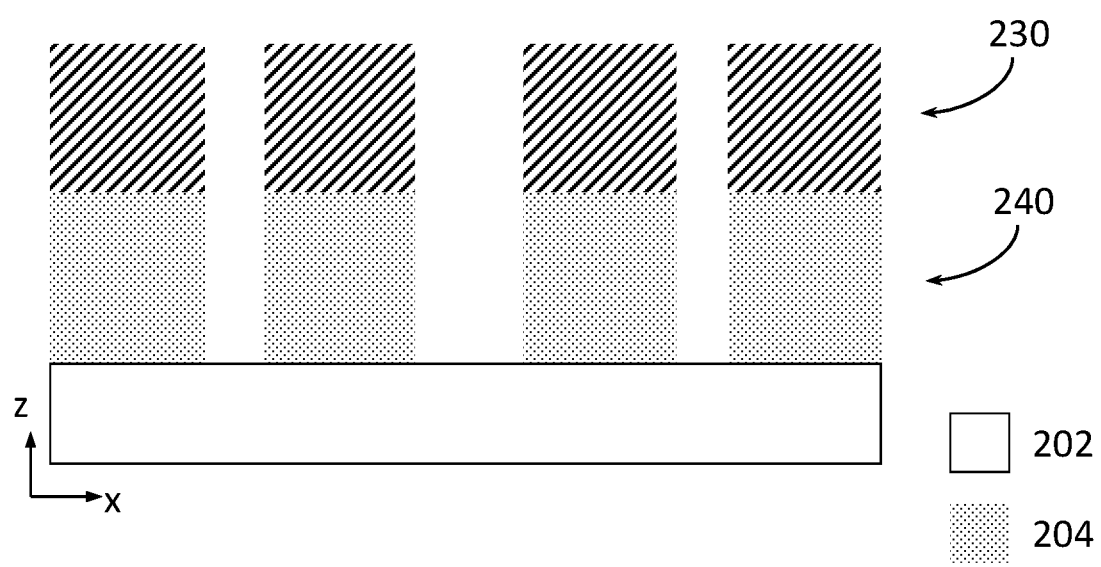
Figure 2D:
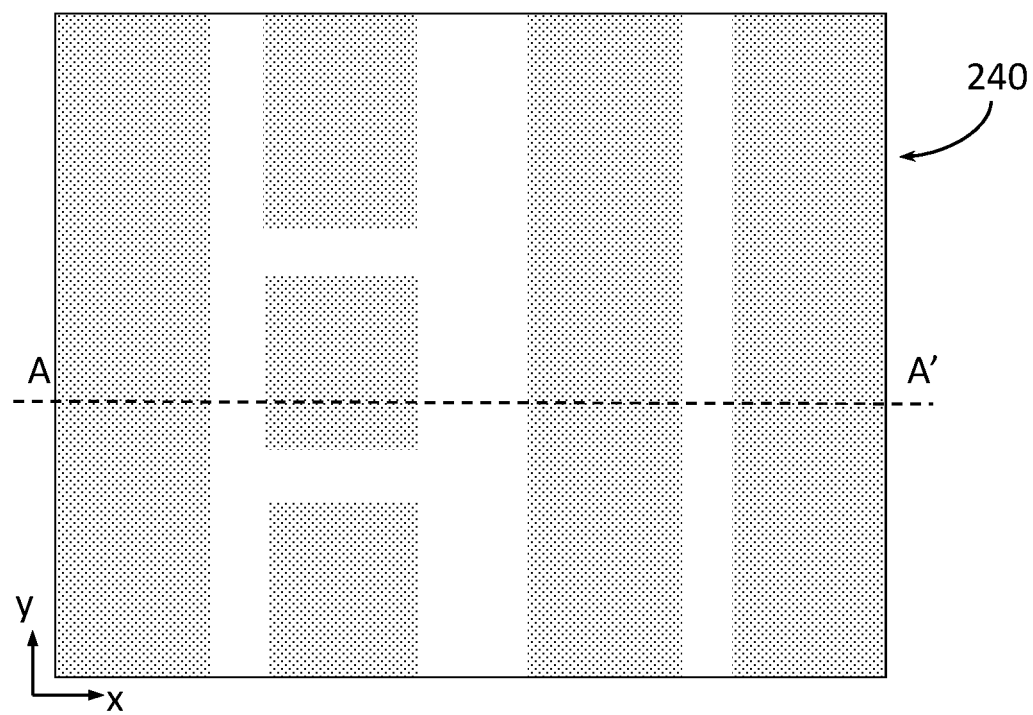
Figure 2D:
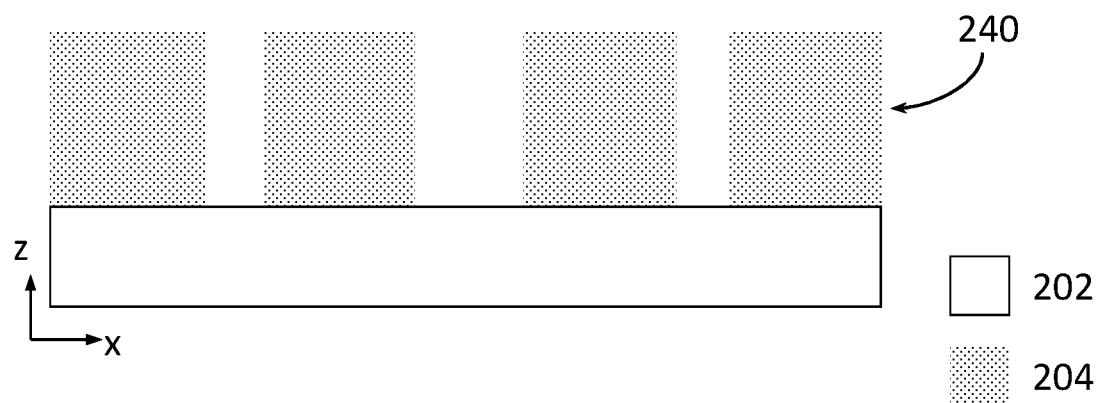
Figure 2E:
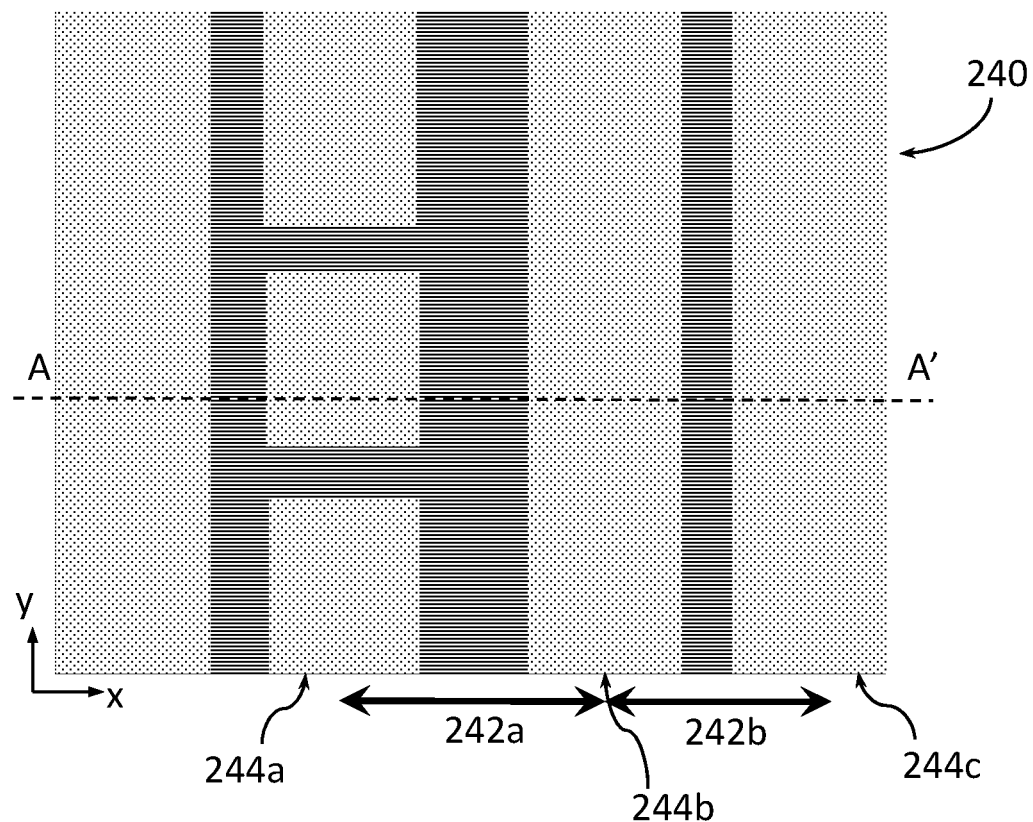
Figure 2E:
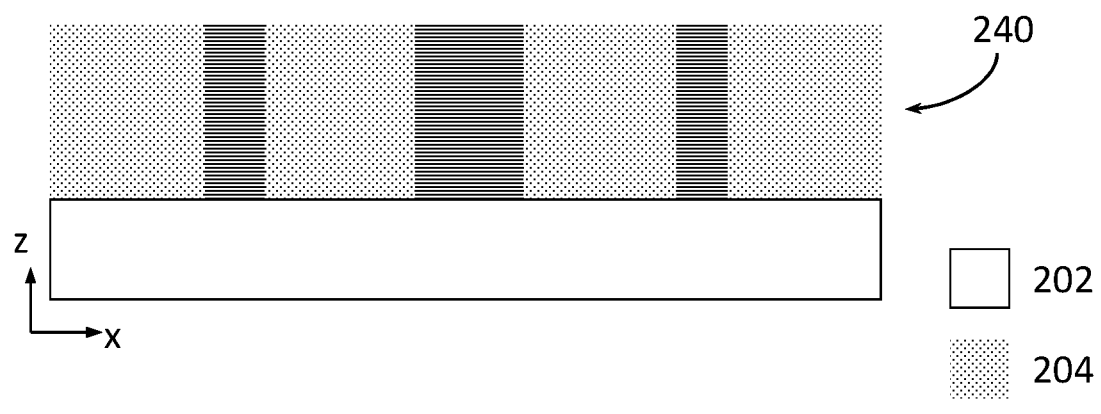
Figure 2F:
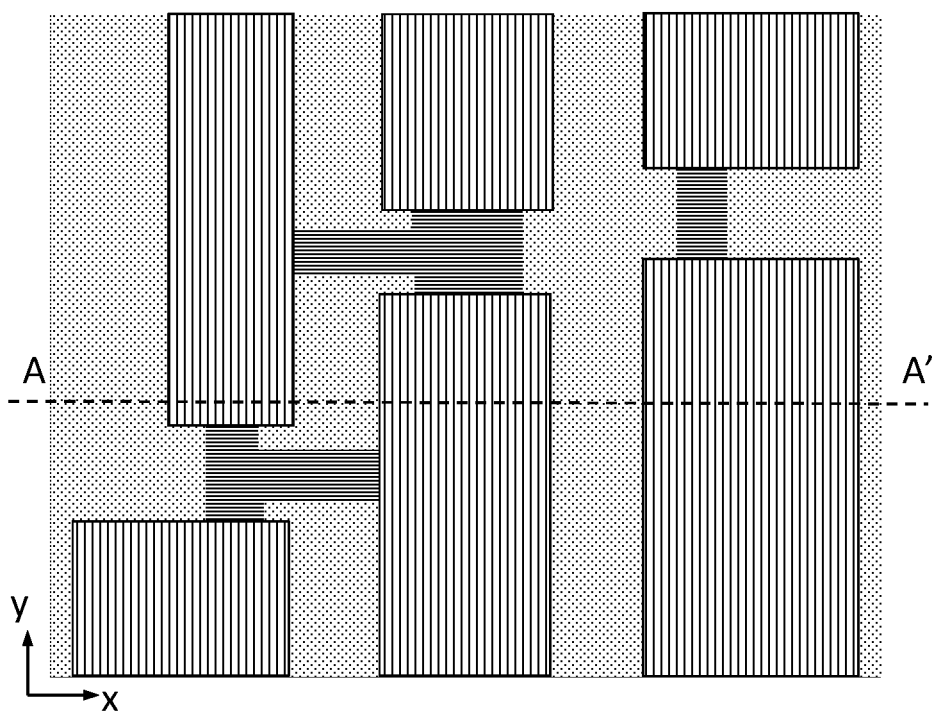
Figure 2F:
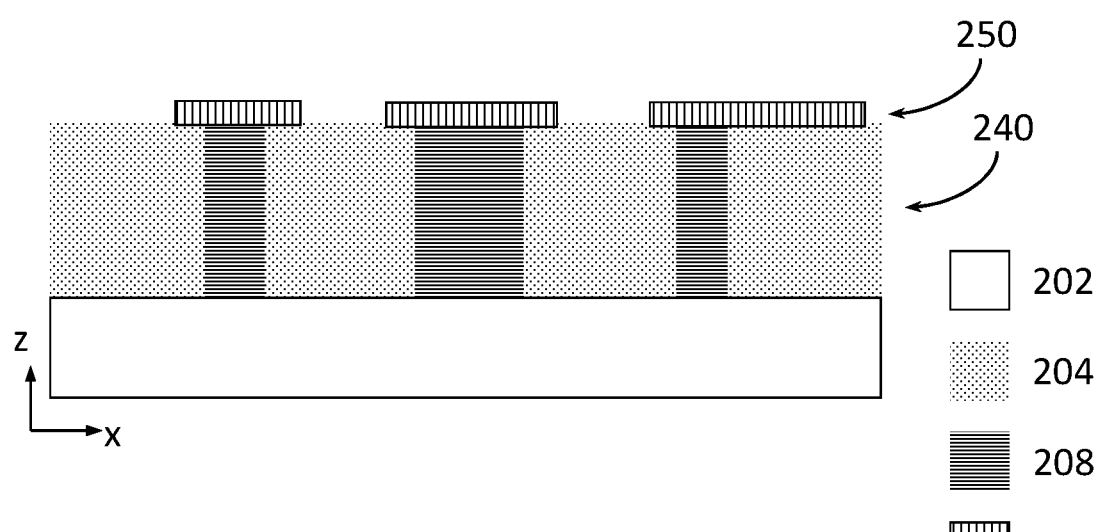
Figure 2G:
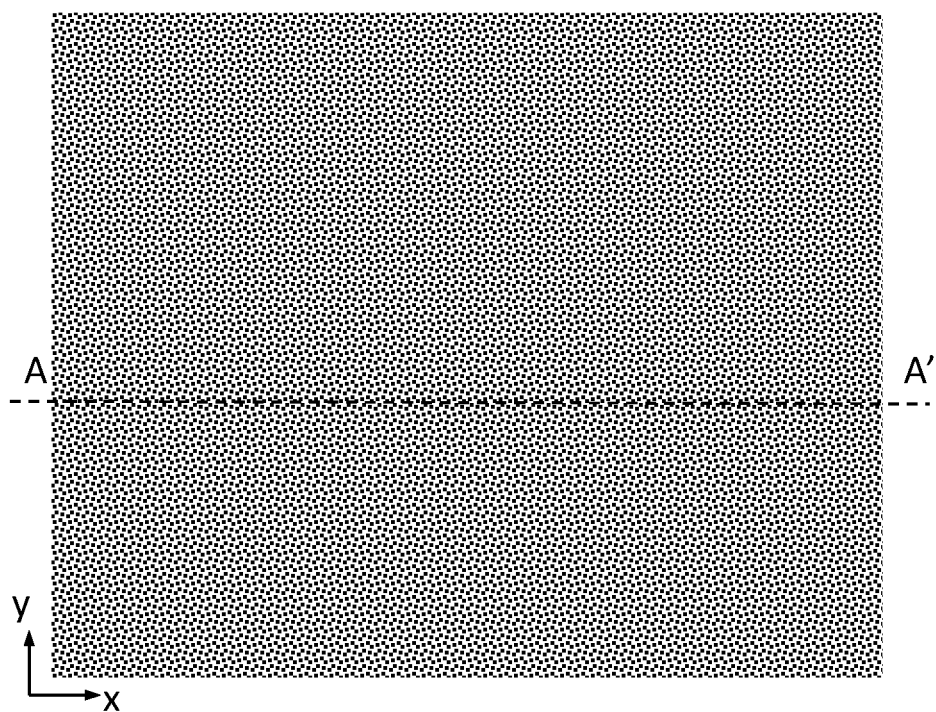
Figure 2G:
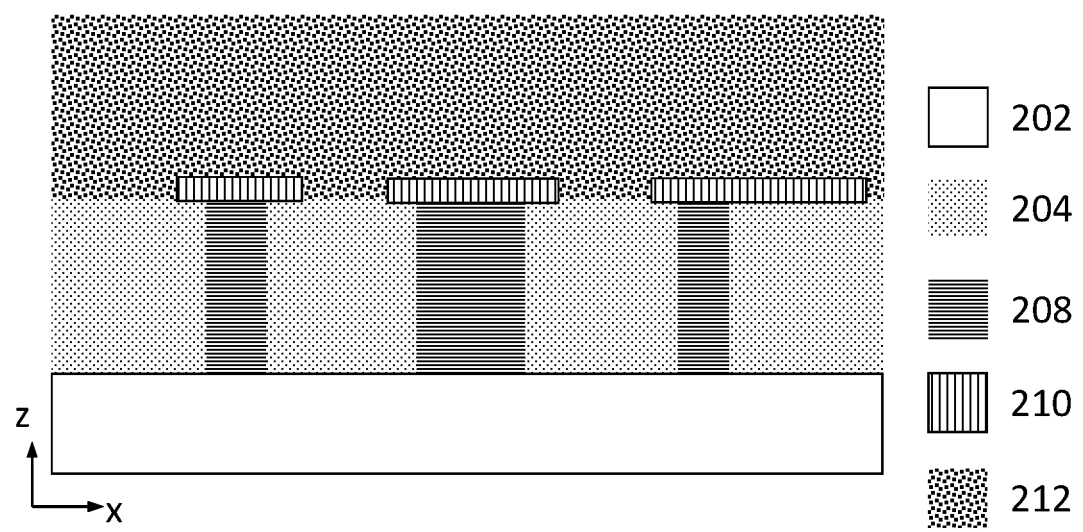
Figure 2H:
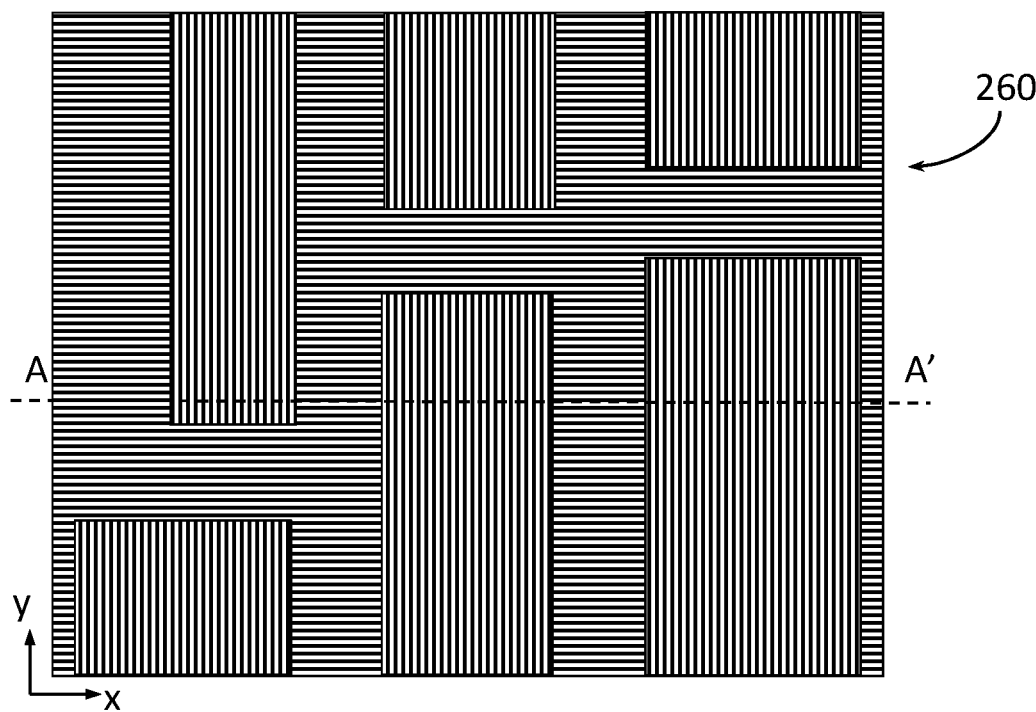
Figure 2H:
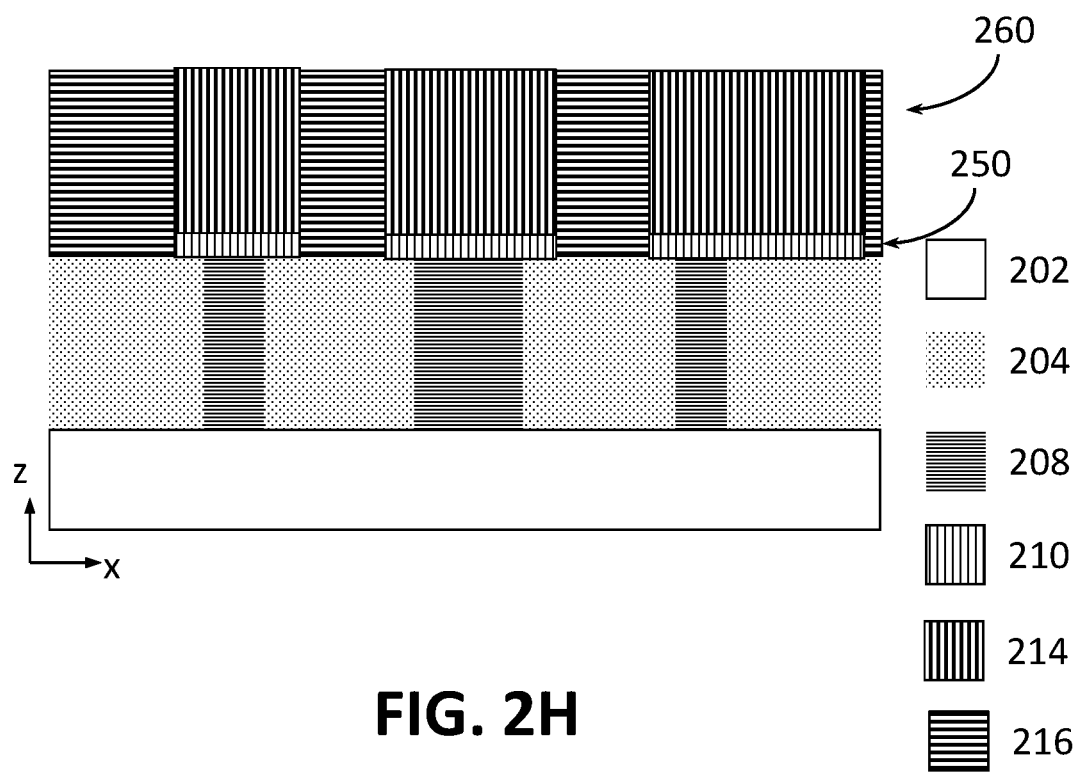
Figure 2I:
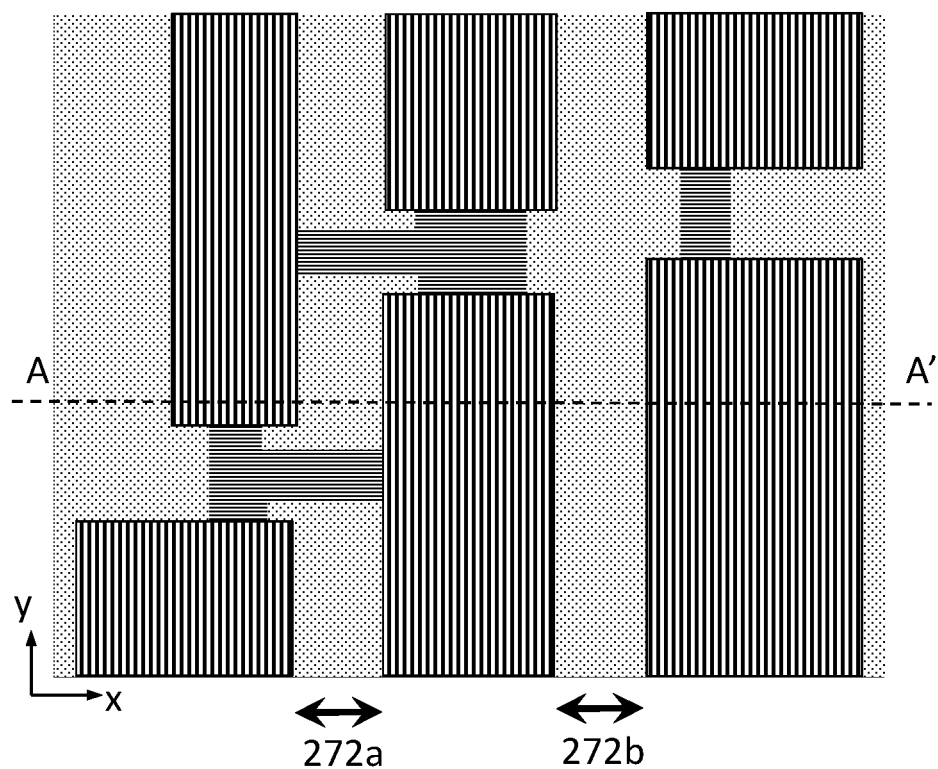
Figure 2I:
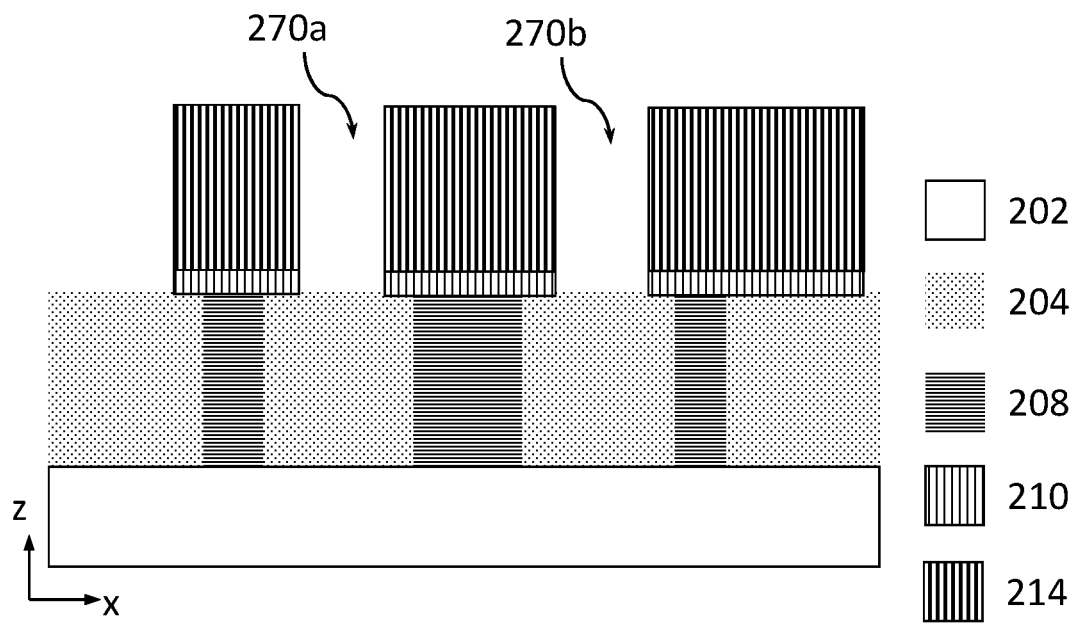
Figure 2J:
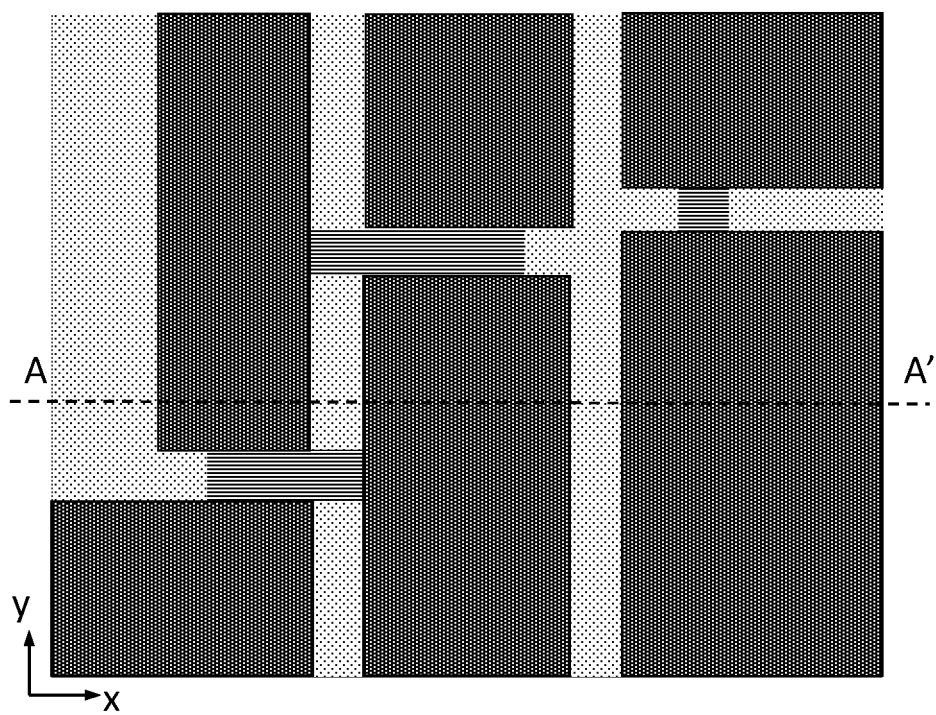
Figure 2J:
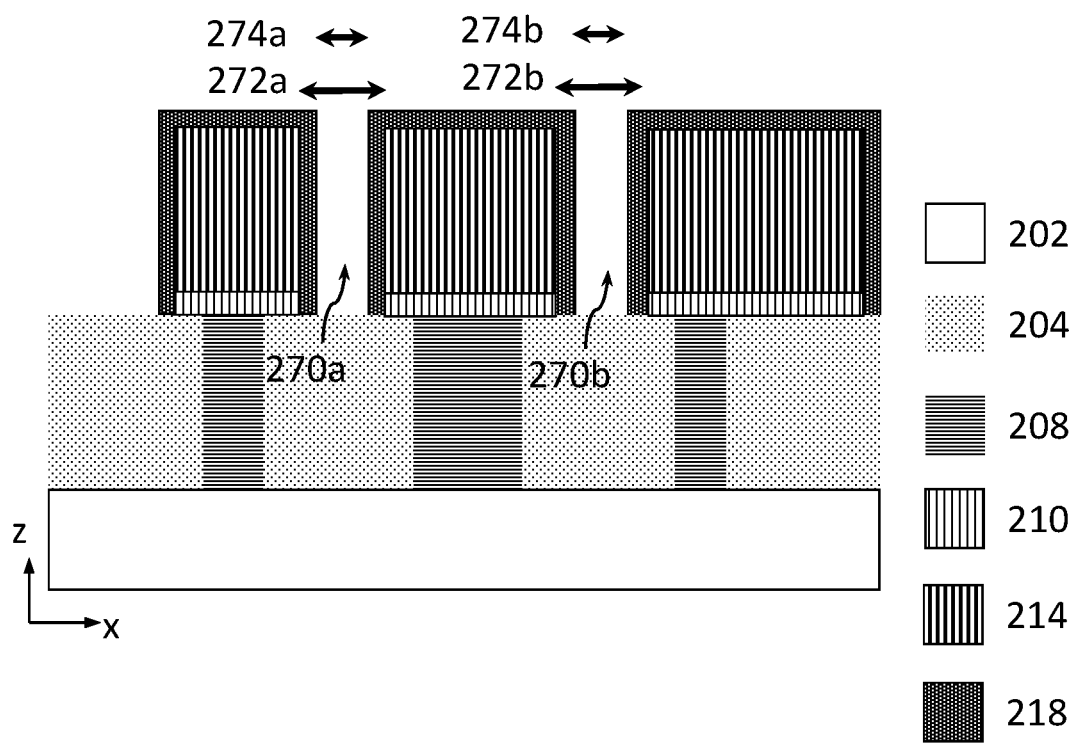
Figure 2K:
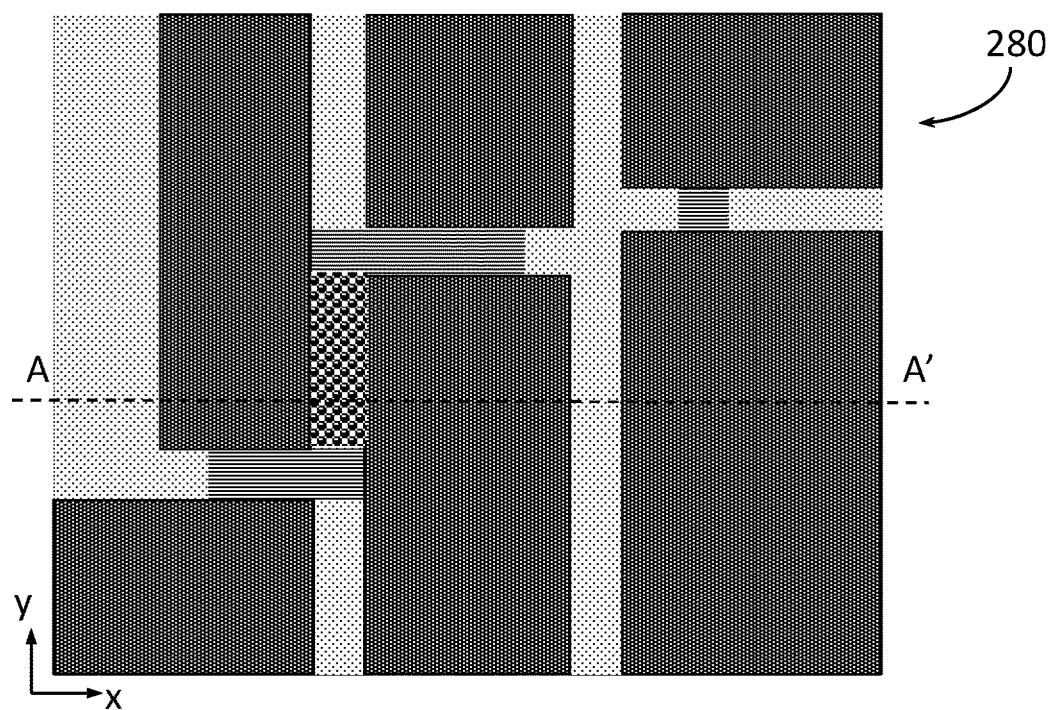
Figure 2K:
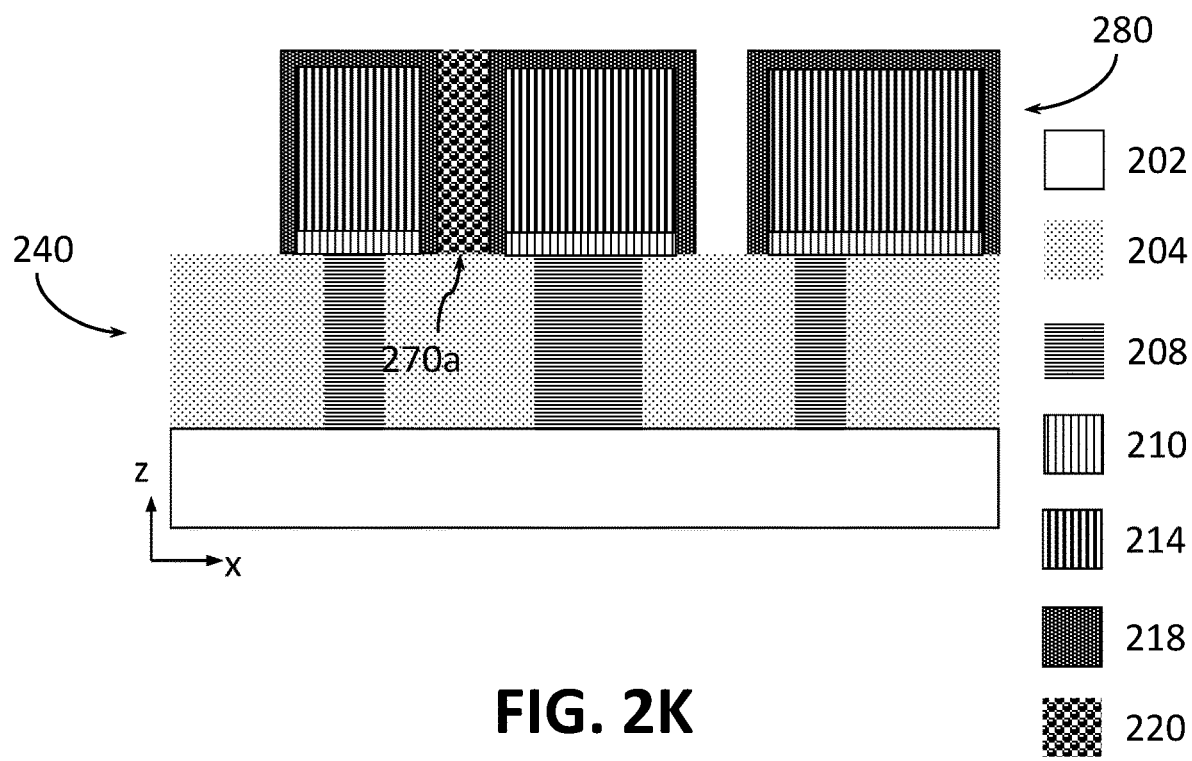
Figure 2L:
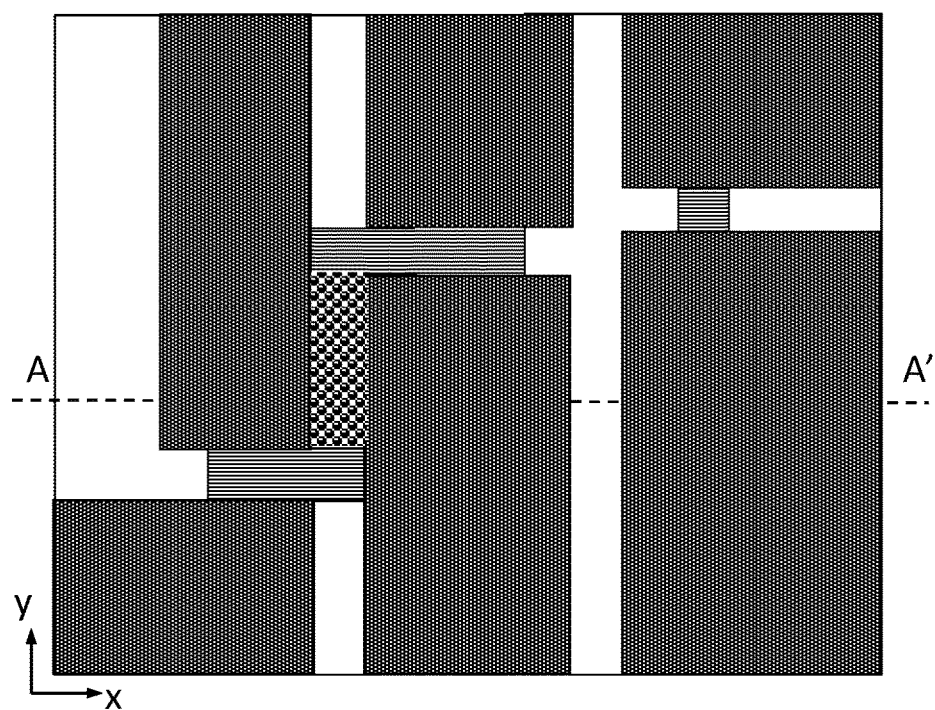
Figure 2L:
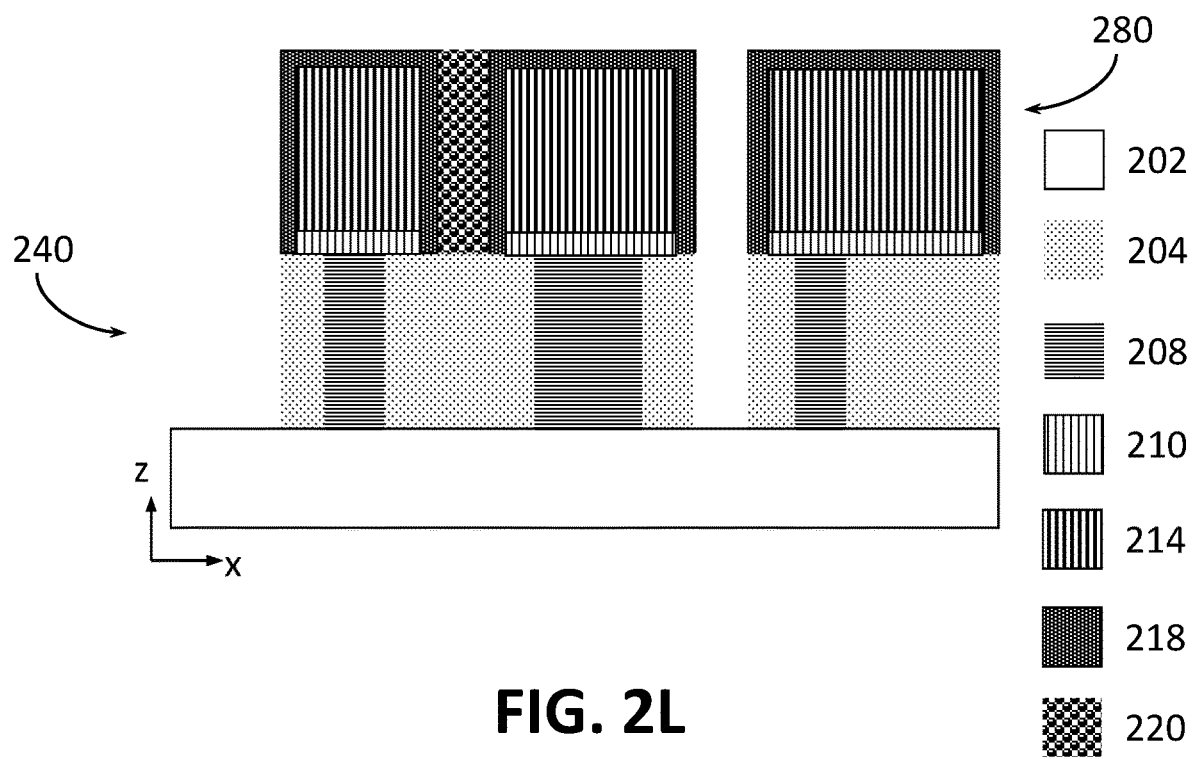
Figure 2M:
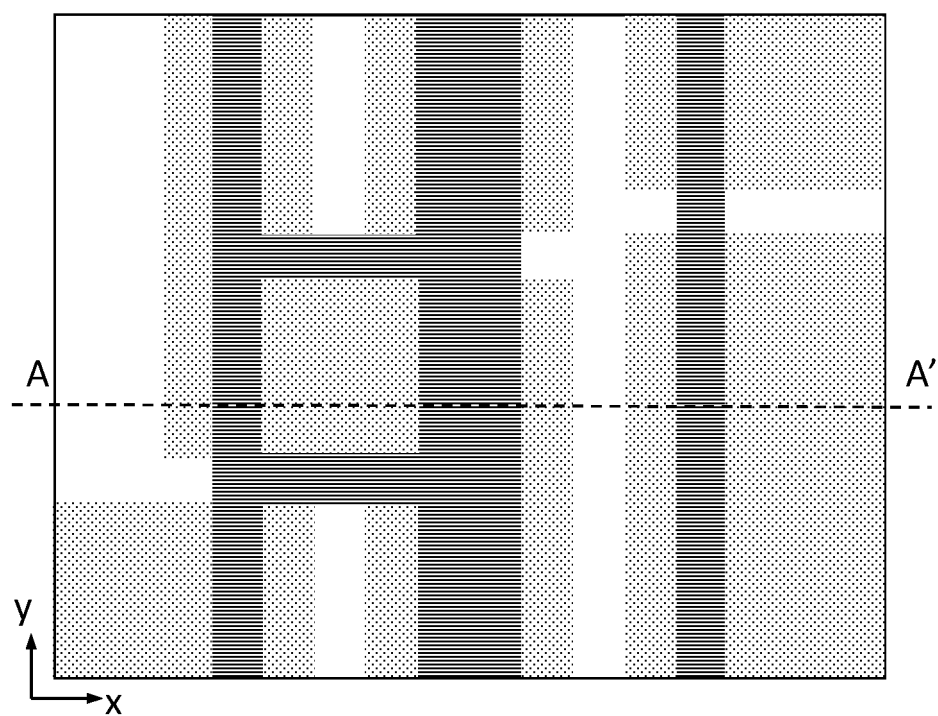
Figure 2M:
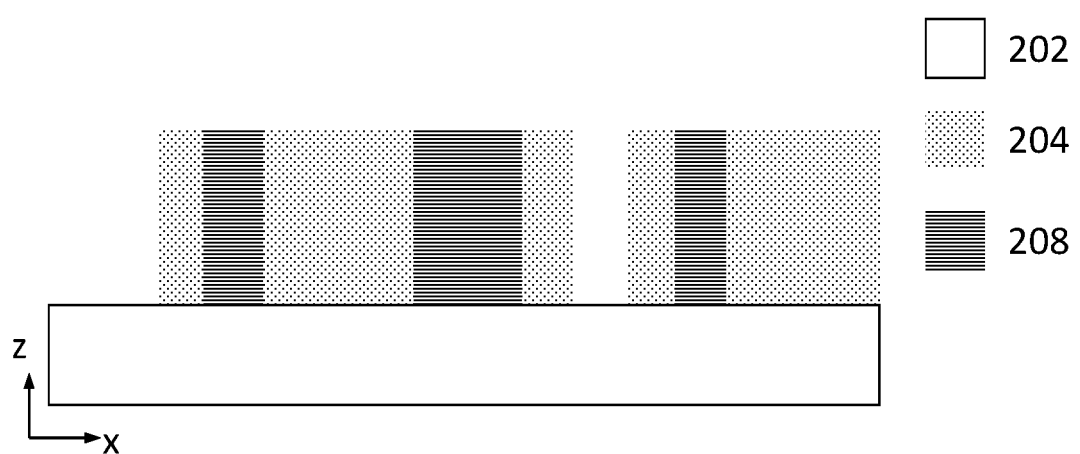
Figure 2N:
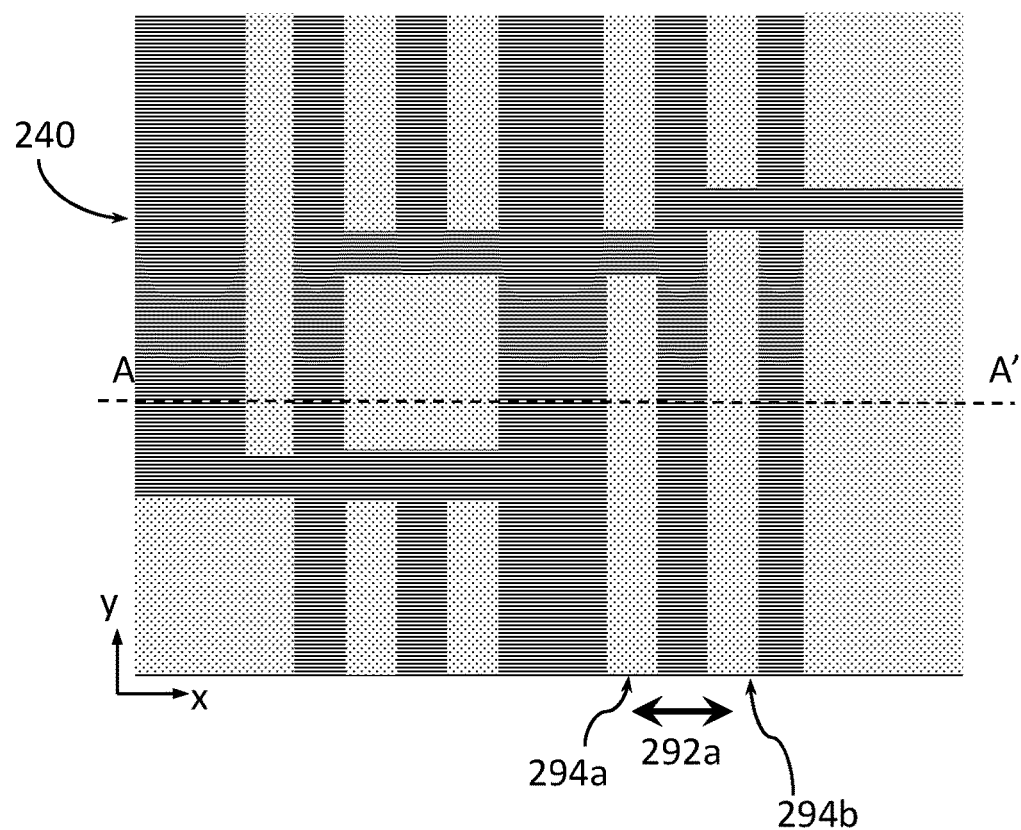
Figure 2N:
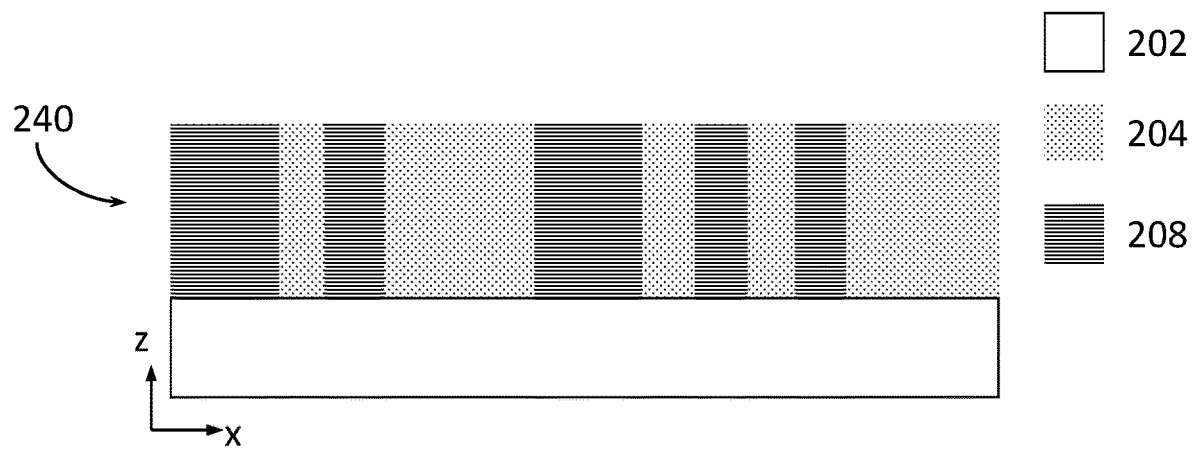

FIGS. 2A-2N illustrate various stages in the process of generating the patterned metal layer according to the method of FIG. 1, according to some embodiments of the present disclosure. More specifically, FIGS. 2A-2N illustrate top-down and cross-sectional side views for various stages in the process of generating the patterned metal layer according to the process 100. In particular, each of FIGS. 2A-2N shows, at the top of the page of the drawing, a top-down view (i.e., a view in a x-y plane) of an IC structure, and at the bottom of the drawing, a cross-section side view of the IC structure with the cross-section taken along an x-z plane AA' of the reference coordinate system x-y-z shown in FIGS. 2A-2N.

A number of elements referred to in the description of FIGS. 2A-2N with reference numerals are illustrated in these figures with different patterns, with a legend showing the correspondence between the reference numerals and patterns being provided at the bottom of each drawing page containing FIGS. 2A-2N. For example, the legend illustrates that FIGS. 2A-2N use different patterns to show a support structure 202, a metal 204, and a mask 206. Furthermore, although certain example metal patterns are illustrated in some of 2A-2N, this is simply for ease of illustration, and it should be understood that different IC structures having different patterns may be obtained according to the disclosure. Still further, various IC structure views shown in FIGS. 2A-2N are intended to show relative arrangements of various elements therein, and that various IC structures, or portions thereof, may include other elements or components that are not illustrated (e.g., transistor portions, various components that may be in electrical contact with the capacitor or contacts, etc.).

FIG. 2A illustrates an example of a support structure 202, over which a layer of metal 204 and a mask 206 have been deposited. In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 202 may include any such substrate, possibly with some layers and/or devices, e.g., the layer of metal 204, already formed thereon, providing a suitable surface for forming the metal contacts as described herein.

The metal 204 may include one or more of any metal or other suitable electrically conductive materials (conductors). While the metal 204 is referred to generally as a metal, it should be understood that various mixtures of metals and non-metals, or other types of conducting materials, may be used instead of a metal. Such conductive materials may include any suitable electrically conductive material, alloy, or a stack of multiple electrically conductive materials. In some embodiments, the metal 204 may include one or more metals or metal alloys, with metals such as copper, ruthenium, palladium, platinum, cobalt, nickel, hafnium, zirconium, titanium, tantalum, and aluminum. In some embodiments, the metal 204 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals.

The process 100 illustrated in FIG. 1 includes two sub-processes 130 and 132. Collectively, steps 102-110 represent a first sub-process 130 for generating a first portion of a metal pattern, and the steps 112-128 represent a second sub-process 132 for generating a second portion of a metal pattern. The two portions of the metal pattern may span some or all of a same area of a metal layer. For example, the first portion of a metal pattern may be a metal pattern having a first minimum pitch. The second portion of the metal pattern may be formed over the first portion to reduce (e.g., half) the pitch of the final metal pattern.

Various patterning technologies may be used to generate the first metal pattern. In the example shown in FIG. 1 and FIGS. 2A-2E, a lithographic procedure is used to form the first metal pattern. In another embodiment, a DSA procedure is used to form the first metal pattern. This embodiment is described with respect to FIGS. 3 and 4. In the examples described with respect to FIGS. 1-4, a DSA procedure is used to form the second metal pattern.

Turning to FIG. 1, the process 100 may begin with depositing 102 a mask material over a metal. For example, FIG. 2A illustrates a mask 206 deposited over the metal 204. The mask 206 may include any dielectric hard mask material or another mask material known in the art.

The process 100 proceeds with patterning 104 the mask. FIG. 2B illustrates an example patterned mask 230 formed from the mask 206. Various portions of the mask 206 have been removed, e.g., by exposing these portions of the mask 206 to an ultraviolet light and removing the exposed portions, resulting in the patterned mask 230 illustrated in FIG. 2B.

The example patterned mask 230 shown in FIG. 2B can have various shapes, pitches, and line widths. For example, a first pitch 232a between two adjacent mask portions 234a and 234b is larger than a second pitch 232b between two other adjacent mask portions 234b and 234c. An area of the mask 206 that has been removed between the mask portions 234a and 234b is wider (in the x-direction) than an area of the mask 206 that has been removed between the mask portions 234b and 234c.

The process 100 proceeds with etching 106 a metal exposed by the patterned mask. FIG. 2C illustrates an example of a patterned metal layer 240 formed by etching portions of the layer of metal 204 exposed by the patterned mask 230. The exposed portions of the metal 204 may be etched using any metal etching process known in the art. The patterned metal layer 240 replicates the pattern of the patterned mask 230. In this example, the patterned portions of the metal layer 240 have been removed to expose the support structure 202 under the metal 204. In some embodiments, one or more additional circuit layers, e.g., memory layers, device layers, metal layers, etc., may be formed between the patterned metal layer 240 and the support structure 202.

The process 100 proceeds with removing 108 the remaining patterned mask. FIG. 2D illustrates an example of the patterned metal layer 240 with the patterned mask 230 removed. The patterned mask may be removed using an appropriate etching process and chemistry for the mask material, e.g., wet etching or dry etching.

The process 100 proceeds with depositing 110 an insulator over the patterned metal, and in particular, in the regions of the patterned metal that were etched in step 106. FIG. 2E illustrates an example of the patterned metal layer 240 with an insulator 208 deposited between the metal regions. The insulator 208 may include any insulating medium, such as an interlayer dielectric (ILD). The insulator 208 may include any suitable ILD materials such as silicon oxide, carbon-doped silicon oxide, silicon carbide, silicon nitride, aluminum oxide, and/or silicon oxynitride.

As with the example patterned mask 230 described above, the example patterned metal layer 240 shown in FIG. 2E can have various shapes, pitches, and line widths. For example, a first pitch 242a between two adjacent metal portions 244a and 244b is larger than a second pitch 242b between two other adjacent metal portions 244b and 244c. An area of the insulator 208 between the metal portions 244a and 244b is wider (in the x-direction) than an area of the insulator 208 between the mask portions 244b and 244c.

In the areas with the smallest pitch, e.g., the pitch 242b, the width of the insulator 208 between adjacent metal portions is narrower than the width of the metal portions. The patterned metal layer 240 may be a first metal pattern, and a second metal pattern may be created overtop of the first metal pattern to produce a more tightly pitched pattern, e.g., as illustrated in the second sub-process 132 and shown in FIGS. 2F-2L, described below. For example, the patterned metal layer 240 may have minimum pitch that is three times the width of the insulator between adjacent metal portions set at the minimum pitch. This arrangement enables the second metal pattern to pitch-half the first metal pattern. In other examples, different ratios of insulator to metal may be used in regions of minimum pitch, e.g., based on the relative widths of insulator to metal in the final metal pattern.

After the patterned metal layer 240 having the first metal pattern has been produced according to the first sub-process 130, the process 100 proceeds with a second metal patterning sub-process 132. The sub-process 132 begins with depositing 112 a guiding pattern over the patterned metal layer 240. FIG. 2F illustrates an example of a guiding pattern 250 deposited over the patterned metal layer 240. As shown in FIG. 2F, the guiding pattern 250 includes an anchoring material 210. The anchoring material 210 covers a portion of the patterned metal layer 240, and in particular, covers regions of the insulator 208 in the patterned metal layer 240, and a portion of the metal 204 adjacent to the insulator 208. In some embodiments, the anchoring material 210 is a first anchoring material, and the guiding pattern 250 further includes a second anchoring material deposited in regions between the anchoring material 210, i.e., covering the portions of metal 204 that are not covered by the anchoring material 210. In other embodiments, the guiding pattern 250 includes a neutral material deposited in regions between the first anchoring material.

The guiding pattern 250 is used to guide self-assembly of a diblock copolymer deposited over the guiding pattern 250. As discussed further below, the diblock copolymer includes two different types of monomers with different chemical properties. The guiding pattern 250 chemically modifies the surface of the patterned metal layer 240 to impose different affinity to different polymer blocks of the diblock copolymer. This enforces the orientation of a diblock copolymer formed over the guiding pattern 250, as illustrated in FIG. 2H. The anchoring material 210 may have a greater interaction tendency (e.g., repulsive or attractive) with one polymer block than with another, e.g., the anchoring material 210 attracts a first polymer block (e.g., polymer A) or repels a second polymer block (e.g., polymer B). If a second anchoring material is used, the second anchoring material may attract the polymer block (e.g., polymer B) or repels the first polymer block (e.g., polymer A). Thus, the anchoring material 210 (or two anchoring materials) tend to influence the self-assembly of the diblock copolymer.

In some embodiments, the guiding pattern 250 may be deposited by applying a coating of the anchoring material 210 having a particular chemical property (e.g., hydrophilic or hydrophobic), or coatings of two different anchoring materials having a different chemical properties (e.g., hydrophilic and hydrophobic properties). In some embodiments, the guiding pattern 250 may be applied by spin coating, spray coating, dipping coating, immersion coating, or otherwise depositing or applying a relatively thin coating of a material that has a chemical property (e.g., a hydrophilicity or hydrophobicity) that corresponds to a chemical property of a particular polymer block. In some embodiments, the chemical properties of the patterned metal layer 240 may influence the placement of the anchoring material 210 over the patterned metal layer 240. For example, the anchoring material 210 may tend to adhere to the insulator 208 (e.g., the insulating portions in the patterned metal layer 240). If a second anchoring material is used, the second anchoring material may tend to adhere to the metal 204, and may be repelled from the insulator 208. Additionally or alternatively, other types of surface treatments (e.g., oxidizing or de-oxidizing) may be used to modify the surface of the patterned metal layer 240 to generate the guiding pattern 240.

In this example, the anchoring material 210 is illustrated as being formed over the insulator 208 and a portion of the metal 204. The anchoring material 210 is deposited in a pattern that is based on the desired second metal pattern for adding additional patterning to the patterned metal layer 240. In other embodiments, the anchoring material 210 may be formed over the insulator 208 and not over the metal 204.

After the guiding pattern 250 is deposited, the process 100 proceeds with depositing 114 a solution of a diblock copolymer over the guiding pattern 250. FIG. 2G illustrates an example result of depositing a diblock copolymer 212 over the guiding pattern 250.

The diblock copolymer 212 is a polymeric molecule formed of a chain of covalently bonded monomers. The diblock copolymer 212 may be deposited in a solution comprising the diblock copolymer combined with a liquid solvent, e.g., a glycol ether such as propylene glycol monomethyl ether acetate (PGMEA). The diblock copolymer 212 is formed from two different types of monomers. The different monomers are primarily included within different blocks or contiguous sequences of monomers. For example, a molecule of the diblock copolymer 212 includes a block of first polymer, referred to as, polymer A, and a block of a second polymer, referred to as polymer B. The block of polymer A and the block of polymer B are covalently bonded together. An individual block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The monomers A and B may represent any of the different types of monomers used in block copolymers known in the arts. Examples of the polymer A and polymer B include polyethylene, polystyrene, polyvinylchloride, polytetrafluorethylene, polydimethylsiloxane, some polyesters, some polyurethanes, acrylics, epoxies, P (t-Buytl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, poly(m-ethyl methacrylate) (PMMA), and so on. In other embodiments, the polymer A or polymer B may be other polymers. In some embodiments, an individual block may include different types of monomers. For example, the individual block may itself be a copolymer of two or more types of monomers. The blocks of polymer A and polymer B may be of similar lengths or of different lengths.

As noted above, the block of polymer A and the block of polymer B have different chemical properties. As one example, one of the blocks may be relatively more hydrophobic (e.g., water disliking) and the other may be relatively more hydrophilic (water liking). As another example, one of the blocks may be relatively more similar to oil and the other block may be relatively more similar to water. Such differences in chemical properties between the different blocks of polymers, whether a hydrophilic-hydrophobic difference or otherwise, may cause the diblock copolymer 212 to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to separate from each other due to chemical dislike for the other.

Returning to FIG. 1, in some embodiments, an annealing process 116 may be performed after the diblock copolymer 212 is deposited in order to initiate, accelerate, or otherwise promote the self-assembly. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can promote diffusion and self-assembly kinetics of larger polymers, such as diblock copolymers. In other embodiments, the annealing treatment may include a treatment that is operable to increase a temperature of the diblock copolymer. Such a treatment may include heating the IC device (e.g., in an oven or under a thermal lamp), applying infrared radiation to the diblock copolymer, or otherwise applying heat to or increasing the temperature of the deposited layer of the diblock copolymer 212. The heating may help to provide energy to the molecules of the diblock copolymer 212 to make them more mobile and/or flexible, which can increase the rate of the microphase separation. The annealing is performed at a temperature that is high enough to increase the rate of microphase separation but low enough to avoid damaging the diblock copolymer or other components of the IC device. In some embodiments, the annealing temperature is in a range from 50° C. to 300° C.

FIG. 2H illustrates an example result of the self-assembly of the diblock copolymer 212, e.g., after annealing the diblock copolymer 212. In general, because the blocks of polymer A and polymer B are covalently bonded to one another in each diblock copolymer molecule, the blocks of polymer A and polymer B cannot be completely separated on a macroscopic scale. Rather, polymer blocks of a given type may tend to segregate or conglomerate with polymer blocks of the same type of other molecules. Self-assembly of the diblock copolymer 212 into regions of polymer A and polymer B, whether based on hydrophobic-hydrophilic differences or otherwise, is used to form extremely small structures (e.g., precisely spaced nanoscale structures), e.g., the pattern of the self-assembled layer 260 in FIG. 2H.

The self-assembled layer 260 includes regions of polymer A 214 and regions of polymer B 216. The regions of polymer A 214 are formed over the anchoring material 210. The regions of polymer B 216 are formed in the other areas of the guiding pattern 250, i.e., over regions not covered by the anchoring material 210. In this example, the regions of polymer B 216 are formed directly over the metal 204 in the patterned metal layer 240. If a second anchoring material or neutral material are included in the guiding pattern 250, the regions of polymer B 216 would be formed over the second anchoring material or neutral material.

Returning to FIG. 1, the process 100 proceeds with etching 118 polymer B 216. Etching polymer B 216 exposes areas of the patterned metal layer 240 not covered by the anchoring material 210 and polymer A 214. FIG. 2I illustrates an example result of etching the polymer B regions. The etching process is a selective etching process that removes all or most of polymer B 216, but does not remove polymer A 214, or only removes a minimal amount of polymer A 214. Thus, the polymer A portions that cover the anchoring material 210 remain after the etching process. The etching process forms etched regions 270, also referred to as openings 270, e.g., the openings 270a and 270b labelled in FIG. 2I. The openings 270 match the pattern of polymer B 216. The openings 270 have a width 272a and 272b. The width of the openings may be based on the relative lengths of the polymers in the diblock copolymer 212, the pattern of the anchoring material 210, and/or other factors. The etching may be performed using an isotropic chemically selective etch material. If a second anchoring material is used, the etching process may remove the second anchoring material. In other embodiments, a second etching step is used to remove the second anchoring material exposed by a first etching step that removes polymer B 216.

The process 100 may optionally proceed with depositing 120 a spacer material over the regions of polymer A. FIG. 2J illustrates an example result of depositing a spacer material 218 over the regions of polymer A 214. The spacer material 218 may be conformally deposited, e.g., using CVD or ALD, to cover the tops and the sides of the regions of polymer A 214. The spacer material 218 may be a material that adheres to polymer A 214 but does not adhere to the exposed metal 204.

The spacer material 218 adds to the width of the regions of polymer A 214, to reduce the widths of the openings 270. For example, FIG. 2J illustrates the widths 272a and 272b of the openings 270a and 270b between pairs of adjacent regions of polymer A 214, also illustrated in FIG. 2I. FIG. 2J also illustrates widths 274a and 274b of the openings 270a and 270b between adjacent regions of polymer 214 with the spacer material 218 added to the regions of polymer A 214. The widths 274 of the openings 270 once the spacer material 218 is added are smaller than the widths 272 between adjacent regions of polymer A 214 without the spacer material 218. Depositing the spacer material 218 over the regions of polymer A 214 can tune the widths of insulator lines and, thus, the widths of the metal lines formed in the second metal pattern, as illustrated in FIGS. 2L-2N.

The process 100 may optionally proceed with depositing 122 one or more plugs between openings between regions of polymer A, or regions of polymer A coated with spacer material if a spacer material is used. FIG. 2K illustrates an example result of depositing a plug material, forming a plug 220 in the opening 270a. The plug 220 may be formed of any material that is not etched when the metal 204 is etched, e.g., an insulating material as described above. The layer formed by polymer A 214, along with spacer material 218 (if used) and any plugs 220 (if used), form a mask 280 for patterning the metal 204 in the patterned metal layer 240.

The process 100 proceeds with etching 124 metal regions that are exposed by polymer A, the spacer material, and the plugs. FIG. 2L illustrates an example showing additional patterning in the patterned metal layer 240 formed by etching portions of the metal 204 exposed by the mask 280, i.e., portions of the metal 204 exposed by polymer A 214, the spacer material 218, and the plug 220. The exposed portions of the metal 204 may be etched using any metal etching process known in the art. The additional patterning in the patterned metal layer 240 replicates the pattern of the mask 280. As noted with respect to FIG. 2C, in this example, the additional patterned portions of the patterned metal layer 240 have been removed to expose the support structure 202 under the metal 204. In some embodiments, one or more additional circuit layers, e.g., memory layers, device layers, metal layers, etc., may be formed between the metal 204 and the support structure 202.

The process 100 proceeds with removing 126 the spacers, polymer A, and the plugs. FIG. 2M illustrates an example of the patterned metal layer 240 with the mask 280 comprising the spacer material 218, polymer A 214, and plugs 220 removed. The mask 280 may be removed using one or more appropriate etching processes and chemistries for the mask materials.

The process 100 proceeds with depositing 128 an insulator over the patterned metal, and in particular, in the regions of the patterned metal that were etched in step 124. In some embodiments, steps 126 and 128 are performed in the opposite order, i.e., the insulator is deposited prior to removing the mask 280.

FIG. 2N illustrates an example of the patterned metal layer 240 with additional insulator 208 deposited between the metal regions that were etched in step 124. In the example shown in FIG. 2N, the same insulator 208 (e.g., an ILD) that was deposited in FIG. 2E is deposited. In other embodiments, different insulators may be deposited in step 110 and step 128.

The example patterned metal layer 240 shown in FIG. 2N has been patterned twice, i.e., once by the sub-process 130, and again by the sub-process 132. The metal and insulator regions formed by this process can have various shapes, pitches, and line widths. In some embodiments, a metal pattern obtained using the process 100, or a portion of a metal pattern obtained using the process 100, is a metal grating. A metal grating has alternating regions of metal and insulator, e.g., stripes of metal and insulator, often with a consistent pitch across the grating.

Using the process 100 described above, adjacent metal regions with very small pitch may be obtained. For example, the metal regions 294a and 294b are separated by a minimum pitch 292a. The minimum pitch 292a after the second sub-process 132 may be half of the minimum pitch 242b (illustrated in FIG. 2E) formed after the first sub-process 130. In some embodiments, the minimum pitch 292a may be, e.g., 30 nanometers or less, e.g., 25 nanometers, 20 nanometers, 15 nanometers, 10 nanometers, or another value less than 30 nanometers.

Figure 3:
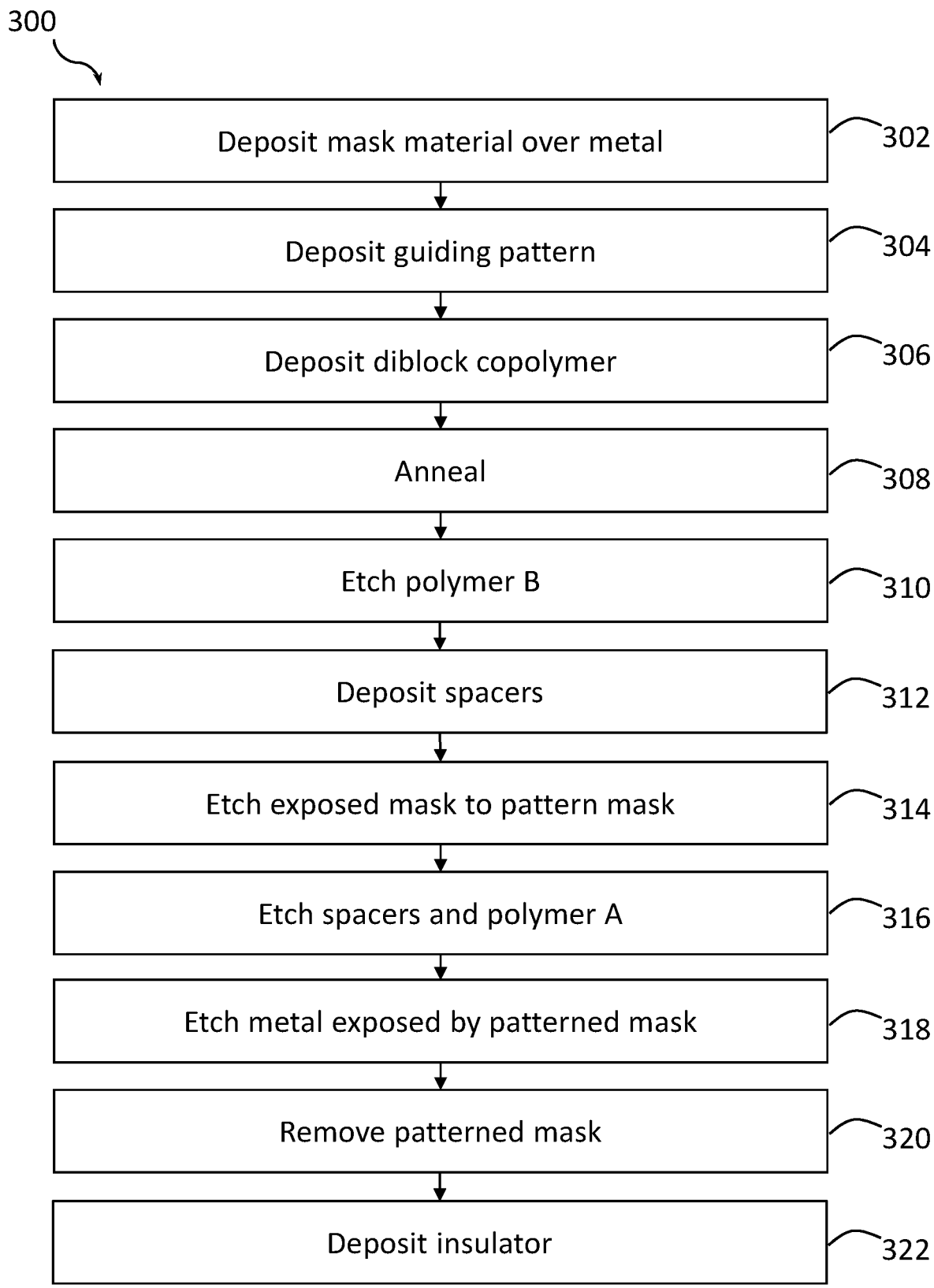
FIG. 3 is a flow chart illustrating a second process for generating a patterned metal layer using DSA, according to some embodiments of the present disclosure.

Example Process for a First Metal Patterning Sub-Process Using Directed Self-Assembly As noted with respect to FIG. 1, in some embodiments, a lithographic procedure such as the sub-process 130 described above is used to form a first metal pattern. Alternatively, a DSA procedure may be used to form the first metal pattern. FIG. 3 shows an alternate process 300 for forming a first metal pattern in a metal. FIG. 4 illustrates various stages in the process 300 of generating the first metal pattern according to the method of FIG. 3. More specifically, FIGS. 4A-4K illustrate cross-sectional side views for various stages in the process of generating a first metal pattern according to the process 300.

A number of elements referred to in the description of FIGS. 4A-4K with reference numerals are illustrated in these figures with different patterns, with a legend showing the correspondence between the reference numerals and patterns being provided at the bottom of each drawing page containing FIGS. 4A-4K. For example, the legend illustrates that FIGS. 4A-4K use different patterns to show a support structure 402, a metal 404, and a mask 406. For convenience, a number of the same patterns used in FIGS. 2A-2N are used in FIGS. 4A-4K with updated numbering. Furthermore, although a certain example metal pattern is illustrated in some of 4A-4K, this is simply for ease of illustration, and it should be understood that different IC structures having different patterns may be obtained according to the disclosure. Still further, various IC structure views shown in FIGS. 4A-4K are intended to show relative arrangements of various elements therein, and that various IC structures, or portions thereof, may include other elements or components that are not illustrated (e.g., transistor portions, various components that may be in electrical contact with the capacitor or contacts, etc.).

Figure 4A:
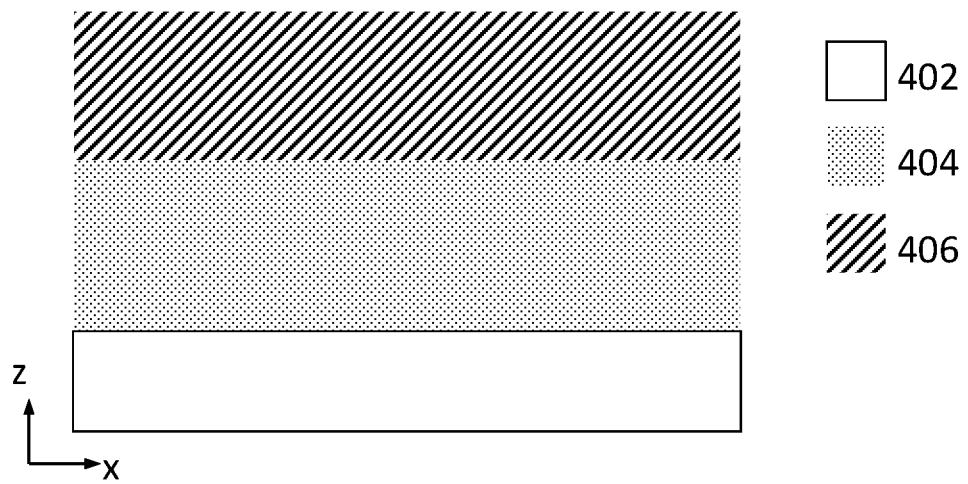
FIGS. 4A-4K illustrate various stages in the process of generating the patterned metal layer according to the process of FIG. 3, according to some embodiments of the present disclosure.

Turning to FIG. 3, the process 300 may begin with depositing 302 a mask material over a metal, e.g., depositing a mask over a metal layer formed over a support structure. FIG. 4A illustrates an example of a support structure 402, over which a layer of metal 404 and a mask 406 have been deposited. The support structure 402, metal 404, and mask 406 may be similar to the support structure 202, metal 204 and mask 206 described above with respect to FIG. 2A.

Figure 4B:
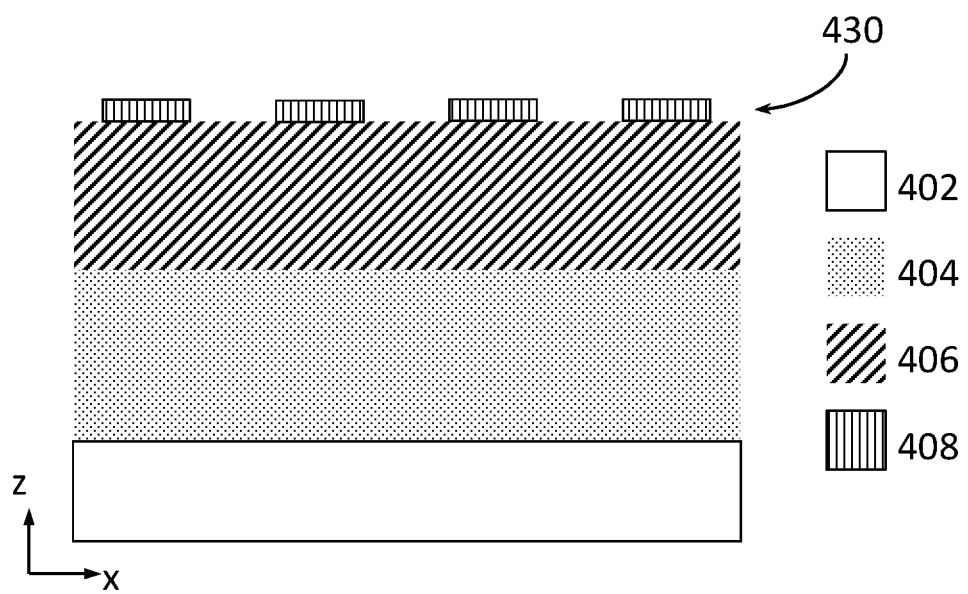

The process 300 proceeds with depositing 304 a guiding pattern over the mask. FIG. 4B illustrates an example of a guiding pattern 430 formed over the mask 406. The guiding pattern 430 includes an anchoring material 408, which may be similar to the anchoring material 210 described with respect to FIG. 2F. The anchoring material 408 covers a portion of the mask 406. The anchoring material 408 is deposited in a pattern based on the first metal pattern for the metal 404. While a cross-section of a simple striped pattern is illustrated for the guiding pattern 430, in other examples, a more complex pattern with regions of the anchoring material 408 and/or regions between the anchoring material 408 having various widths.

As described with respect to FIG. 2, in some embodiments, the anchoring material 408 is a first anchoring material, and the guiding pattern 430 may further include a second anchoring material deposited in regions between the anchoring material 408, i.e., covering the portions of metal 404 that are not covered by the anchoring material 408. In other embodiments, the guiding pattern 430 includes a neutral material deposited in regions between the first anchoring material.

Figure 4C:
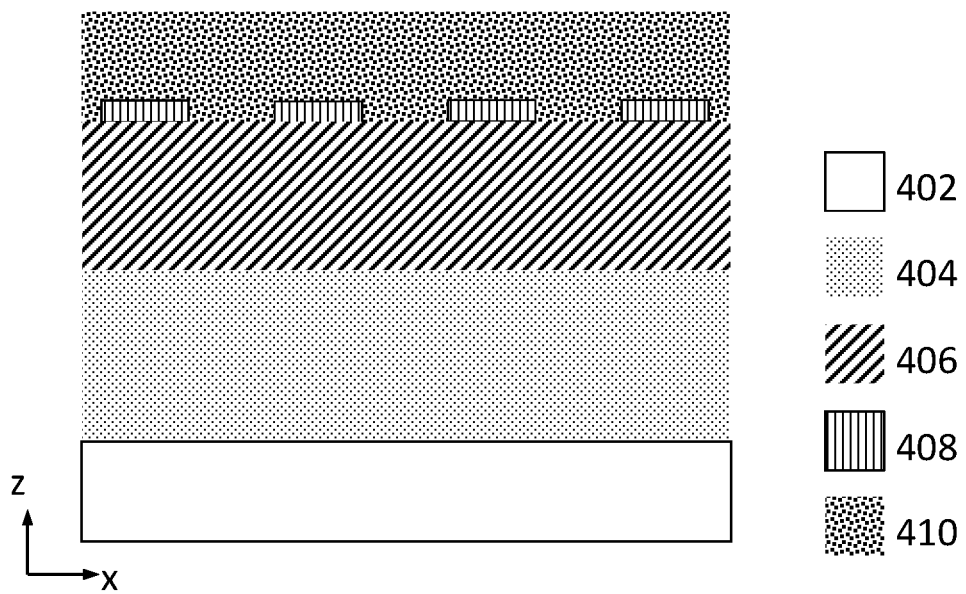

The process 300 proceeds with depositing 306 a solution of a diblock copolymer over the guiding pattern 430. FIG. 4C illustrates an example result of depositing a diblock copolymer 410 over the guiding pattern 430. The diblock copolymer 410 may be similar to the diblock copolymer 212 described with respect to FIG. 2G.

In some embodiments, an annealing process 308 may be performed after the diblock copolymer 410 is deposited in order to initiate, accelerate, or otherwise promote the self-assembly of the diblock copolymer 410. The annealing process 308 may be similar to the annealing process 116 described with respect to FIG. 1 and FIG. 2H.

Figure 4D:
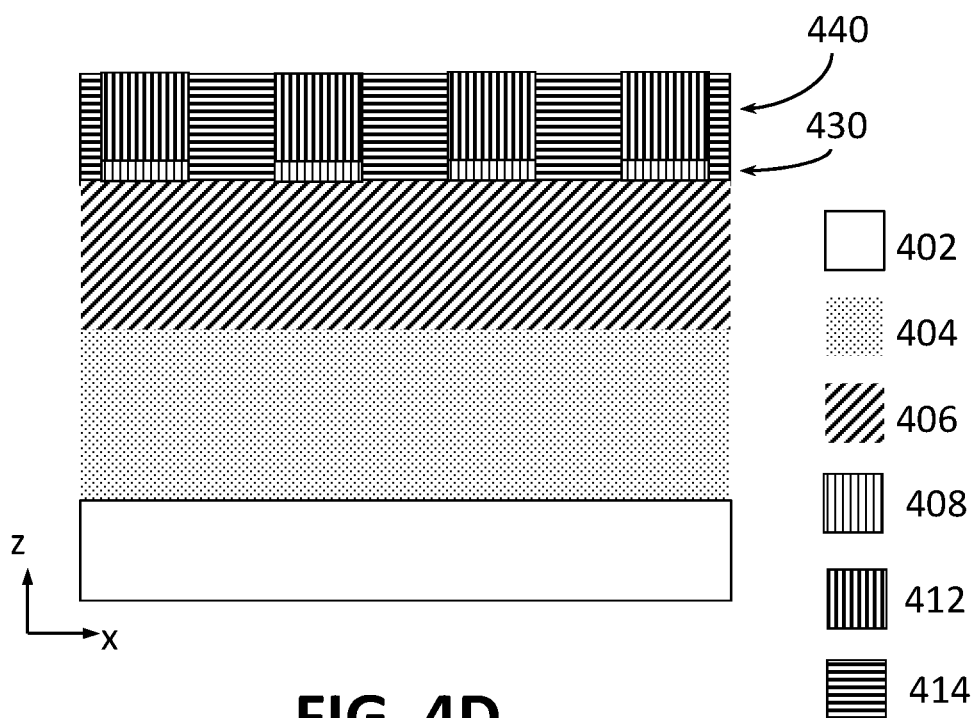

FIG. 4D illustrates an example result of the self-assembly of the diblock copolymer 410, e.g., after annealing the diblock copolymer 410. As described with respect to FIG. 2H, polymer blocks of a given type may tend to segregate or conglomerate with polymer blocks of the same type of other molecules. A self-assembled layer 440 includes regions of polymer A 412 and regions of polymer B 414, which may be similar to polymer A 214 and polymer B 216, respectively. The regions of polymer A 412 are formed over the anchoring material 408. The regions of polymer B 414 are formed in the other areas of the guiding pattern 430, i.e., over regions not covered by the anchoring material 408. In this example, the regions of polymer B 414 are formed directly over the metal 404. If a second anchoring material or neutral material are included in the guiding pattern 430, the regions of polymer B 414 would be formed over the second anchoring material or neutral material.

Figure 4E:
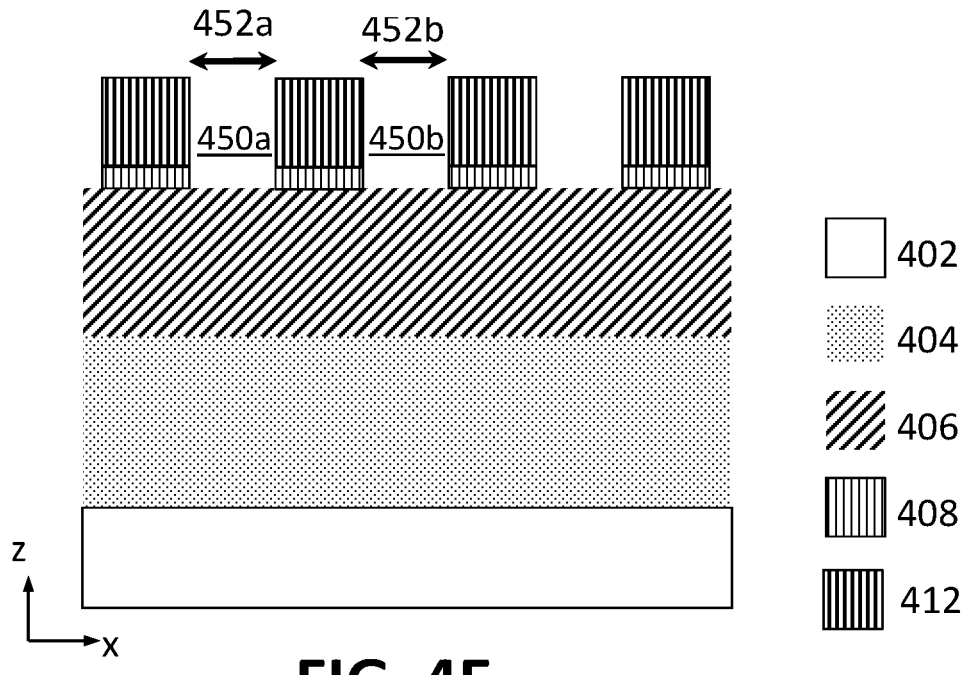

Returning to FIG. 3, the process 300 proceeds with etching 310 polymer B. Etching polymer B 414 exposes areas of the metal 404 not covered by the anchoring material 408 and polymer A 412. FIG. 4E illustrates an example result of etching the polymer B regions. The etching process 310 may be similar to the etching process 118 described with respect to FIG. 1 and FIG. 2I. The etching process forms etched regions 450, also referred to as openings 450, e.g., the openings 450a and 450b labelled in FIG. 4E. The openings 450 match the pattern of polymer B 414. The openings 450 have a width 452. The width of the openings may be based on the relative lengths of the polymers in the diblock copolymer 410, the pattern of the anchoring material 408, and/or other factors. The etching may be performed using an isotropic chemically selective etch material. If a second anchoring material is used, the etching process may remove the second anchoring material. In other embodiments, a second etching step is used to remove the second anchoring material exposed by a first etching step that removes polymer B 414.

Figure 4F:
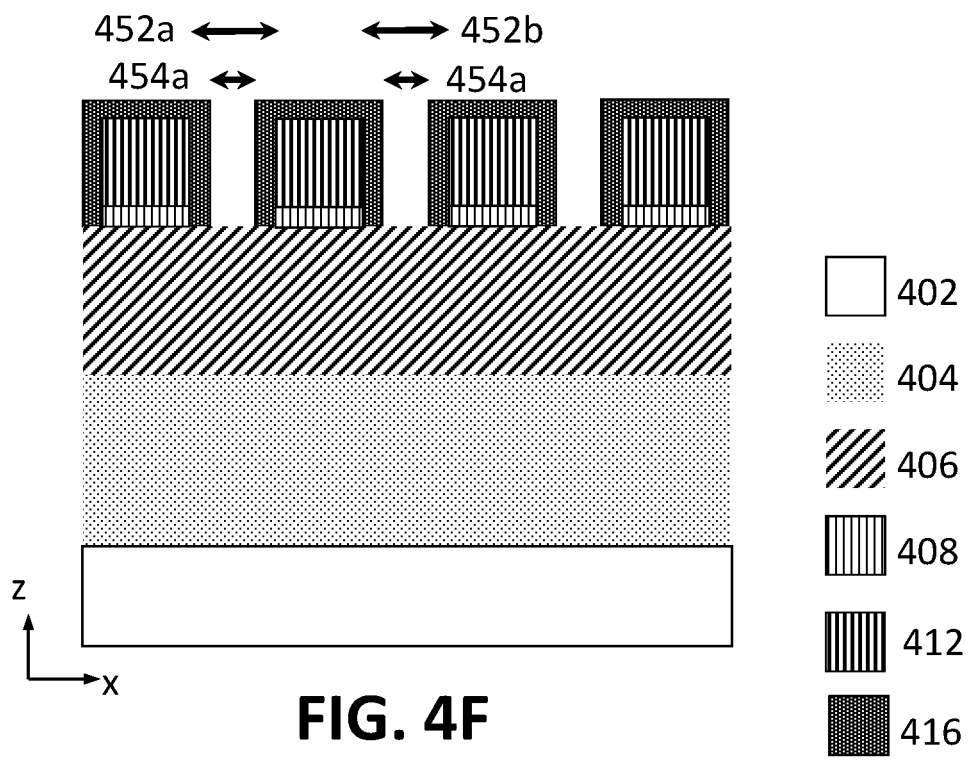

The process 300 may optionally proceed with depositing 312 a spacer material over the regions of polymer A. FIG. 4F illustrates an example result of depositing a spacer material 416 over the regions of polymer A 412. The spacer material 416 may be conformally deposited, e.g., using CVD or ALD, to cover the tops and the sides of the regions of polymer A 412. The spacer material 416 may be a material that adheres to polymer A 412 but does not adhere to the exposed metal 404.

Figure 4G:
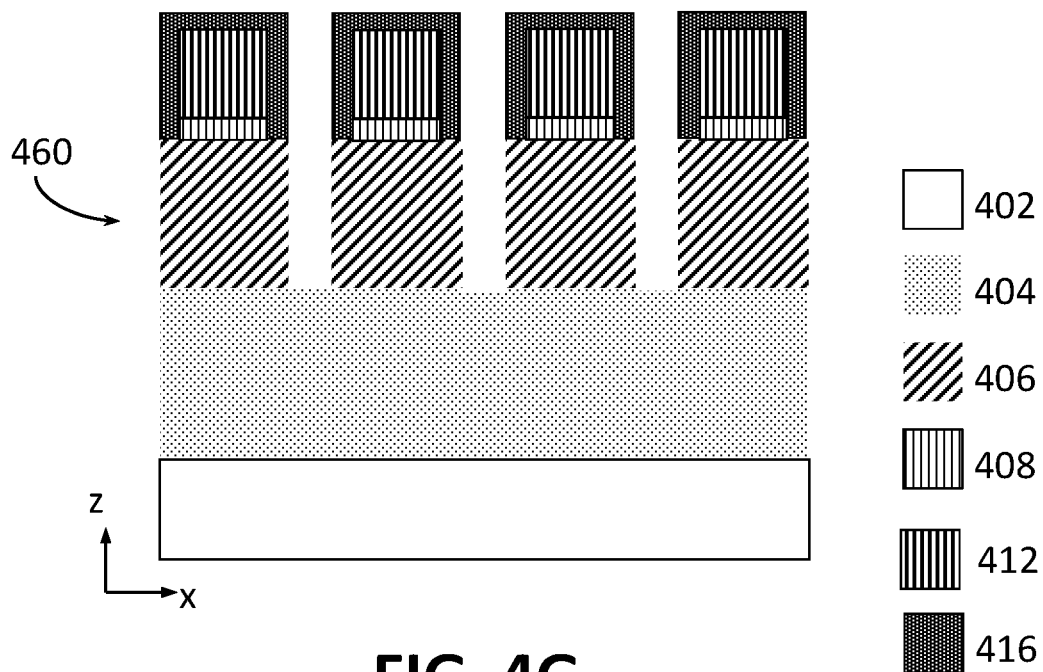
Figure 4H:
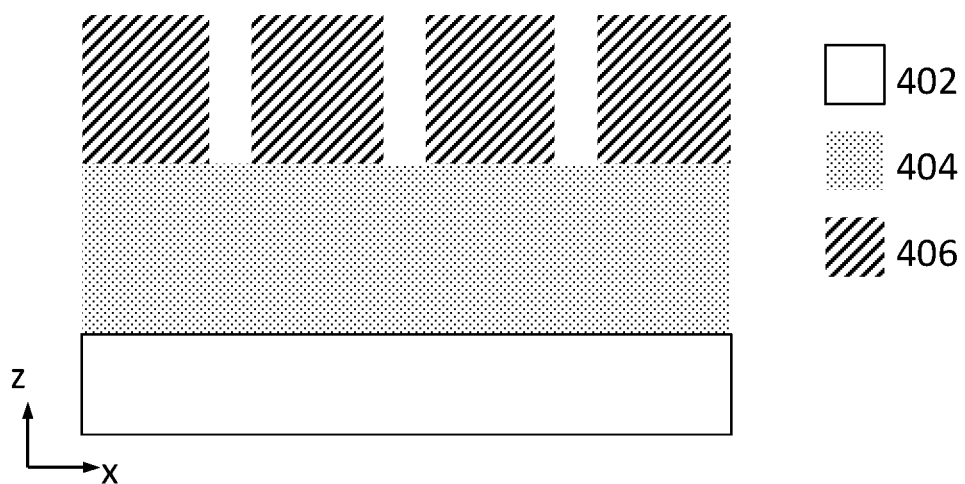
Figure 4I:
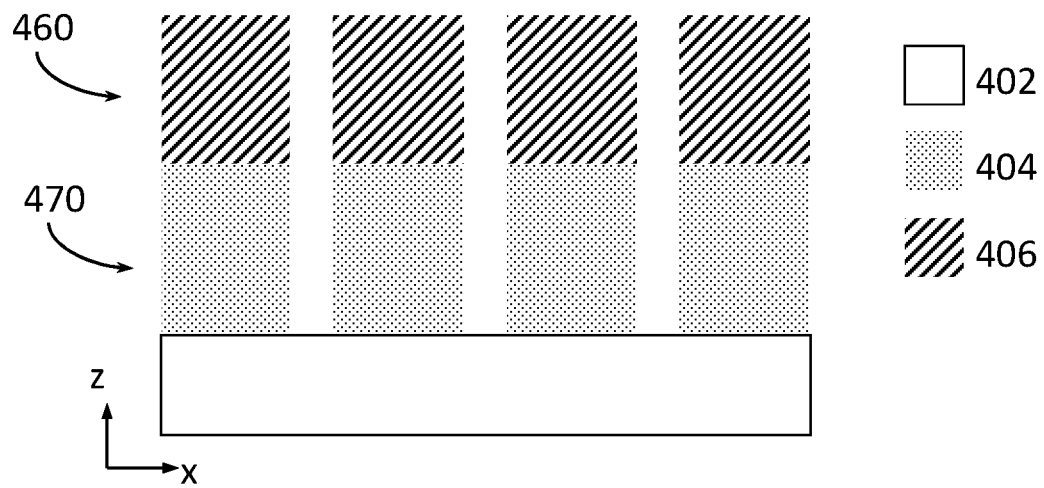
Figure 4J:
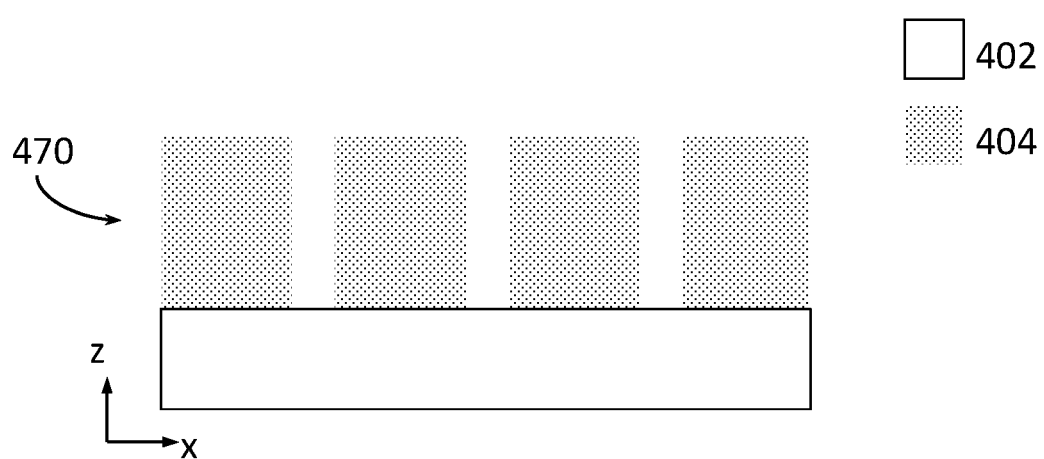
Figure 4K:
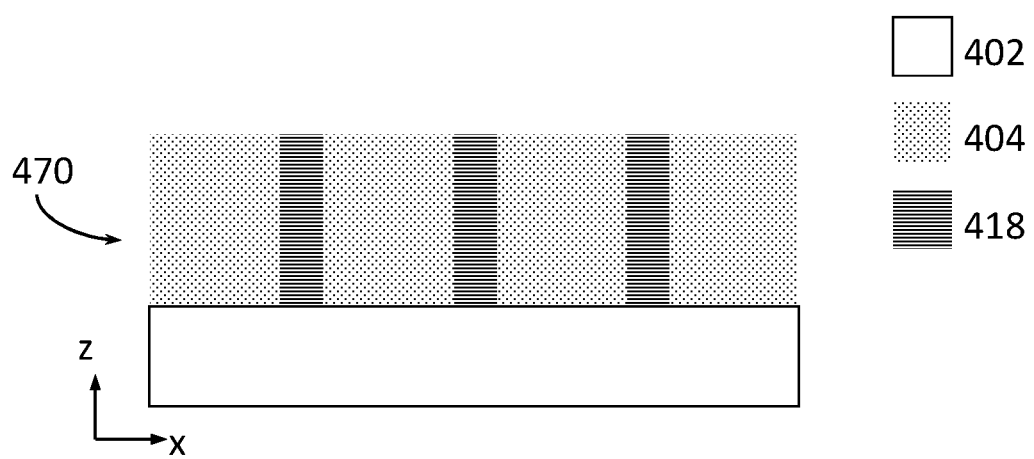

Like the spacer material 218 described with respect to FIG. 2J, the spacer material 416 adds to the width of the regions of polymer A 412, to reduce the widths of the openings 450. For example, FIG. 4F illustrates the widths 452*a* and 452*b* of the openings 450*a* and 450*b* between pairs of adjacent regions of polymer A 412, also illustrated in FIG. 4E. FIG. 4F also illustrates widths 454*a* and 454*b* of the openings 450*a* and 450*b* between adjacent regions of polymer A 412 with the spacer material 416 added to the regions of polymer A 412. The widths 454 of the openings 450 once the spacer material 416 is added are smaller than the widths 452 between adjacent regions of polymer A 412 without the spacer material 416. Depositing the spacer material 416 over the regions of polymer A 412 can tune the widths of insulator lines and, thus, the widths of the metal lines formed in the first metal pattern, as illustrated in FIGS. 4I-4K.

The process 300 proceeds with etching 314 the exposed mask to pattern the mask. FIG. 4G illustrates an example patterned mask 460 formed from the mask 406. Various portions of the mask 406 have been removed, e.g., by etching the portions of the mask 406 exposed by polymer A 412 and the spacer material 416. Alternatively, the portions of the mask 406 exposed by polymer A 412 and the spacer material 416 may be exposed to an ultraviolet light and removed, either before or after removing the spacer material 416 and polymer A 412. In still another example, the mask 406 may be omitted, and polymer A 412 and the spacer material 416 themselves form a patterned mask 460. As described with respect to the patterned mask 230, the patterned mask 460 can have various shapes, pitches, and line widths.

In the example shown in FIG. 3, the process 300 proceeds with etching 316 the spacers and polymer A. FIG. 4H illustrates an example of the patterned mask 460 with the spacer material 416 and polymer A 412 removed. In other embodiments, the spacer material 416 and polymer A 412 may be removed at a different point in the process 300, e.g., before the mask 460 is patterned (if the mask 406 is exposed to a UV light) or after portions of the metal 404 are etched (if the spacers 416 and polymer A 412 form the patterned mask 460).

The process 300 proceeds with etching 318 a metal exposed by the patterned mask. FIG. 4I illustrates an example of a patterned metal layer 470 formed by etching portions of the layer of metal 404 exposed by the patterned mask 460. The exposed portions of the metal 404 may be etched using any metal etching process known in the art. The patterned metal layer 470 replicates the pattern of the patterned mask 460. In this example, portions of the metal 404 have been removed to expose the support structure 402 under the metal 404. In some embodiments, one or more additional circuit layers, e.g., memory layers, device layers, metal layers, etc., may be formed between the patterned metal layer 470 and the support structure 402.

The process 300 proceeds with removing 320 the remaining patterned mask. FIG. 4J illustrates an example of the patterned metal layer 470 with the patterned mask 460 removed. The patterned mask 460 may be removed using an appropriate etching process and chemistry for the mask material, e.g., wet etching or dry etching.

The process 300 proceeds with depositing 322 an insulator over the patterned metal, and in particular, in the regions of the patterned metal that were etched in step 320. FIG. 4K illustrates an example of the patterned metal layer 470 with an insulator 418 deposited between the metal regions. The insulator 418 may include any insulating medium, such as an ILD. The insulator 418 may include any suitable ILD materials such as silicon oxide, carbon-doped silicon oxide, silicon carbide, silicon nitride, aluminum oxide, and/or silicon oxynitride.

Across the example cross-section shown in FIG. 4K, the metal regions have a consistent width and pitch, e.g., the patterned metal layer 470 may be a metal grating. However, as with the example patterned mask 230 described above, a metal layer patterned according to the process 300 may have metal and/or dielectric regions with various shapes, pitches, and line widths.

In the example shown in FIG. 4K, the width of the insulator 418 between adjacent metal portions is narrower than the width of the metal portions. The patterned metal layer 470 may be a first metal pattern, and a second metal pattern may be created overtop of the first metal pattern to produce a more tightly pitched pattern, e.g., as illustrated in the second sub-process 132 and shown in FIGS. 2F-2L, described above. For example, the patterned metal layer 470 may have minimum pitch that is three times the width of the insulator between adjacent metal portions set at the minimum pitch. This arrangement enables the second metal pattern to pitch-half the first metal pattern. In other examples, different ratios of insulator to metal may be used in regions of minimum pitch, e.g., based on the relative widths of insulator to metal in the final metal pattern.

Example Process for Generating Narrow Metal Lines Using DSA

Figure 5:
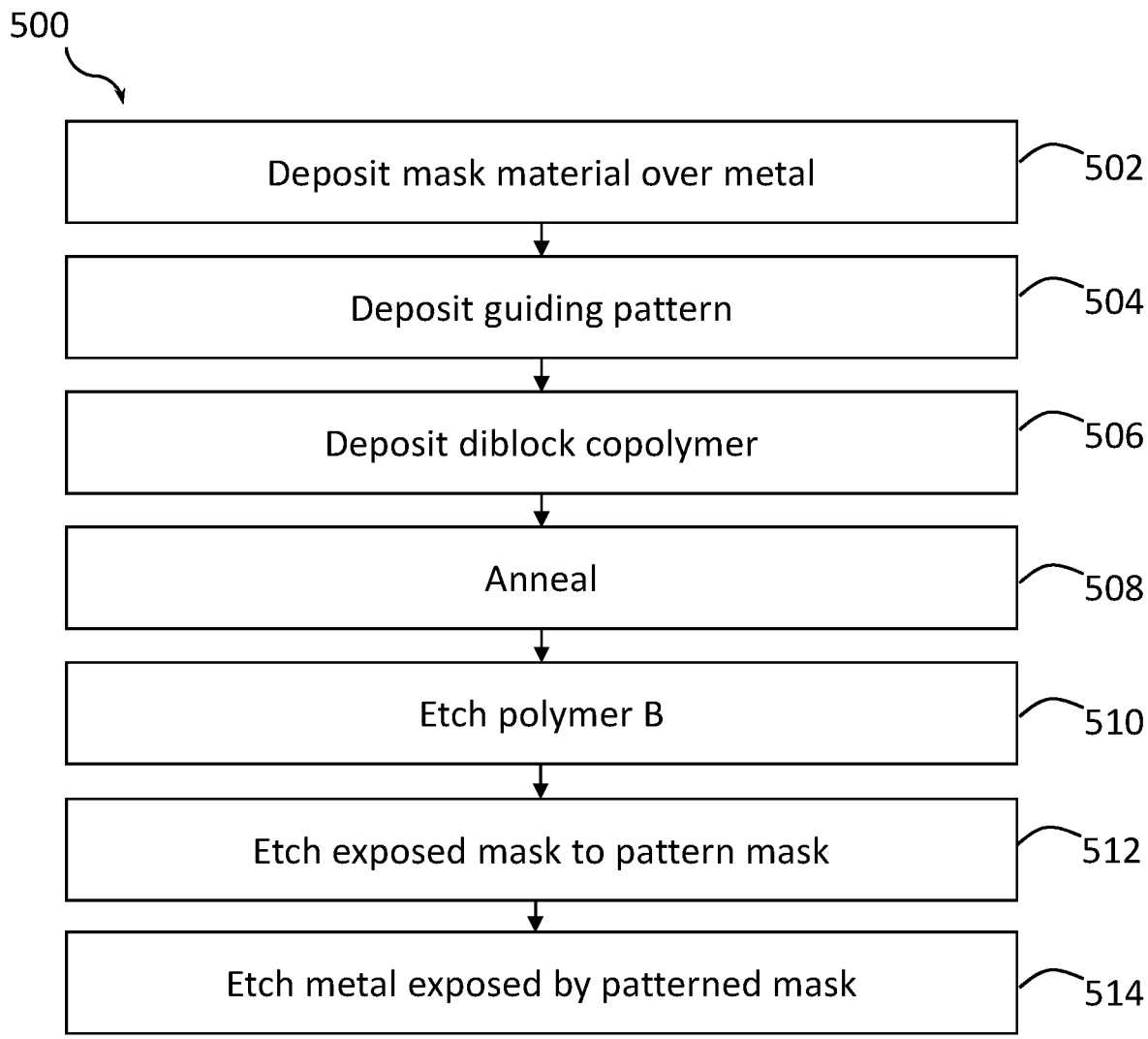
FIG. 5 is a flow chart illustrating a third process for generating a patterned metal layer using DSA, according to some embodiments of the present disclosure.

FIG. 5 is a flow chart illustrating a third process for generating a patterned metal layer using DSA, according to some embodiments of the present disclosure. In particular, FIG. 5 describes a process 500 for generating a patterned metal layer with narrow metal lines, e.g., a metal grating with metal lines having a width of less than half of the pitch (e.g., the metal lines have a width of around a quarter of their pitch). Additional metal lines may be deposited additively to generate a metal pattern (e.g., a metal grating) at twice the pitch of the metal grating formed by the process 500. The additive metal processing is described with respect to FIGS. 7 and 8.

FIG. 6 illustrates various stages in the process 500 of generating a metal pattern according to the method of FIG. 5. More specifically, FIGS. 6A-6G illustrate cross-sectional side views for various stages in the process of generating a metal pattern according to the process 500.

A number of elements referred to in the description of FIGS. 6A-6G with reference numerals are illustrated in these figures with different patterns, with a legend showing the correspondence between the reference numerals and patterns being provided at the bottom of each drawing page containing FIGS. 6A-6G. For example, the legend illustrates that FIGS. 6A-6G use different patterns to show a support structure 602, a metal 604, and a mask 606. For convenience, a number of the same patterns used in FIGS. 2A-2N and FIGS. 4A-4K are used in FIGS. 6A-6G with updated numbering. Furthermore, although a certain example metal pattern is illustrated in some of 6A-6G, this is simply for ease of illustration, and it should be understood that different IC structures having different patterns may be obtained according to the disclosure. Still further, various IC structure views shown in FIGS. 6A-6G are intended to show relative arrangements of various elements therein, and that various IC structures, or portions thereof, may include other elements or components that are not illustrated (e.g., transistor portions, various components that may be in electrical contact with the capacitor or contacts, etc.).

Turning to FIG. 5, the process 500 may begin with depositing 502 a mask material over a metal, e.g., depositing a mask over a metal layer formed over a support structure.

Figure 6A:
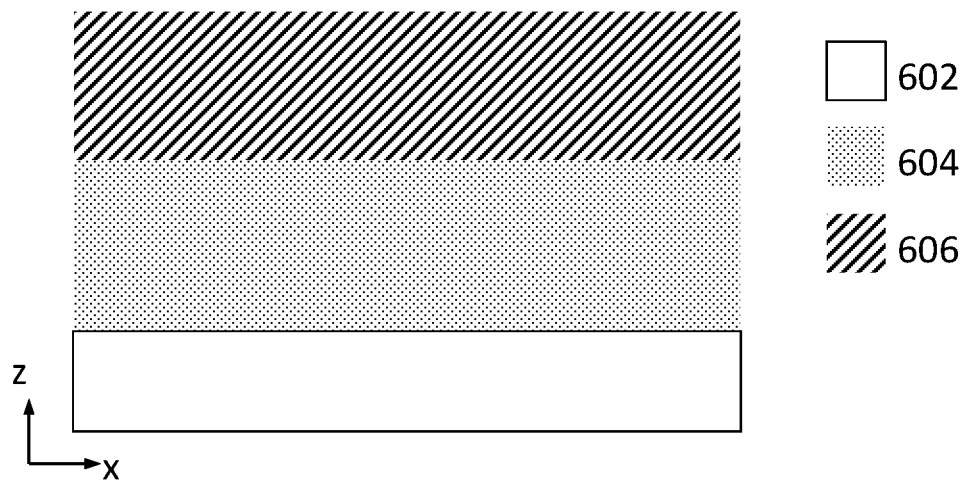
FIGS. 6A-6G illustrate various stages in the process of generating the patterned metal layer according to the process of FIG. 5, according to some embodiments of the present disclosure.

FIG. 6A illustrates an example of a support structure 602, over which a layer of metal 604 and a mask 606 have been deposited. The support structure 602, metal 604, and mask 606 may be similar to the support structure 202, metal 204 and mask 206 described above with respect to FIG. 2A.

Figure 6B:
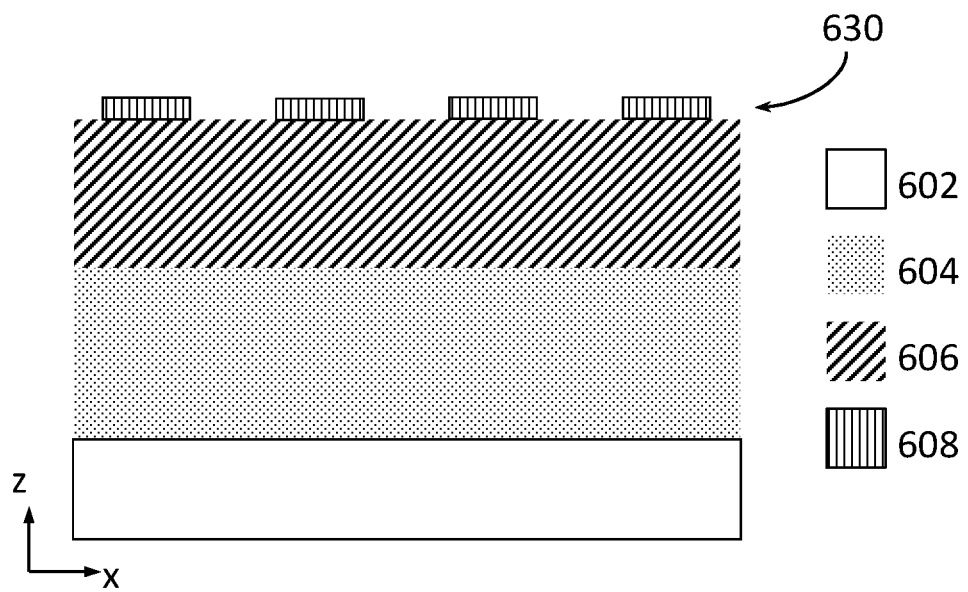

The process 500 proceeds with depositing 504 a guiding pattern over the mask. FIG. 6B illustrates an example of a guiding pattern 630 formed over the mask 606. The guiding pattern 630 includes an anchoring material 608, which may be similar to the anchoring material 210 described with respect to FIG. 2F. The anchoring material 608 covers a portion of the mask 606. The anchoring material 608 is deposited in a pattern based on an intended metal pattern for the metal 604. While a cross-section of a simple striped pattern is illustrated for the guiding pattern 630, in other examples, a more complex pattern with regions of the anchoring material 608 and/or regions between the anchoring material 608 having various widths.

As described with respect to FIG. 2, in some embodiments, the anchoring material 608 is a first anchoring material, and the guiding pattern 630 may further include a second anchoring material deposited in regions between the anchoring material 608, i.e., covering the portions of metal 604 that are not covered by the anchoring material 608. In other embodiments, the guiding pattern 630 includes a neutral material deposited in regions between the first anchoring material.

Figure 6C:
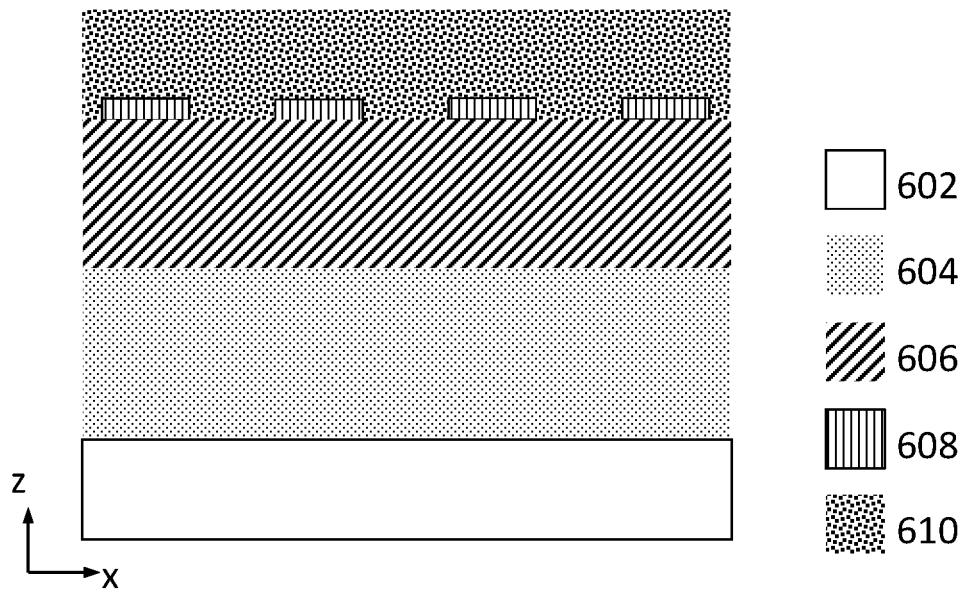

The process 500 proceeds with depositing 506 a solution of a diblock copolymer over the guiding pattern 630. FIG. 6C illustrates an example result of depositing a diblock copolymer 610 over the guiding pattern 630. The diblock copolymer 610 may be similar to the diblock copolymer 612 described with respect to FIG. 6G.

In some embodiments, an annealing process 508 may be performed after the diblock copolymer 610 is deposited in order to initiate, accelerate, or otherwise promote the self-assembly of the diblock copolymer 610. The annealing process 508 may be similar to the annealing process 116 described with respect to FIG. 1 and FIG. 2H.

Figure 6D:
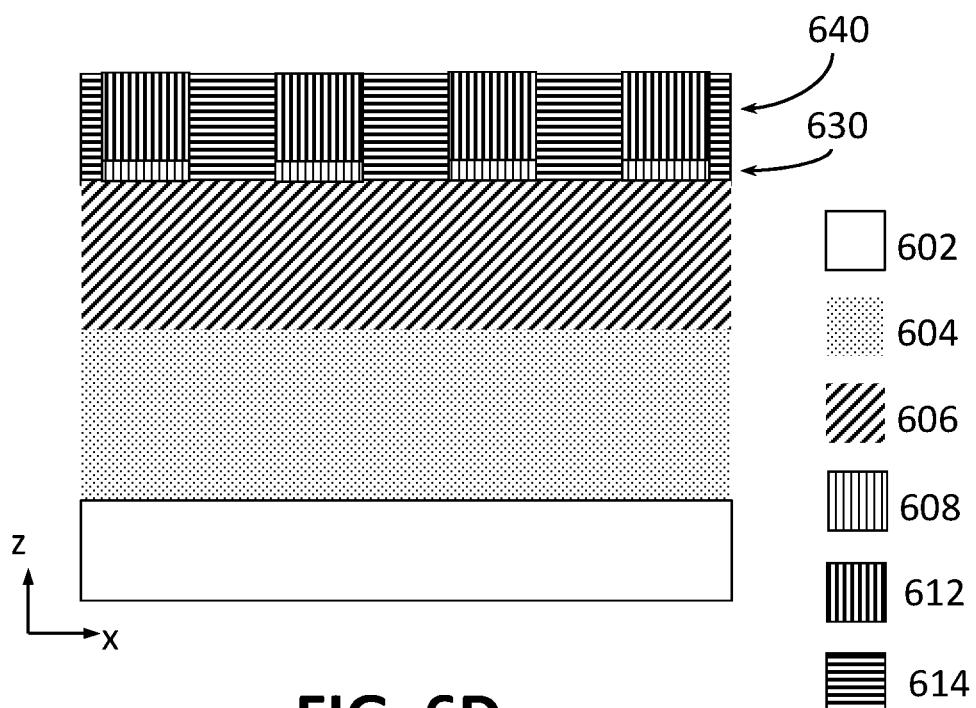

FIG. 6D illustrates an example result of the self-assembly of the diblock copolymer 610, e.g., after annealing the diblock copolymer 610. As described with respect to FIG. 2H, polymer blocks of a given type may tend to segregate or conglomerate with polymer blocks of the same type of other molecules. A self-assembled layer 640 includes regions of polymer A 612 and regions of polymer B 614, which may be similar to polymer A 614 and polymer B 616, respectively. The regions of polymer A 612 are formed over the anchoring material 608. The regions of polymer B 614 are formed in the other areas of the guiding pattern 630, i.e., over regions not covered by the anchoring material 608. In this example, the regions of polymer B 614 are formed directly over the metal 604. If a second anchoring material or neutral material are included in the guiding pattern 630, the regions of polymer B 614 would be formed over the second anchoring material or neutral material.

Figure 6E:
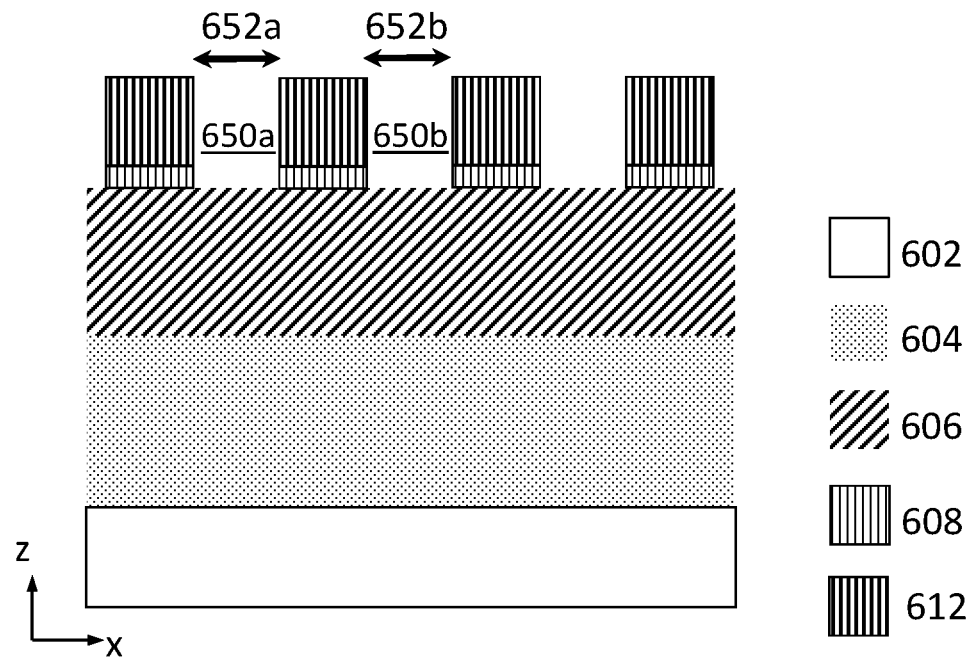

Returning to FIG. 5, the process 500 proceeds with etching 510 polymer B. Etching polymer B 614 exposes areas of the metal 604 not covered by the anchoring material 608 and polymer A 612. FIG. 6E illustrates an example result of etching the polymer B regions. The etching process 510 may be similar to the etching process 118 described with respect to FIG. 1 and FIG. 2I. The etching process forms etched regions 650, also referred to as openings 650, e.g., the openings 650a and 650b labelled in FIG. 6E. The openings 650 match the pattern of polymer B 614. The openings 650 have a width 652. The width of the openings may be based on the relative lengths of the polymers in the diblock copolymer 610, the pattern of the anchoring material 608, and/or other factors. The etching may be performed using an isotropic chemically selective etch material. If a second anchoring material is used, the etching process may remove the second anchoring material. In other embodiments, a second etching step is used to remove the second anchoring material exposed by a first etching step that removes polymer B 614.

Figure 6F:
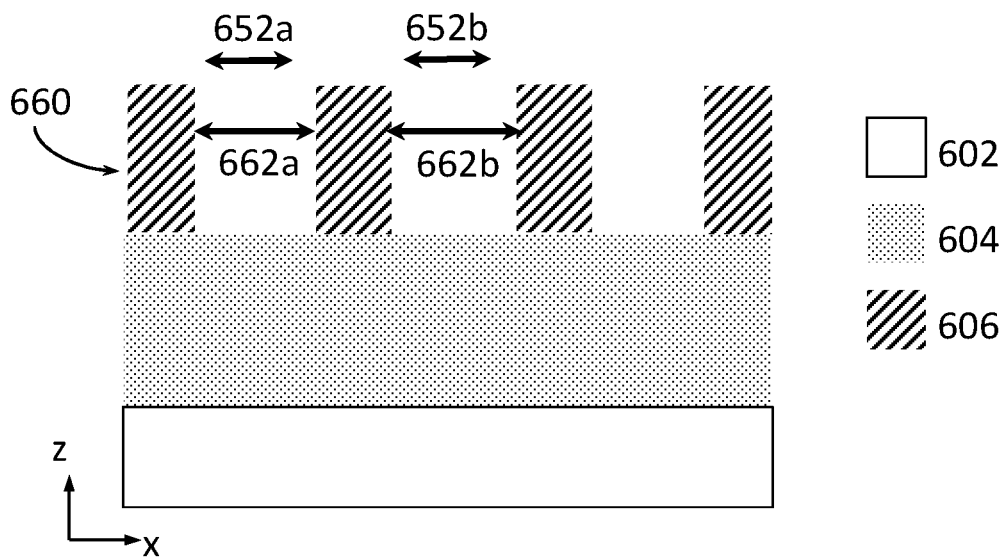

The process 500 proceeds with etching 512 the exposed mask to pattern the mask. FIG. 6F illustrates an example patterned mask 660 formed from the mask 406. Various portions of the mask 606 have been removed, e.g., by etching the portions of the mask 606 exposed by polymer A 612. Alternatively, the portions of the mask 606 exposed by polymer A 612 may be exposed to an ultraviolet light and removed, either before or after removing polymer A 612. As illustrated in FIG. 3F, polymer A 612 is also etched, either after the mask 606 is patterned or before the mask 606 is patterned (if the mask 606 had been exposed to UV light while the polymer A 612 was over the mask 606.

In this example, the patterned mask 660 has openings having widths 662, e.g., widths 662a and 662b. The widths 662a and 662b are larger than the widths 652a and 652b of the corresponding openings 650a and 650b between adjacent regions of polymer A 612. The etch chemistry for patterning the mask 606 may be selected to form wider openings in the patterned mask, as illustrated in FIG. 6F.

Figure 6G:
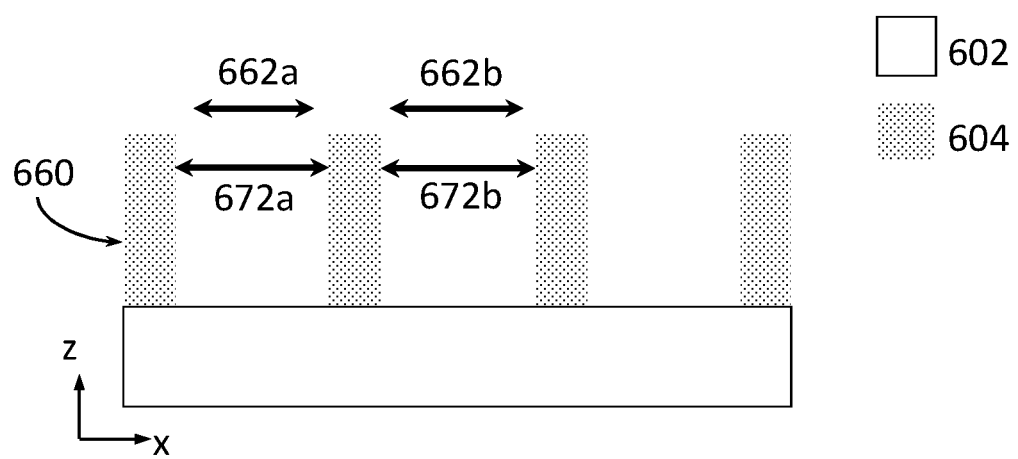

The process 500 proceeds with etching 514 a metal exposed by the patterned mask. FIG. 6G illustrates an example of a patterned metal layer 670 formed by etching portions of the layer of metal 604 exposed by the patterned mask 660. The exposed portions of the metal 604 may be etched using any metal etching process known in the art. The patterned metal layer 670 replicates the pattern of the patterned mask 660, but the openings between adjacent metal portions of the patterned metal layer 670 have larger widths 672 than the widths 662 of the corresponding openings in the patterned mask 660. For example, the widths 672a and 672b between adjacent metal lines in the patterned metal layer 670 are larger than the widths 662a and 662b of the corresponding openings in the patterned mask 660. The etch chemistry for etching the metal 604 may be selected to form wider openings in the patterned metal layer 670 than in the mask 660, as illustrated in FIG. 6G.

In this example, portions of the metal 604 been removed to expose the support structure 602 under the metal 604. In some embodiments, one or more additional circuit layers, e.g., memory layers, device layers, metal layers, etc., may be formed between the patterned metal layer 670 and the support structure 602.

FIG. 6G also illustrates that the remaining patterned mask 660 has been removed, leaving the patterned metal layer 670. The patterned mask 660 may be removed using an appropriate etching process and chemistry for the mask material, e.g., wet etching or dry etching. In some embodiments, an insulator, similar to the insulator 418 described with respect to FIG. 4K, may be deposited over the patterned metal, and in particular, in the regions of the patterned metal that were etched in step 514. The insulator may include any insulating medium, such as an ILD, including any of the ILD materials provided above.

Figure 7:
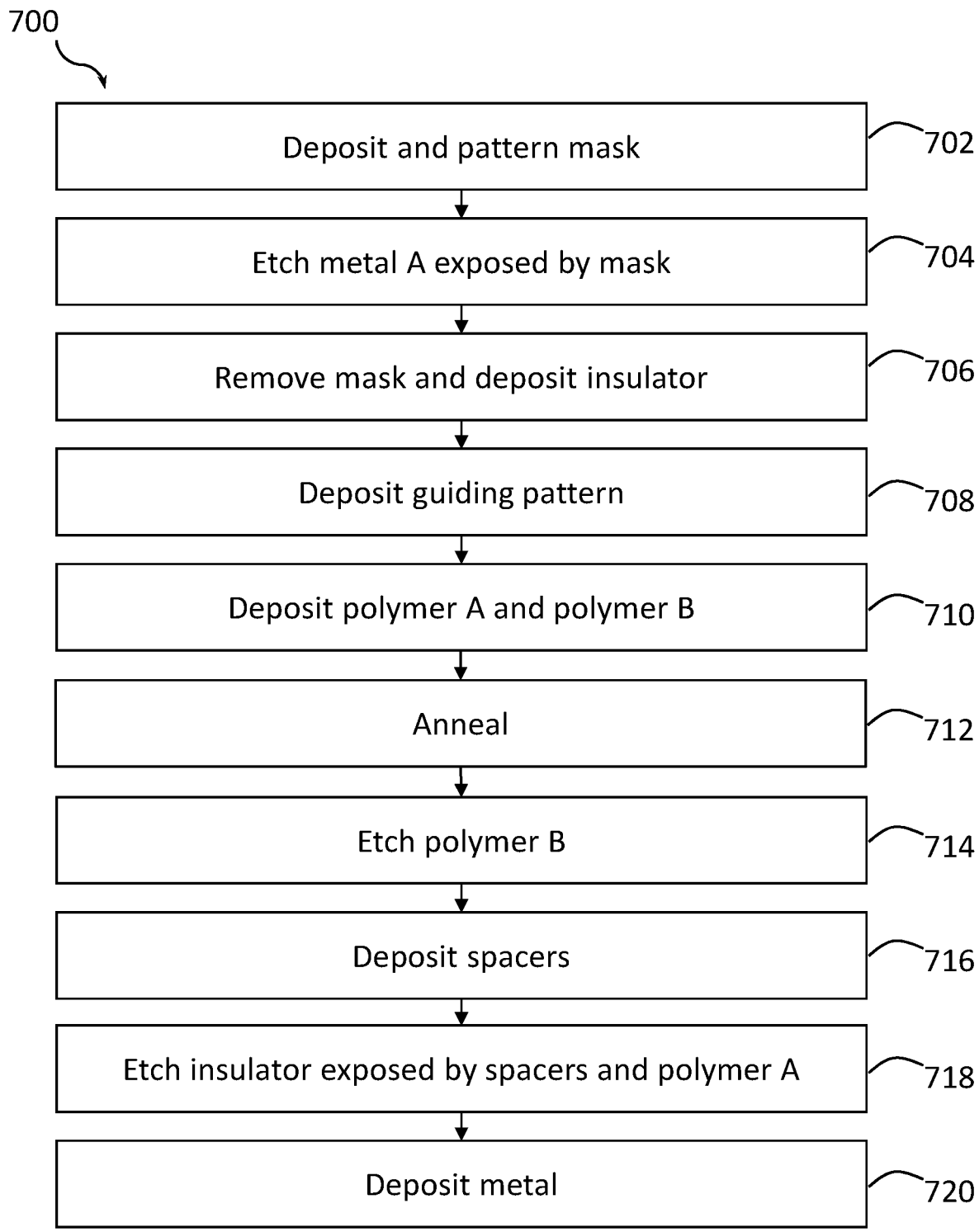
FIG. 7 is a flow chart illustrating a fourth process for generating a patterned metal layer using DSA, according to some embodiments of the present disclosure.

Example Process for Additive Metal Patterning Between Narrow Metal Lines Using DSA FIG. 7 is a flow chart illustrating a fourth process for generating a patterned metal layer using DSA, according to some embodiments of the present disclosure. In particular, FIG. 7 illustrates a process 700 for performing additive metal pattering using DSA. The additive metal patterning may be performed over an existing metal grating with narrow lines and relatively wide pitches, e.g., over the grating illustrated in FIG. 6G.

FIGS. 8A-8J illustrate various stages in the process 700 of generating the patterned metal layer, according to some embodiments of the present disclosure. More specifically, FIGS. 8A-8J illustrate cross-sectional side views for various stages in the process of generating a metal pattern according to the process 700.

A number of elements referred to in the description of FIGS. 8A-8J with reference numerals are illustrated in these figures with different patterns, with a legend showing the correspondence between the reference numerals and patterns being provided at the bottom of each drawing page containing FIGS. 8A-8J. For example, the legend illustrates that FIGS. 8A-8J use different patterns to show a support structure 802, a metal 804, and a mask 806. For convenience, a number of the same patterns used in FIGS. 2A-2N, FIGS. 4A-4K, and FIGS. 6A-6G are used in FIGS. 8A-8J with updated numbering. Furthermore, although a certain example metal pattern is illustrated in some of 8A-8J, this is simply for ease of illustration, and it should be understood that different IC structures having different patterns may be obtained according to the disclosure. Still further, various IC structure views shown in FIGS. 8A-8J are intended to show relative arrangements of various elements therein, and that various IC structures, or portions thereof, may include other elements or components that are not illustrated (e.g., transistor portions, various components that may be in electrical contact with the capacitor or contacts, etc.).

Figure 8A:
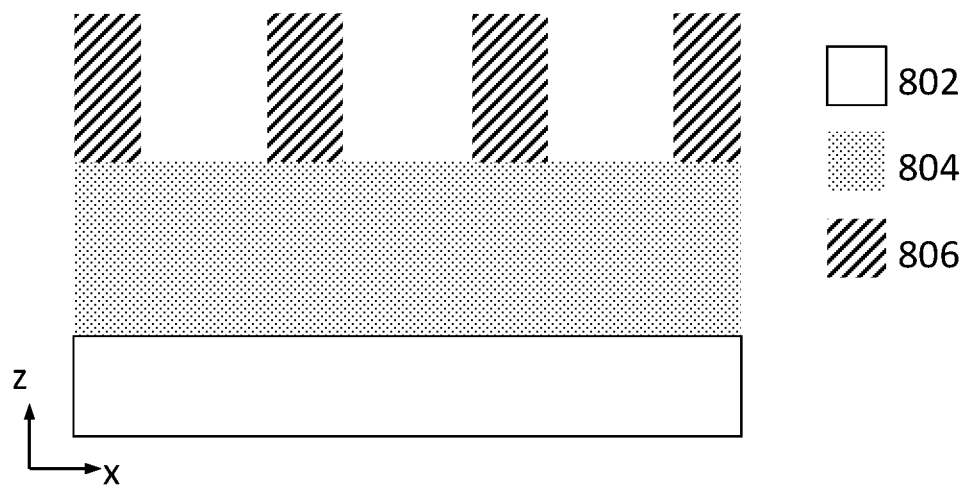
FIGS. 8A-8J illustrate various stages in the process of generating the patterned metal layer according to the process of FIG. 7, according to some embodiments of the present disclosure.

Turning to FIG. 7, the process 700 may begin with depositing and patterning 702 a mask over a metal, e.g., depositing and patterning a mask over a metal layer formed over a support structure. FIG. 8A illustrates an example of a support structure 802, over which a layer of metal 804 and a mask 806 have been deposited. The support structure 802, metal 804, and mask 806 may be similar to the support structure 202, metal 204 and mask 206 described above with respect to FIG. 2A.

In one embodiment, the mask 806 is patterned using the DSA process described with respect to FIG. 5 and illustrated in FIGS. 6A-6F. Alternatively, the mask 806 may be patterned using a lithographic process.

Figure 8B:
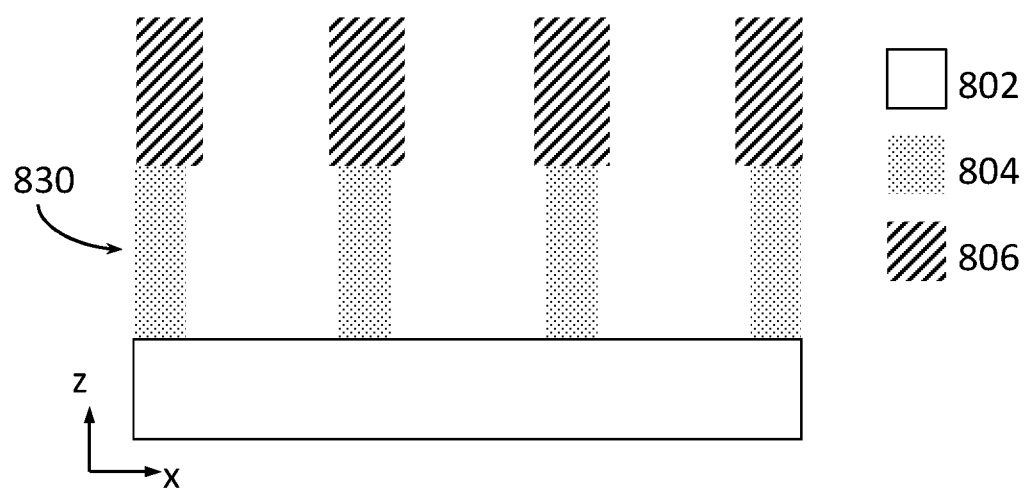

The process 700 proceeds with etching 704 a metal exposed by the patterned mask. FIG. 8B illustrates an example of a patterned metal layer 830 formed by etching portions of the layer of metal 804 exposed by the patterned mask. The etching step 706 is similar to the etching step 514 described above with respect to FIG. 5 and FIG. 6G. As described above, the patterned metal layer 830 replicates the pattern of the patterned mask, but the openings between adjacent metal portions of the patterned metal layer 830 have larger widths than the widths of the corresponding openings in the patterned mask. The etch chemistry for etching the metal 804 may be selected to form wider openings in the patterned metal layer 830 than in the mask.

Figure 8C:
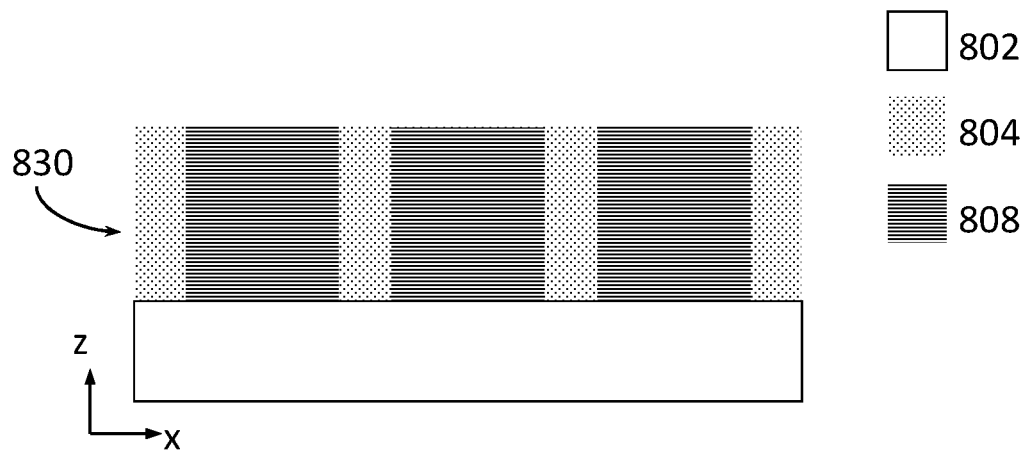

The process 700 proceeds with removing the mask and depositing 706 an insulator. FIG. 8C illustrates the patterned metal layer 830 with the mask 806 removed and an insulator 808 deposited between the metal regions of the patterned metal layer 830. The mask 806 may be removed using an appropriate etching process and chemistry for the mask material, e.g., wet etching or dry etching. The insulator 808 may be similar to the insulator 418 described with respect to FIG. 4K, and is deposited in the regions of the patterned metal layer 830 that were etched in step 704. The insulator may include any insulating medium, such as an ILD, including any of the ILD materials provided above.

The patterned metal layer 830 shown in FIG. 8C has a first metal pattern. A second metal pattern may be created overtop of the first metal pattern to produce a more tightly pitched pattern, e.g., as described with respect to steps 708 and 720 and illustrated in FIGS. 8D-8J, described below. While the process described with respect to FIGS. 1-4 used two subtractive metal patterning processes to for a tightly-pitched metal pattern, in the process described with respect to FIGS. 7 and 8, a first subtractive metal patterning process (e.g., the process described with respect to FIGS. 5 and 6, and the process described with respect to FIGS. 8A-8C and steps 702 and 706) is followed by an additive process that adds additional metal structures (e.g., additional metal lines) to the patterned metal layer 830.

After the first, subtractive metal patterning process, the patterned metal layer 830 may have minimum pitch that is three times the width of the insulator between adjacent metal portions set at the minimum pitch. This arrangement enables the second metal patterning process to pitch-half the first metal pattern. In other examples, different ratios of insulator to metal may be used in regions of minimum pitch, e.g., based on the relative widths of insulator to metal in the final metal pattern.

Figure 8D:
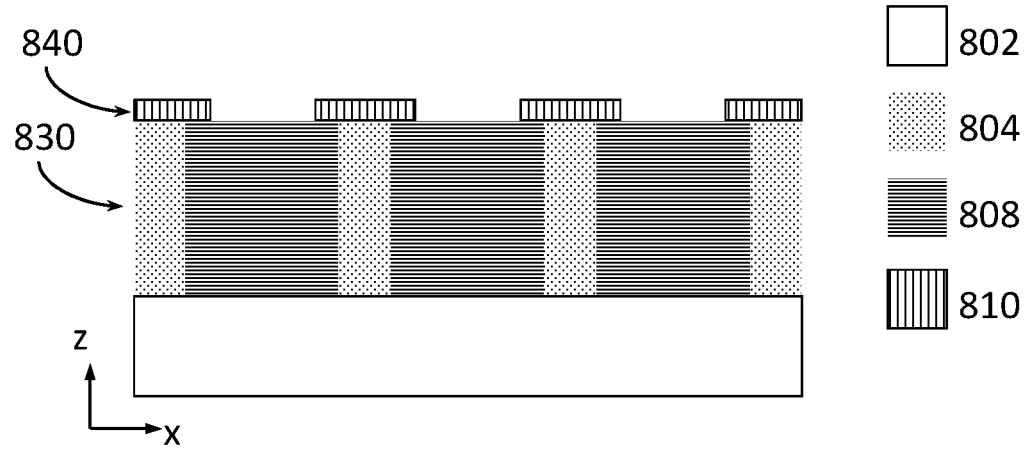

Returning to FIG. 7, the process 700 proceeds with depositing 708 a guiding pattern over the patterned metal layer. FIG. 8D illustrates an example of a guiding pattern 840 formed over the patterned metal layer 830. The guiding pattern 840 includes an anchoring material 810, which may be similar to the anchoring material 210 described with respect to FIG. 2F. The anchoring material 810 covers a portion of the patterned metal layer 830. The anchoring material 810 is deposited in a pattern based on the second metal pattern to be added to the patterned metal layer 830. The anchoring material 810 covers the metal portions of the patterned metal layer 830, and regions of the insulator 808 adjacent to the metal portions. While a cross-section of a simple striped pattern is illustrated for the guiding pattern 840, in other examples, a more complex pattern with regions of the anchoring material 810 and/or regions between the anchoring material 810 having various widths.

As described with respect to FIG. 2, in some embodiments, the anchoring material 810 is a first anchoring material, and the guiding pattern 840 may further include a second anchoring material deposited in regions between the anchoring material 810, i.e., covering the portions of insulator 808 that are not covered by the anchoring material 810. In other embodiments, the guiding pattern 840 includes a neutral material deposited in regions between the first anchoring material.

Figure 8E:
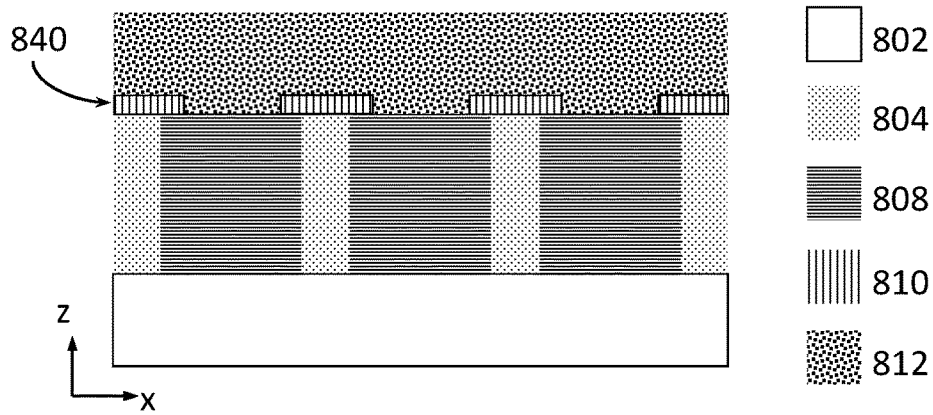

The process 700 proceeds with depositing 710 a solution of a diblock copolymer over the guiding pattern 840. FIG. 8E illustrates an example result of depositing a diblock copolymer 812 over the guiding pattern 840. The diblock copolymer 812 may be similar to the diblock copolymer 212 described with respect to FIG. 2G.

In some embodiments, an annealing process 712 may be performed after the diblock copolymer 812 is deposited in order to initiate, accelerate, or otherwise promote the self-assembly of the diblock copolymer 812. The annealing process 712 may be similar to the annealing process 116 described with respect to FIG. 1 and FIG. 2H.

Figure 8F:
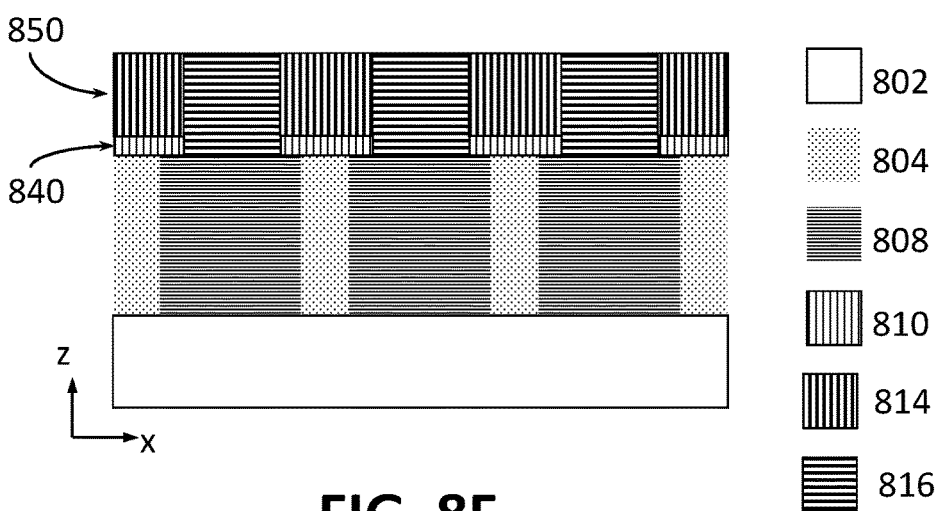

FIG. 8F illustrates an example result of the self-assembly of the diblock copolymer 812, e.g., after annealing the diblock copolymer 812. As described with respect to FIG.

2H, polymer blocks of a given type may tend to segregate or conglomerate with polymer blocks of the same type of other molecules. A self-assembled layer 850 includes regions of polymer A 814 and regions of polymer B 816, which may be similar to polymer A 214 and polymer B 216, respectively. The regions of polymer A 814 are formed over the anchoring material 810. The regions of polymer B 816 are formed in the other areas of the guiding pattern 840, i.e., over regions not covered by the anchoring material 810. In this example, the regions of polymer B 816 are formed directly over the insulator 808. If a second anchoring material or neutral material are included in the guiding pattern 840, the regions of polymer B 816 would be formed over the second anchoring material or neutral material.

Figure 8G:
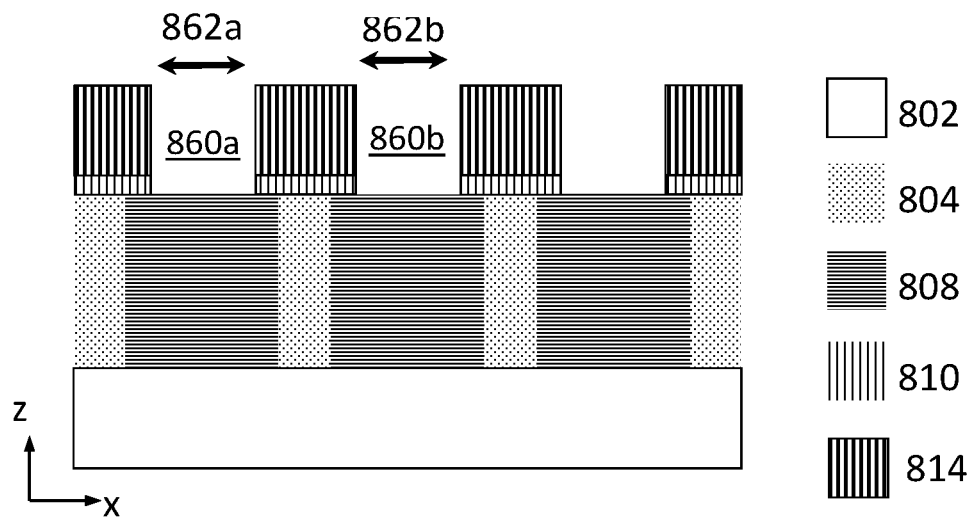

Returning to FIG. 7, the process 700 proceeds with etching 714 polymer B. Etching polymer B 816 exposes areas of the insulator 808 not covered by the anchoring material 810 and polymer A 814. FIG. 8G illustrates an example result of etching the polymer B regions. The etching process 714 may be similar to the etching process 118 described with respect to FIG. 1 and FIG. 2I. The etching process forms etched regions 860, also referred to as openings 860, e.g., the openings 860a and 860b labelled in FIG. 8G. The openings 860 match the pattern of polymer B 816. The openings 860 have a width 862. The width of the openings may be based on the relative lengths of the polymers in the diblock copolymer 812, the pattern of the anchoring material 810, and/or other factors. The etching may be performed using an isotropic chemically selective etch material. If a second anchoring material is used, the etching process may remove the second anchoring material. In other embodiments, a second etching step is used to remove the second anchoring material exposed by a first etching step that removes polymer B 816.

Figure 8H:
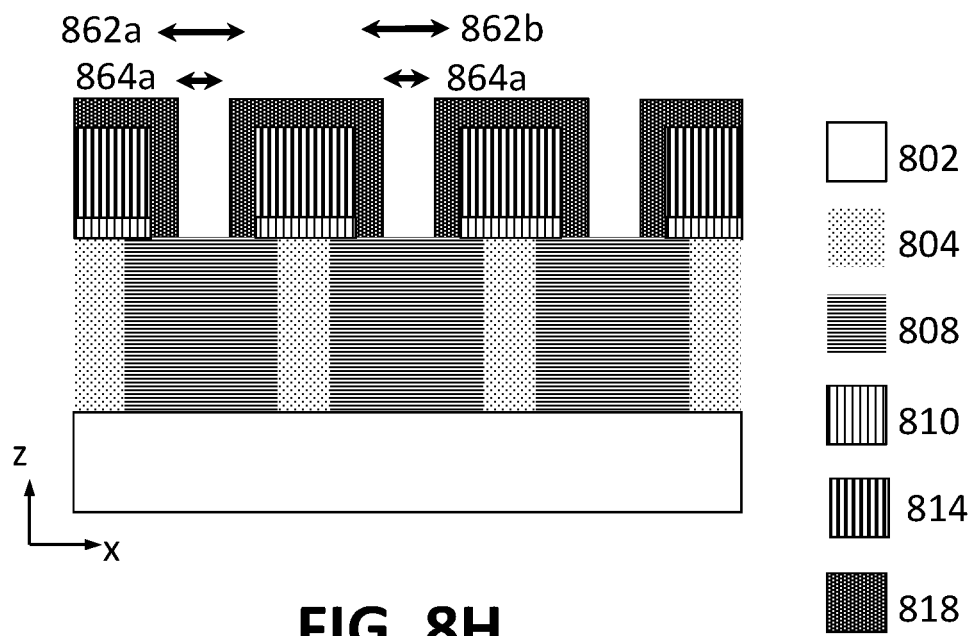

The process 700 may optionally proceed with depositing 716 a spacer material over the regions of polymer A. FIG. 8H illustrates an example result of depositing a spacer material 818 over the regions of polymer A 814. The spacer material 818 may be conformally deposited, e.g., using CVD or ALD, to cover the tops and the sides of the regions of polymer A 814. The spacer material 818 may be a material that adheres to polymer A 814 but does not adhere to the exposed insulator 808.

Figure 8I:
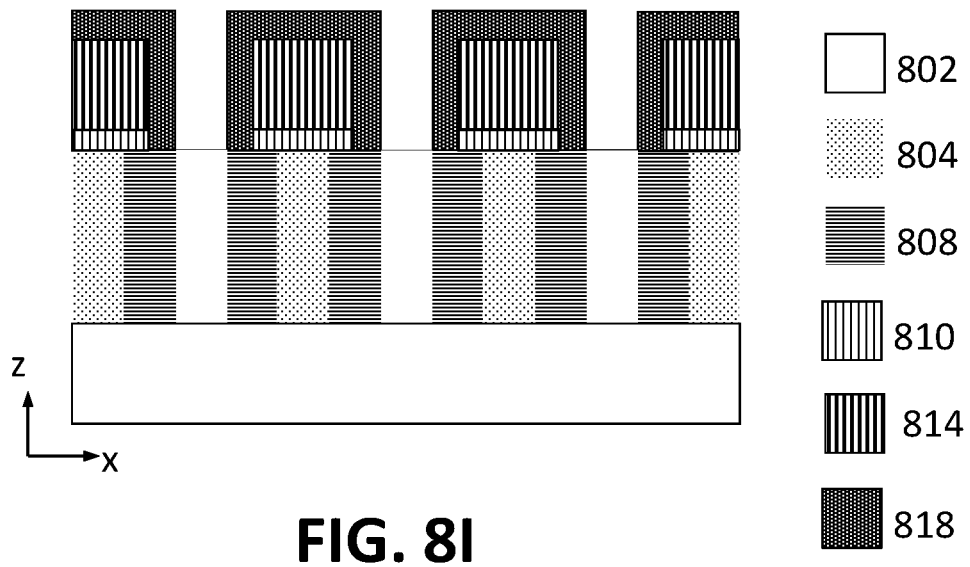

Like the spacer material 218 described with respect to FIG. 2J, the spacer material 818 adds to the width of the regions of polymer A 814, to reduce the widths of the openings 860. For example, FIG. 8H illustrates the widths 862a and 862b of the openings 860a and 860b between pairs of adjacent regions of polymer A 814, also illustrated in FIG. 8G. FIG. 8H also illustrates widths 864a and 864b of the openings 860a and 860b between adjacent regions of polymer A 814 with the spacer material 818 added to the regions of polymer A 814. The widths 864 of the openings 860 once the spacer material 818 is added are smaller than the widths 862 between adjacent regions of polymer A 814 without the spacer material 818. Depositing the spacer material 818 over the regions of polymer A 814 can tune the widths of insulator lines and, thus, the widths of the metal lines formed in the first metal pattern, as illustrated in FIGS. 8I-8J.

The process 700 proceeds with etching 718 the exposed insulator 808 in the patterned metal layer to pattern the insulator 808. In particular, the regions of insulator 808 exposed by polymer A 814 and the spacer material 818 are removed in the etching process 718. FIG. 8H illustrates an example of the patterned metal layer 830 with portions of the insulator 808 removed. The exposed portions of the insulator 808 may be etched using any insulator etching process known in the art. Although not specifically shown in FIG. 8H, after the exposed insulator 808 is etched, the spacers 818 and polymer A 814 may be removed. Alternatively, the spacer material 818 and polymer A 814 may be removed at a different point in the process 700, e.g., after the metal is deposited in step 720.

The process 700 proceeds with depositing 720 a metal over the patterned insulator 808, and in particular, in the regions of the insulator 808 that were etched in step 718. FIG. 8J illustrates an example of the patterned metal layer 830 with additional metal 820 deposited between the existing metal lines. In this example, the deposited metal 820 has a different pattern from the metal 804, indicating that the metal materials 804 and 820 may be different. For example, metal 820 may be a metal more suitable for additive patterning, whereas metal 804 is a metal more suitable for subtractive patterning. The metal 820 may be selected from any of the metals or other conducting materials described above, e.g., with respect to the metal 204. In other embodiments, the metals 804 and 820 may be the same.

Figure 8J:
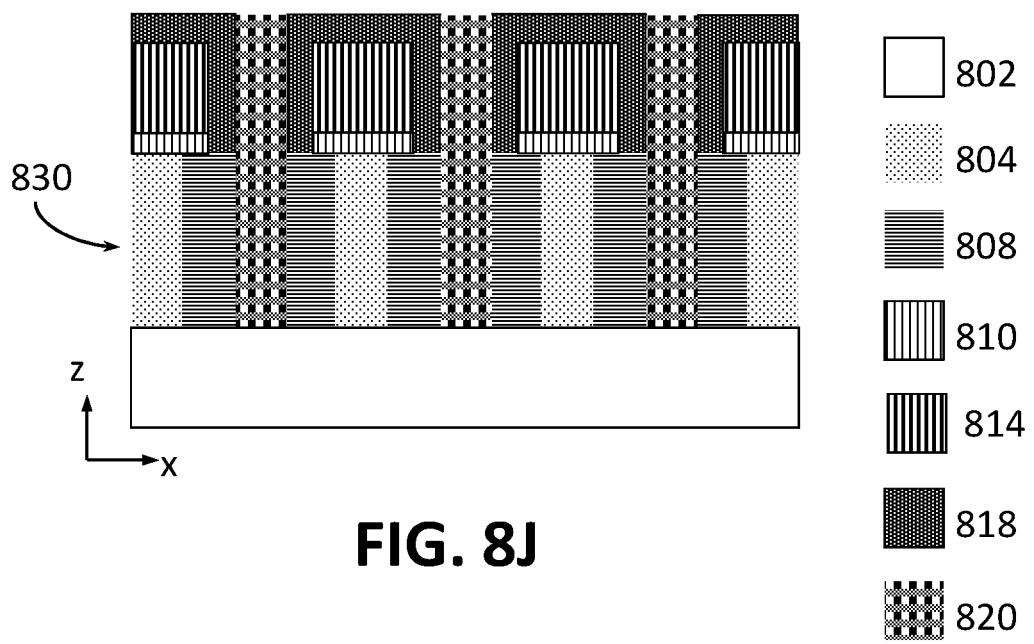

Across the example cross-section shown in FIG. 8J, the metal regions formed by the metals 804 and 820 have a consistent width and pitch, e.g., the patterned metal layer 830 may be a metal grating with a pitch of, e.g., less than 30 nanometers, and a line width or critical dimension of less than 15 nanometers. However, as with the example patterned mask 230 described above, a metal layer patterned according to the process 700 may have metal and/or dielectric regions with various shapes, pitches, and line widths.

Example Oxide-Assisted Process for Forming a Narrow Pitch Metal Grating

Figure 9:
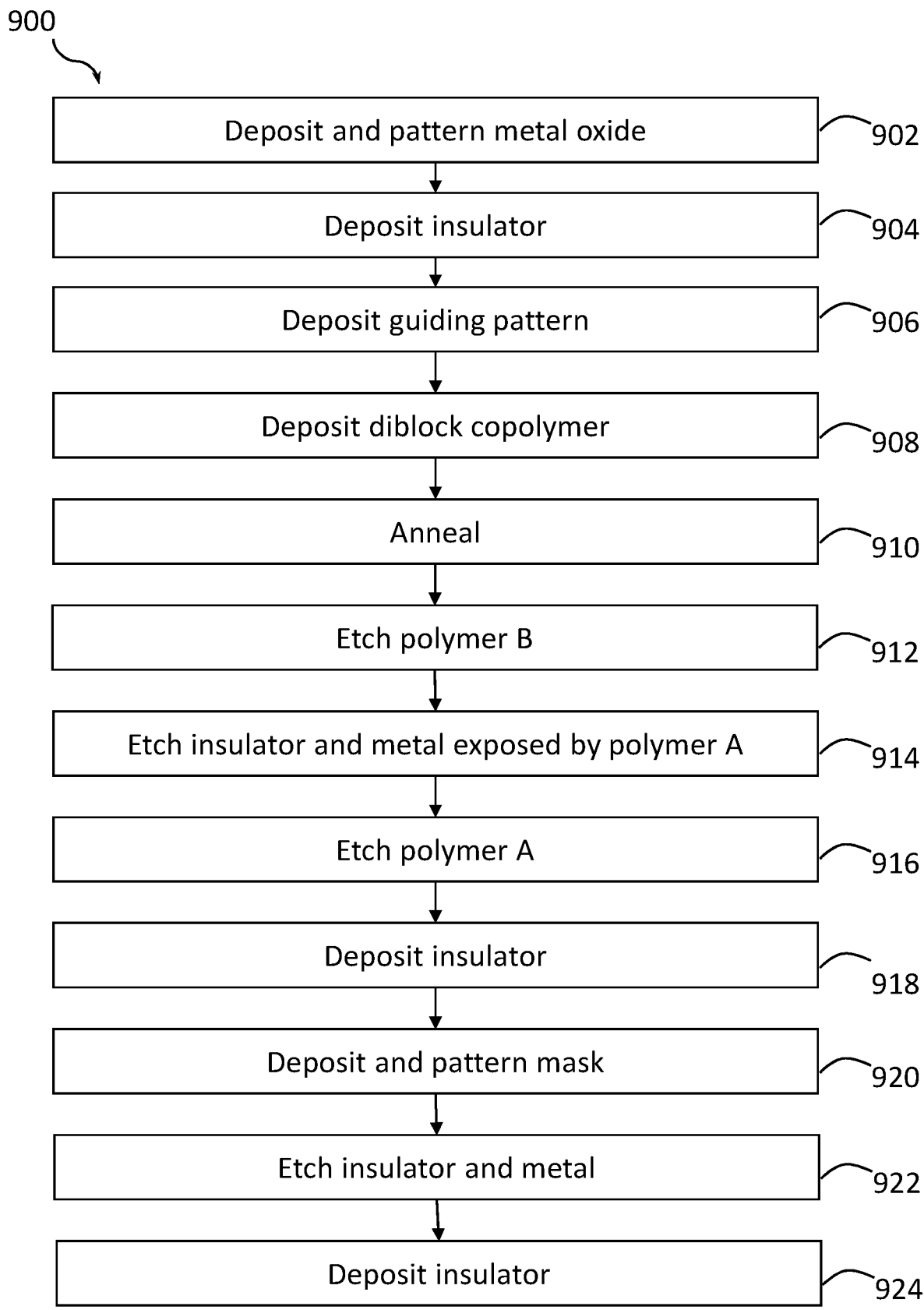
FIG. 9 is a flow chart illustrating a fifth process for generating a patterned metal layer using DSA, according to some embodiments of the present disclosure.

FIG. 9 is a flow chart illustrating a fifth process 900 for generating a patterned metal layer using DSA, according to some embodiments of the present disclosure. The process 900 uses an oxide layer to produce a narrow-pitch mask, and an underlying metal layer can be subtractive patterned using the narrow-pitch mask.

FIGS. 10A-10L illustrate various stages in the process of generating the patterned metal layer according to the process of FIG. 9, according to some embodiments of the present disclosure. More specifically, FIGS. 10A-10L illustrate cross-sectional side views for various stages in the process of generating a metal pattern according to the process 900.

A number of elements referred to in the description of FIGS. 10A-10L with reference numerals are illustrated in these figures with different patterns, with a legend showing the correspondence between the reference numerals and patterns being provided at the bottom of each drawing page containing FIGS. 10A-10L. For example, the legend illustrates that FIGS. 10A-10L use different patterns to show a support structure 1002, a metal 1004, and a metal oxide 1006. For convenience, a number of the same patterns used in FIGS. 2A-2N, FIGS. 4A-4K, FIGS. 6A-6G, and 8A-8J are used in FIGS. 10A-10L with updated numbering. Furthermore, although a certain example metal pattern is illustrated in some of 10A-10L, this is simply for ease of illustration, and it should be understood that different IC structures having different patterns may be obtained according to the disclosure. Still further, various IC structure views shown in FIGS. 10A-10L are intended to show relative arrangements of various elements therein, and that various IC structures, or portions thereof, may include other elements or components that are not illustrated (e.g., transistor portions, various components that may be in electrical contact with the capacitor or contacts, etc.).

Figure 10A:
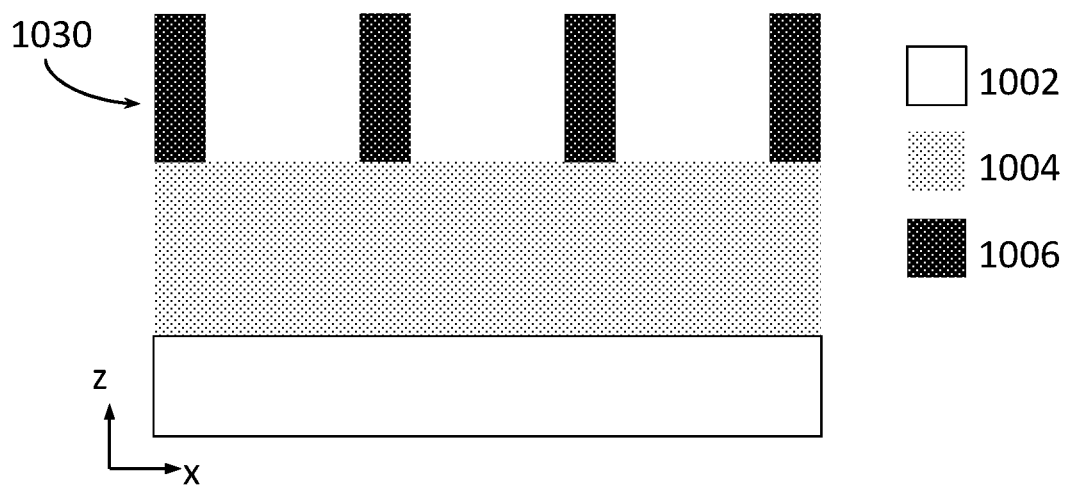
FIGS. 10A-10L illustrate various stages in the process of generating the patterned metal layer according to the process of FIG. 9, according to some embodiments of the present disclosure.

Turning to FIG. 9, the process 900 may begin with depositing and patterning 902 a metal oxide layer over a metal. FIG. 10A illustrates an example of a support structure 1002, over which a layer of metal 1004 has been deposited. The support structure 1002 and metal 1004 may be similar to the support structure 202 and metal 204 described above with respect to FIG. 2A.

A metal oxide 1006 has also been deposited over the metal 1004 and patterned to form a patterned metal oxide 1030. The metal oxide 1006 may be, for example, titanium oxide, aluminum oxide, or another type of metal oxide. The metal oxide 1006 may be deposited as a full layer, patterned, and etched, e.g., using a process similar to the process 500 for generating a patterned layer with narrow lines, e.g., a grating with lines having a width of less than half of the pitch. Unlike the process 500, which patterned a metal layer, the process for generating the patterned metal oxide 1030 patterns a metal oxide 1006 rather than the metal 604. Alternatively, the metal oxide 1003 may be patterned using a lithographic process. Appropriate etch chemistries may be used to etch the metal oxide 1006 and not the underlying metal 1004.

Figure 10B:
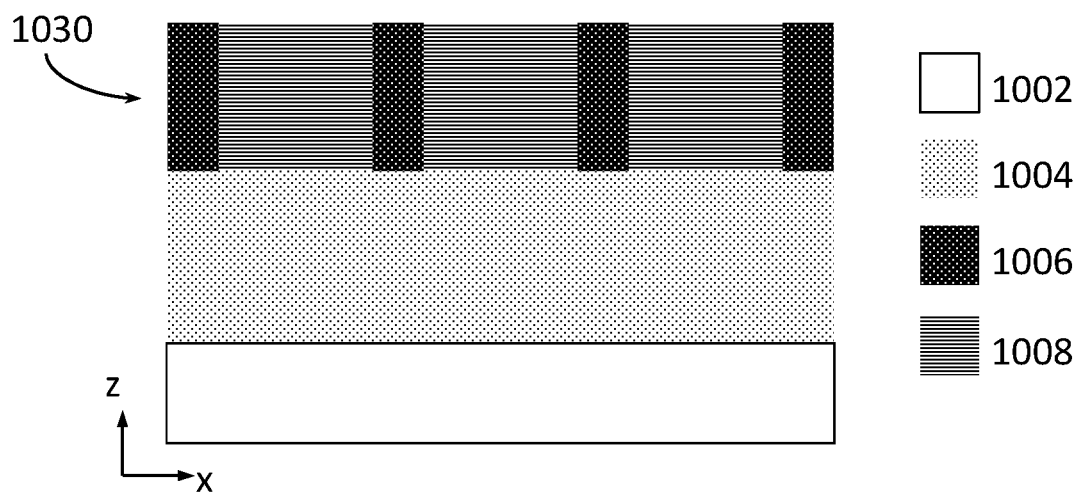

The process 900 proceeds with depositing 904 an insulator over the patterned metal oxide, and in particular, in the regions of the patterned metal oxide that were etched in step 902. FIG. 10B illustrates an example of the patterned metal oxide 1030 with an insulator 1008 deposited between the metal oxide regions. The insulator 1008 may include any insulating medium, such as an ILD, as described above with respect to the insulator 208.

Figure 10C:
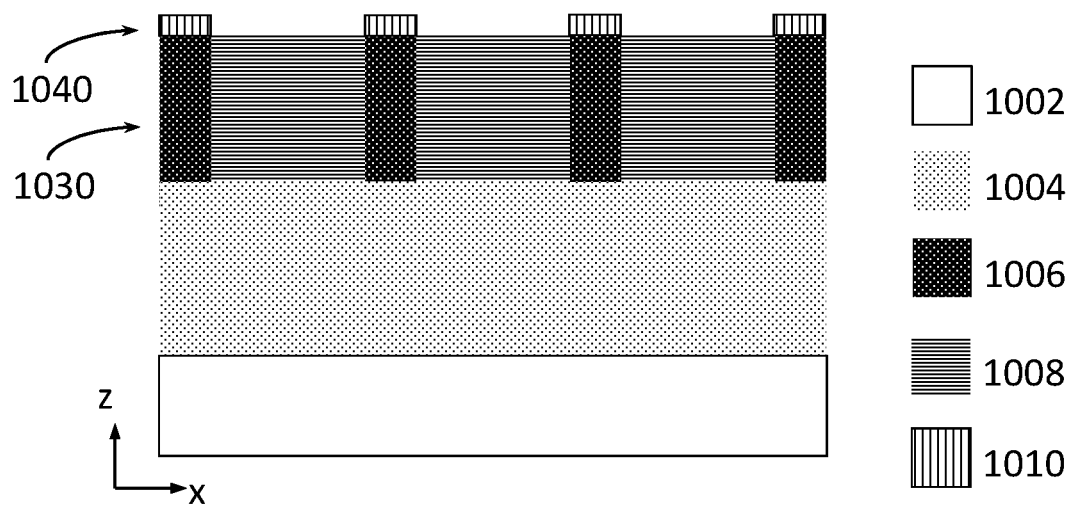

The process 900 proceeds with depositing 906 a guiding pattern over the patterned metal oxide layer. FIG. 10C illustrates an example of a guiding pattern 1040 formed over the patterned metal oxide 1030. The guiding pattern 1040 includes an anchoring material 1010, which may be similar to the anchoring material 210 described with respect to FIG. 2F. The anchoring material 1010 covers the metal oxide 1006 in the patterned metal oxide layer 1030.

As described with respect to FIG. 2, in some embodiments, the anchoring material 1010 is a first anchoring material, and the guiding pattern 1040 may further include a second anchoring material deposited in regions between the anchoring material 1010, i.e., covering the insulator 1008. In other embodiments, the guiding pattern 1040 includes a neutral material deposited in regions between the first anchoring material.

In some embodiments, the chemical properties of the metal oxide 1006 and the insulator 1008 may influence the placement of the anchoring material 1010 over the metal oxide 1006. For example, the anchoring material 1010 may tend to adhere to the metal oxide 1006, or tend to be repelled from the insulator 1008. If a second anchoring material is used, the second anchoring material may tend to adhere to the insulator 1008, or tend to be repelled from the metal oxide 1006. Additionally or alternatively, other types of surface treatments (e.g., oxidizing or de-oxidizing) may be used to modify the surface of the patterned metal oxide 1030 to generate the guiding pattern 1040.

Figure 10D:
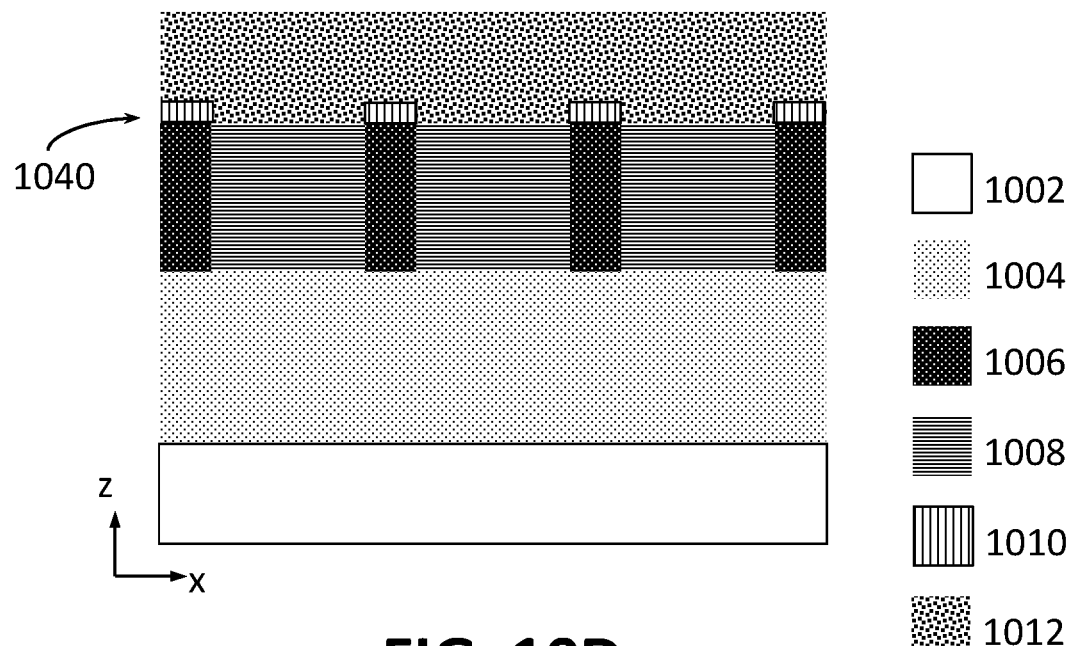

The process 900 proceeds with depositing 908 a solution of a diblock copolymer over the guiding pattern 1040. FIG. 10D illustrates an example result of depositing a diblock copolymer 1012 over the guiding pattern 1040. The diblock copolymer 1012 may be similar to the diblock copolymer 212 described with respect to FIG. 2G.

In some embodiments, an annealing process 910 may be performed after the diblock copolymer 1012 is deposited in order to initiate, accelerate, or otherwise promote the self-assembly of the diblock copolymer 1012. The annealing process 910 may be similar to the annealing process 116 described with respect to FIG. 1 and FIG. 2H.

Figure 10E:
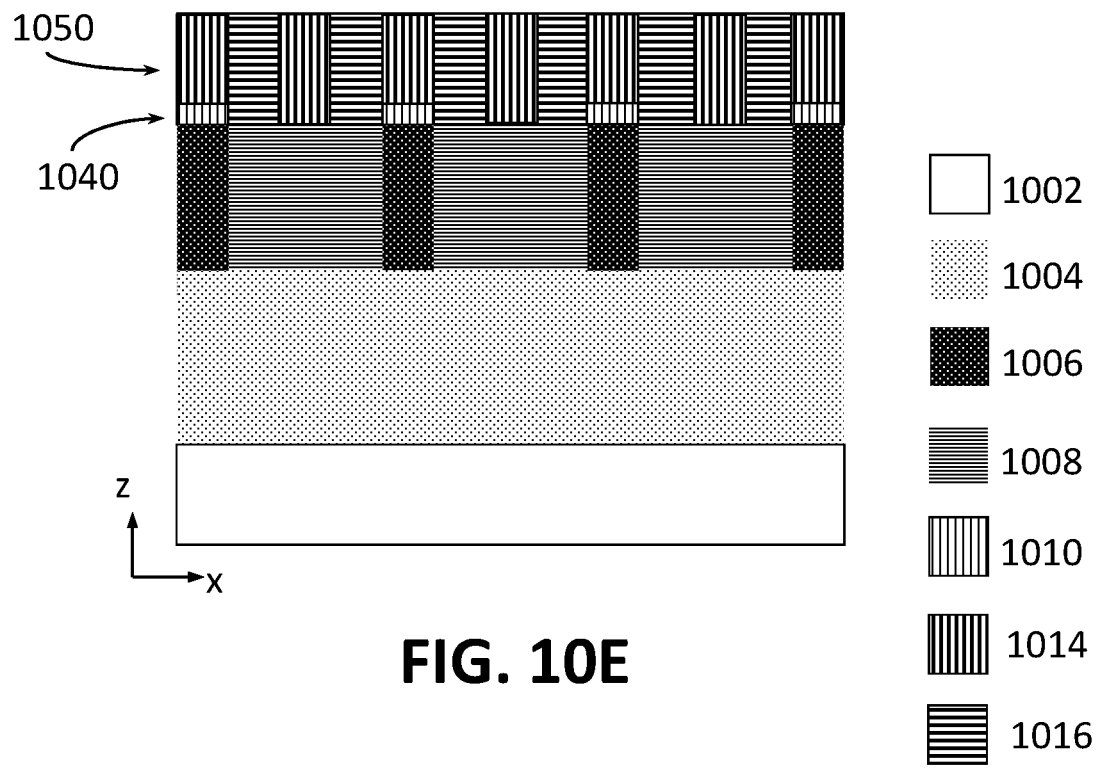

FIG. 10E illustrates an example result of the self-assembly of the diblock copolymer 1012, e.g., after annealing the diblock copolymer 1012. As described with respect to FIG. 2H, polymer blocks of a given type may tend to segregate or conglomerate with polymer blocks of the same type of other molecules. A self-assembled layer 1050 includes regions of polymer A 1014 and regions of polymer B 1016, which may be similar to polymer A 214 and polymer B 216, respectively. In this example, regions of polymer A 1014 are formed over the anchoring material 1010. In addition, regions of polymer A 1014 are formed between the anchoring material 1010, so that adjacent regions of polymer A 1014 have half the pitch of adjacent regions of the anchoring material 1010. The regions of polymer B 1016 are formed in the other areas of the guiding pattern 1040, i.e., in regions between areas of polymer A 1014.

The self-assembled layer 1050 shown in FIG. 10E can be obtained based on the lengths of the polymers in the diblock copolymer 1012 and the relative ratios of polymer A:polymer B and of the anchoring material 1010 to a neutral region/second anchoring material. For example, if the anchoring material 1010 covers around a quarter of the surface area of the patterned metal oxide 1030, and the diblock copolymer 1012 has around a 1:1 ratio of polymer A 1014 to polymer B 1016, the polymer A 1014 may assemble into lines directly over the anchoring material 1010 and between regions of the anchoring material 1010, as illustrated in FIG. 10E.

Figure 10F:
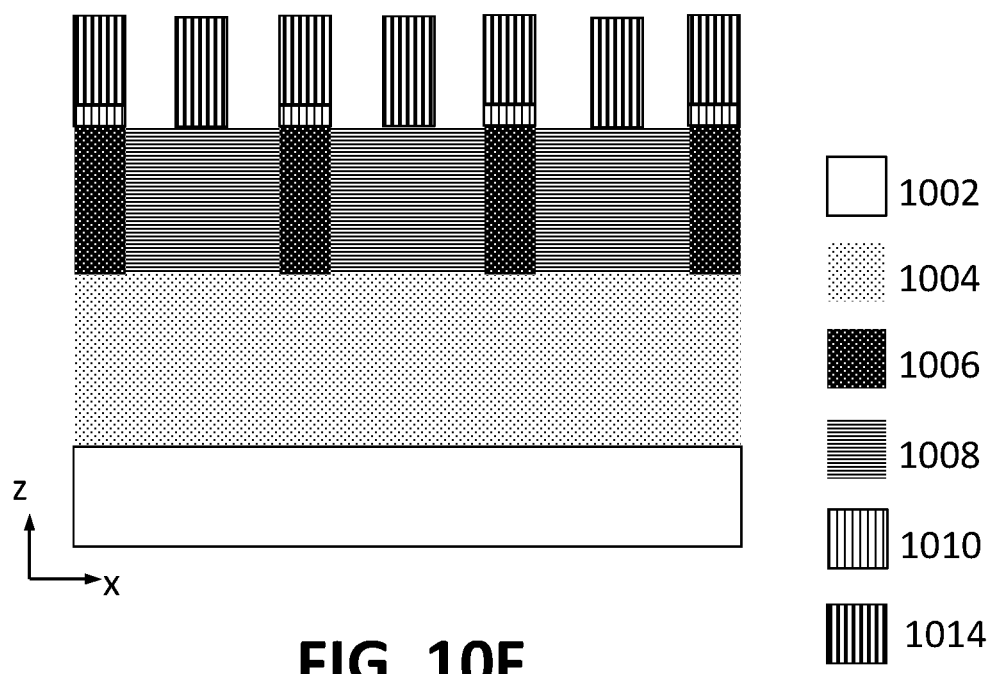

Returning to FIG. 9, the process 900 proceeds with etching 912 polymer B. Etching polymer B 1016 exposes areas of the patterned metal oxide layer 1030 not covered by polymer A 1014. FIG. 10F illustrates an example result of etching the polymer B regions. Etching polymer B 1016 exposes portions of the patterned metal oxide layer 1030 filled with the insulator 1008. The etching process 912 may be similar to the etching process 118 described with respect to FIG. 1 and FIG. 2I. The etching may be performed using an isotropic chemically selective etch material. If a second anchoring material is used, the etching process may remove the second anchoring material. In other embodiments, a second etching step is used to remove the second anchoring material exposed by a first etching step that removes polymer B 1016.

Figure 10G:
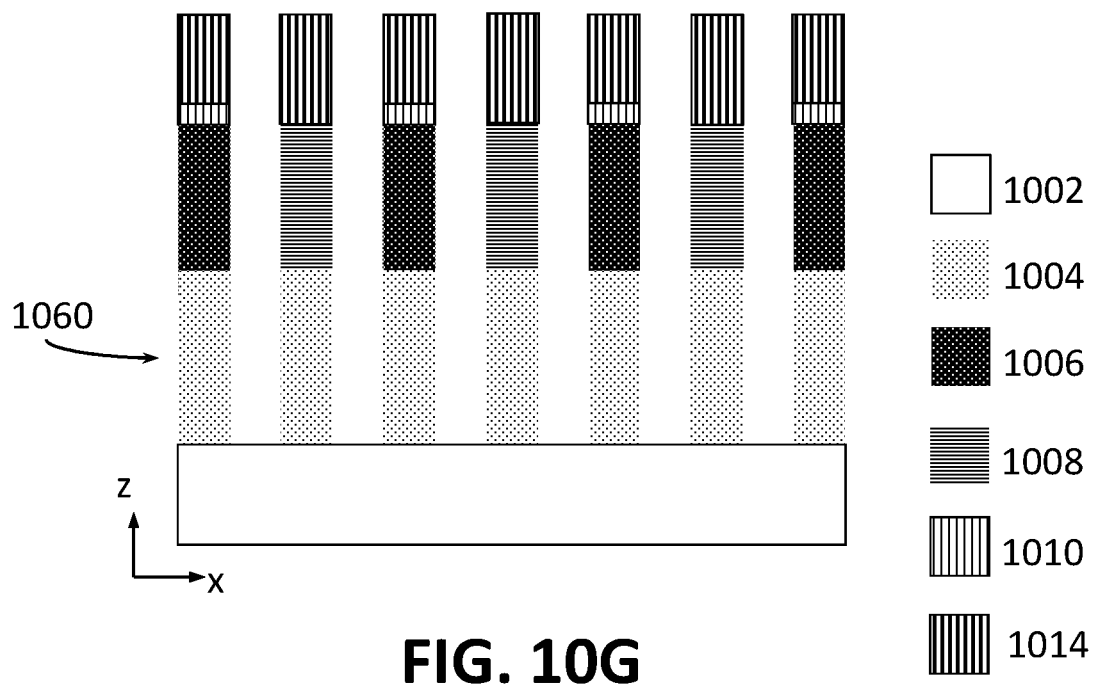

The process 900 proceeds with etching 914 the exposed insulator in the patterned metal oxide layer and the metal below the exposed insulator. In particular, the regions of insulator 1008 in the patterned metal oxide layer 1030 exposed by polymer A 1014 are etched, and the regions of the metal 1004 exposed by etching the insulator 1008 are etched. A two-step etching process may be used, e.g., a first step to remove the insulator 1008, and a second step to remove the metal 1004. FIG. 10G illustrates an example of a patterned metal layer 1060 with portions of the metal 1004 removed.

Figure 10H:
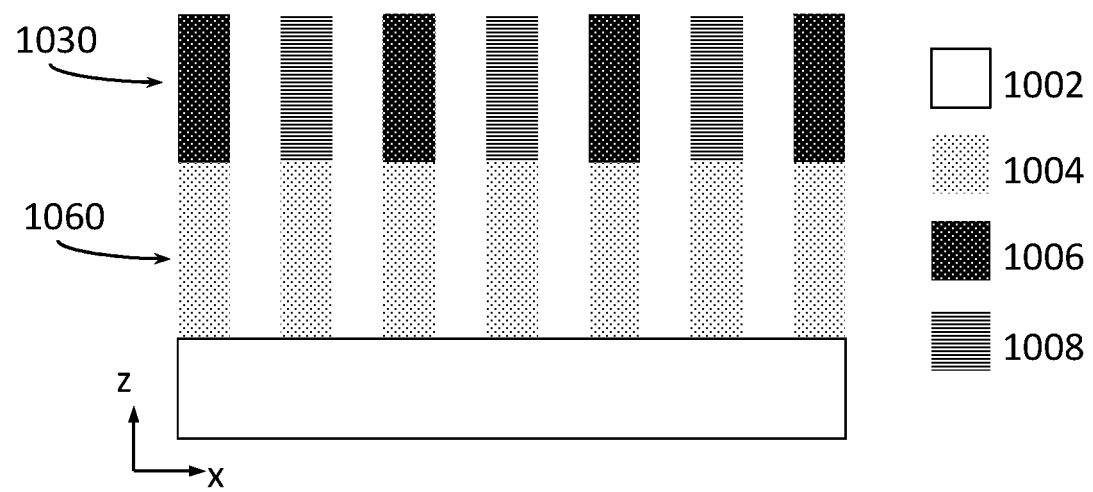

The process 900 proceeds with etching 916 polymer A. After the exposed insulator 1008 and metal 1004 are etched, polymer A 1014 may be removed. Alternatively, polymer A 1014 may be removed after the exposed insulator 1008 is etched but before the metal 1004 is etched. FIG. 10H illustrates an example of the patterned metal layer 1060 and patterned metal oxide layer 1030 with polymer A 1014 removed.

Figure 10I:
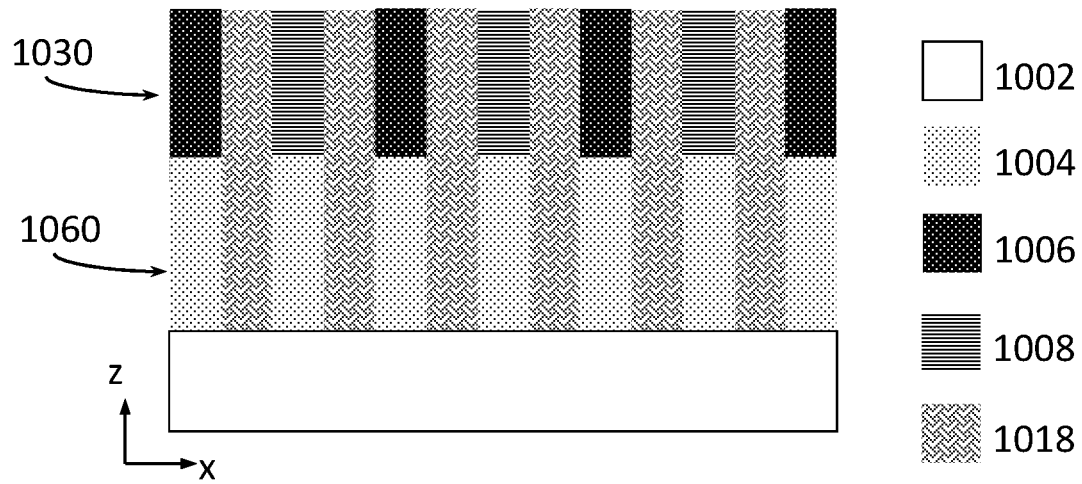

The process 900 proceeds with depositing 918 an insulator between the remaining portions of metal 1004 in the patterned metal layer 1060. FIG. 10I illustrates an example of the patterned metal layer 1060 with an insulator 1018 deposited. In this example, the insulator 1018 has a different pattern from the insulator 1008, indicating that the insulators 1018 and 1008 may be different materials. In other embodiments, the same insulator material is used for the insulators 1018 and 1008. While FIG. 10I illustrates that the patterned metal oxide layer 1030 remains over the patterned metal layer 1060, in other embodiments, the patterned metal oxide layer 1030 is removed, either before or after the insulator 1018 is deposited.

Steps 902-918 result in a narrow-pitch metal grating, e.g., the patterned metal layer 1060 illustrated in FIG. 10I. The patterned metal layer 1060 may have a pitch of, e.g., 30 nanometers or less, and a line width or critical dimension of less than 15 nanometers. In some embodiments, depending on the design of a particular device incorporating the patterned metal layer 1060, one or more of the metal lines in the patterned metal layer 1060 may be removed and replaced with an insulator. An example of removing a metal line and replacing it with an insulator is described with respect to optional steps 920-924 and illustrated in FIGS. 10J-10L.

Figure 10J:
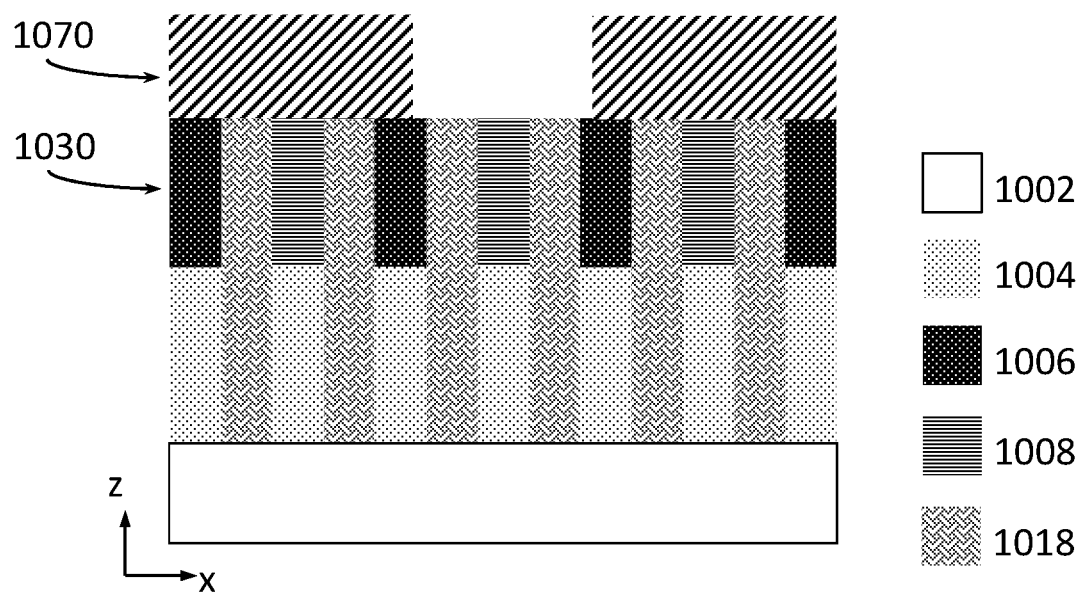

The process 900 may proceed with depositing and patterning 920 a mask over the patterned metal layer 1060 and the patterned metal oxide layer 1030. FIG. 10J illustrates an example of a patterned mask 1070 over the patterned metal oxide layer 1030. A mask 1020 may be deposited and patterned using any mask patterning process known in the art. For example, the patterned mask 1070 may be formed by depositing a mask 1020, exposing a portion of the mask 1020 to a UV light, and removing the exposed portion of the mask 1020.

Figure 10K:
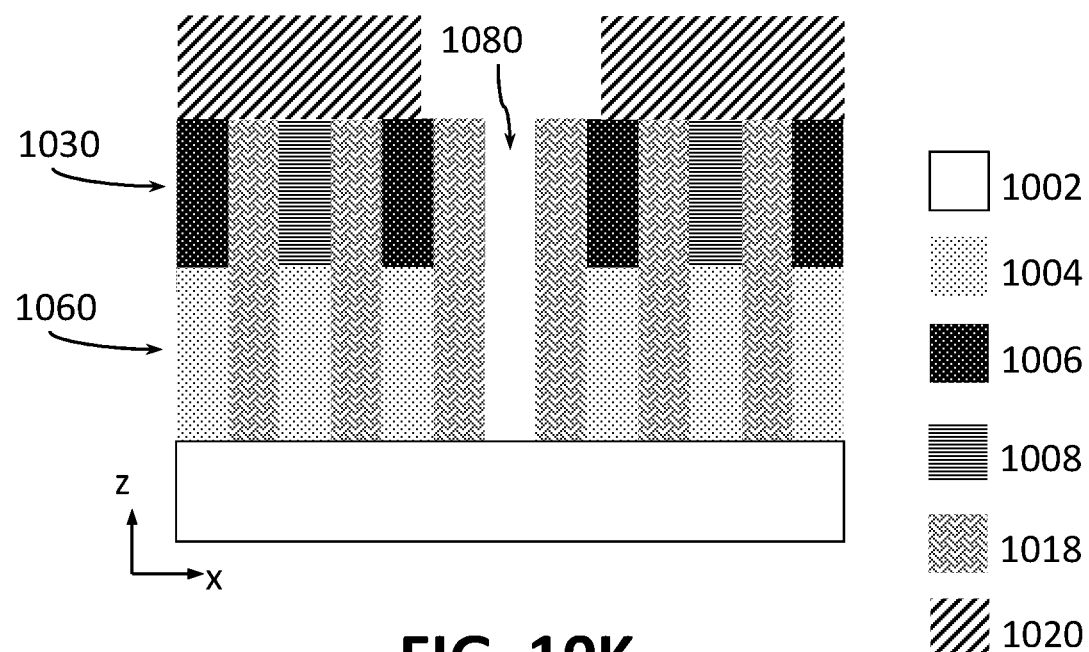

The process 900 proceeds with etching 922 the insulator in the patterned metal oxide layer 1030 and the metal in the patterned metal layer 1060 exposed by the mask 1020. FIG. 10K illustrates an example of an opening 1080 formed by etching the insulator 1008 exposed by the patterned mask 1070 and etching the metal 1004 exposed by etching the insulator 1008. In this example, the insulator 1008 and the insulator 1018 may be formed from different materials, so that the exposed insulator 1008 may be selectively etched without etching the insulator 1018. This enables a less precise mask patterning to be used to generate the patterned mask 1070.

Figure 10L:
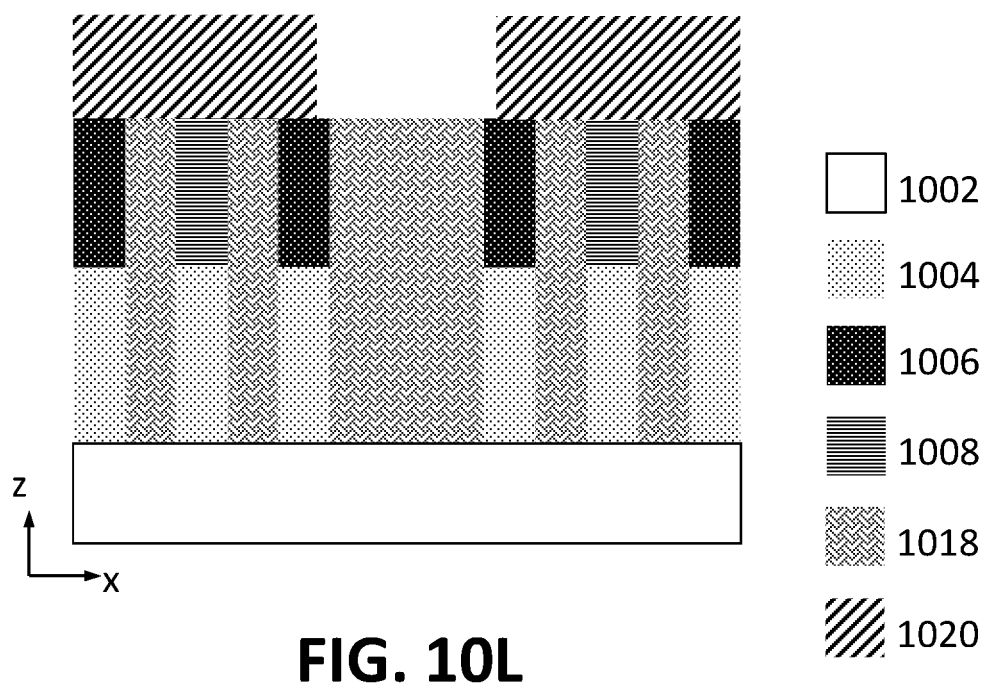

The process 900 proceeds with depositing 924 in the opening 1080. FIG. 10L illustrates that the opening 1080 has been filled by the insulator 1018. In other embodiments, a different insulator material, e.g., the insulator 1008 or another insulating material, may be deposited instead of the insulator 1018. This results in a metal pattern with two pitches, e.g., a minimum pitch between metal lines formed in steps 902-918, and double the minimum pitch between metal lines adjacent to the filled opening 1080. The mask 1020 may be removed, and the patterned metal oxide layer 1030 may also be removed.

Additional Features of Metal Layers Patterned Using DSA-Enabled Subtractive Patterning The processes for generating patterned metal layers, e.g., metal gratings, using DSA-enabled subtractive patterning, e.g., using the methods described with respect to FIGS. 1-10, can result in highly regular and well-aligned metal patterns with tight pitches and narrow critical dimensions, as described above. IC devices may exhibit certain physical characteristics in which may indicate that a DSA-enabled process described herein was used, e.g., certain pitches or relationships between different pitches across a metal grating or other metal pattern. As another example, IC devices may exhibit differences between a first region in which a DSA-enabled patterning process was performed and a second region in which DSA-enabled patterning process was not performed, which can indicate the use of the DSA-enabled patterning process in the first region.

Figure 11:
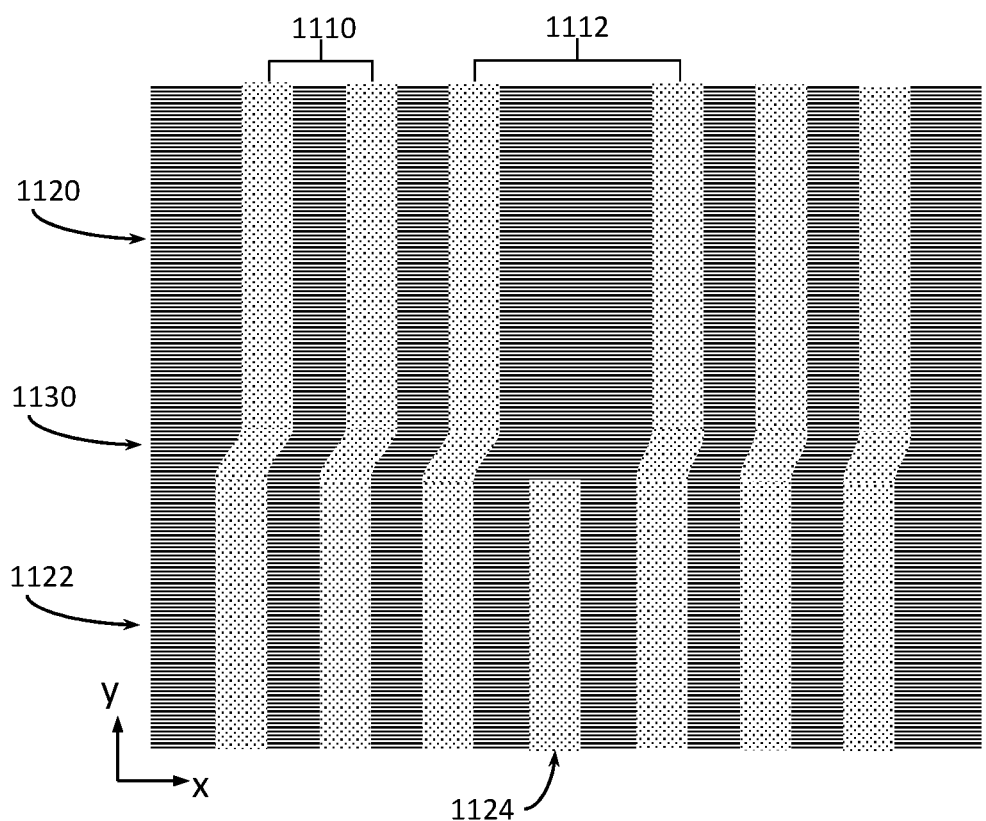
FIG. 11 illustrates a portion of a first patterned metal layer of an IC device generated using any of the processes described herein, according to some embodiments of the present disclosure.

FIG. 11 illustrates a set of metal lines, e.g., a metal grating, having two representative pitches 1110 and 1112. The metal lines are illustrated in white, and an insulator between the metal lines is illustrated in gray. While a single metal pattern and a single insulator pattern are illustrated, in some examples, multiple different metals may be used (e.g., as described with respect to process 700 and FIG. 8), and/or multiple different insulators may be used (e.g., as described with respect to the process 900 and FIG. 10).

The pitch 1110 may represent a minimum pitch across the grating. The minimum pitch 1110 may be, for example, 30 nanometers or less, or 20 nanometers or less. The second pitch 1112 is twice or approximately twice (e.g., within ±10% of twice the minimum pitch 1110). As described with respect to processes 100, 300, and 700, the DSA-enabled processes may enable pitch-halving, i.e., generating a set of metal lines with one pitch (e.g., the pitch 1112), and adding additional metal lines (either additively or subtractively) between at least some of the metal lines with the pitch 1112, resulting in lines with the minimum or half-pitch 1110 illustrated in FIG. 11. Alternatively, as described with respect to the process 900, a metal grating may be generated with the minimum pitch 1110, and some metal lines are removed and replaced with insulator, resulting in lines with the pitch 1112.

In some examples, different line widths or pitches may be observed across the metal grating or some portion of the metal grating. For example, in some embodiments, a metal line may have a line width or critical dimension that is greater than half of the pitch, or greater than two-thirds of the pitch, e.g., as illustrated in FIG. 4K. Conversely, in some embodiments, a metal line may have a line width or critical dimension that is less than half of the pitch, or less than one-third of the pitch, e.g., as illustrated in FIG. 6G.

In addition to illustrating example grating pitches, FIG. 11 illustrates a contrast between a first region 1120, e.g., an active region, and a second region 1122, e.g., an inactive region. A transition region 1130 connects metal lines in the first region 1120 to corresponding metal lines in the inactive region 1122. In this example, a floating metal line 1124 in the second region 1122 does not correspond to or connect to a line in the first region 1120. For example, the floating metal line 1124 may be a line that was not filled in or not blocked from being formed during the process in which the first region 1120 of the metal grating was formed.

The second region 1122 includes metal and insulator features that may have been formed using a DSA process, but because the second region 1122 is in an inactive region of a device, the DSA process may not have been as well-controlled as the process used to form the first region 1120. For example, a guiding pattern used to place the metal and/or insulator regions in the first region 1120 may not have been deposited over the second region 1122, resulting in a metal grating that is not aligned to the metal grating in the first region 1120. For example, the metal lines in the second region 1122 are offset from the metal lines in the first region 1120 by an amount that is less than the minimum pitch 1110.

Figure 12:
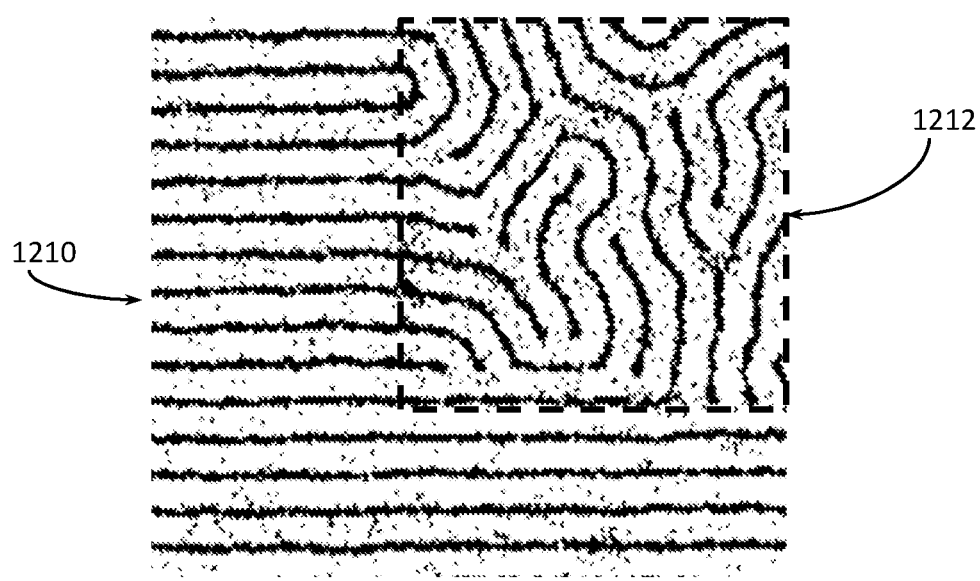
FIG. 12 illustrates a portion of a second patterned metal layer of an IC device generated using any of the processes described herein, according to some embodiments of the present disclosure.

FIG. 12 illustrates an alternate line pattern that may be formed in an inactive region 1212 of an IC device. FIG. 12 depicts a first region 1210, e.g., an active region, having a regular and well-aligned grating pattern that extends horizontally, e.g., in the x-direction. FIG. 12 also depicts a second region 1212, e.g., an inactive region, bounded by a dashed box. An inactive region may be, e.g., a frame, guard etch, or guard ring. Lines in the second region 1212 exhibit a fingerprint pattern, i.e., a pattern of alternating metal and insulator regions that has a higher degree of irregularity and lack of directionality across the pattern. The fingerprint pattern may resemble types of physical structures observed in humans' fingerprints.

Example Electronic Devices

Layers of cylindrical via structures in a hexagonal array formed using the guided hexagonal array process described herein may be included in any suitable electronic device. FIGS. 13-16 illustrate various examples of devices and components that may include cylindrical structures, e.g., vias, deposited in a hexagonal array as described herein.

Figure 13A:
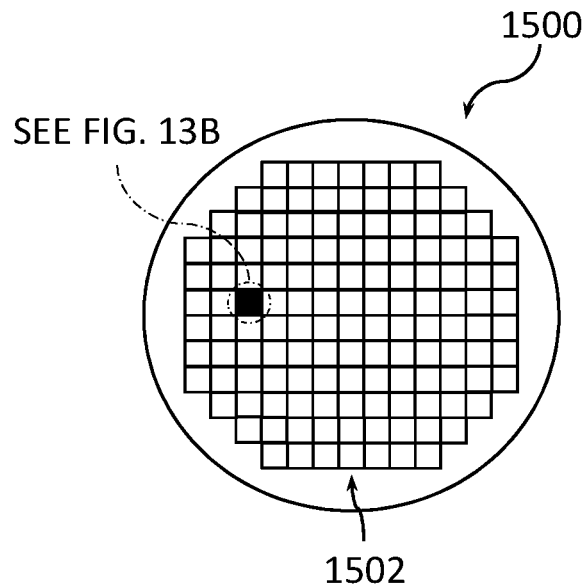
FIGS. 13A and 13B are top views of, respectively, a wafer and dies that may include a patterned metal layer in accordance with any of the embodiments disclosed herein.
Figure 13B:
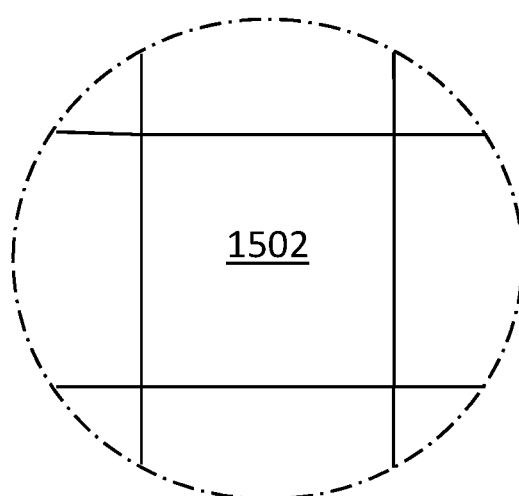

FIGS. 13A and 13B are top views of a wafer and dies that include one or more IC structures with devices including a patterned metal layer in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIG. 1, 2, or 4-6, or any further embodiments of the IC structures described herein). After the fabrication of the semiconductor product is complete (e.g., after manufacture of one or more IC structures with one or more devices including a patterned metal layer as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more devices that include a patterned metal layer as disclosed herein may take the form of the wafer 1500 (e.g., not singulated) or the form of the die 1502 (e.g., singulated). The die 1502 may include one or more transistors (e.g., one or more of the transistors 1640 of FIG. 14, discussed below) and/or supporting circuitry to route electrical signals to the transistors, as well as any other IC components (e.g., one or more devices that include a patterned metal layer). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

Figure 14:
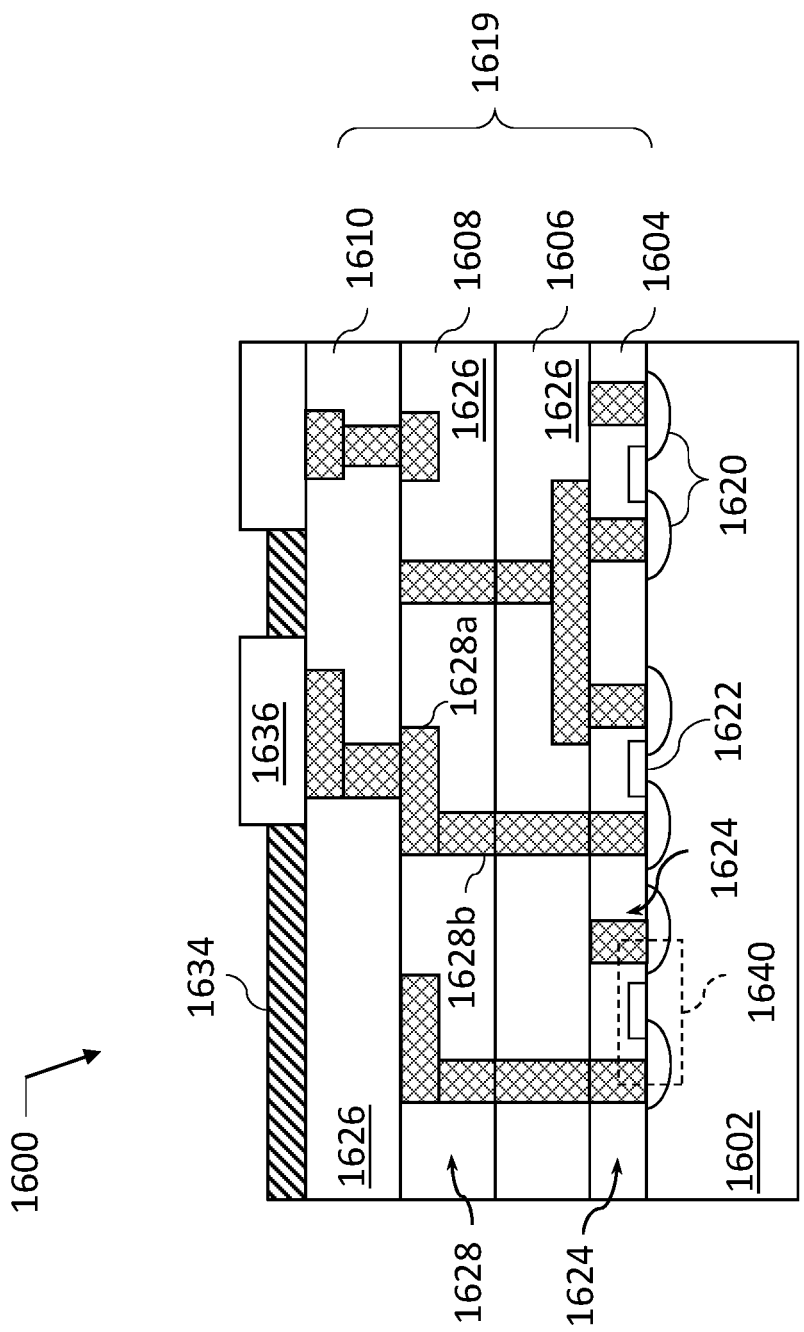
FIG. 14 is a cross-sectional side view of an IC package that may include a patterned metal layer in accordance with any of the embodiments disclosed herein.

FIG. 14 is a cross-sectional side view of an IC device 1600 that may include one or more devices including a patterned metal layer in accordance with any of the embodiments disclosed herein. The IC device 1600 may be formed on a substrate 1602 (e.g., the wafer 1500 of FIG. 13A) and may be included in a die (e.g., the die 1502 of FIG. 13B). The substrate 1602 may be any substrate as described herein. The substrate 1602 may be part of a singulated die (e.g., the dies 1502 of FIG. 13B) or a wafer (e.g., the wafer 1500 of FIG. 13A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 14). Although a particular number of interconnect layers 1606-1610 is depicted in FIG. 14, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 14. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 14. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628a and the via structures 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 15:
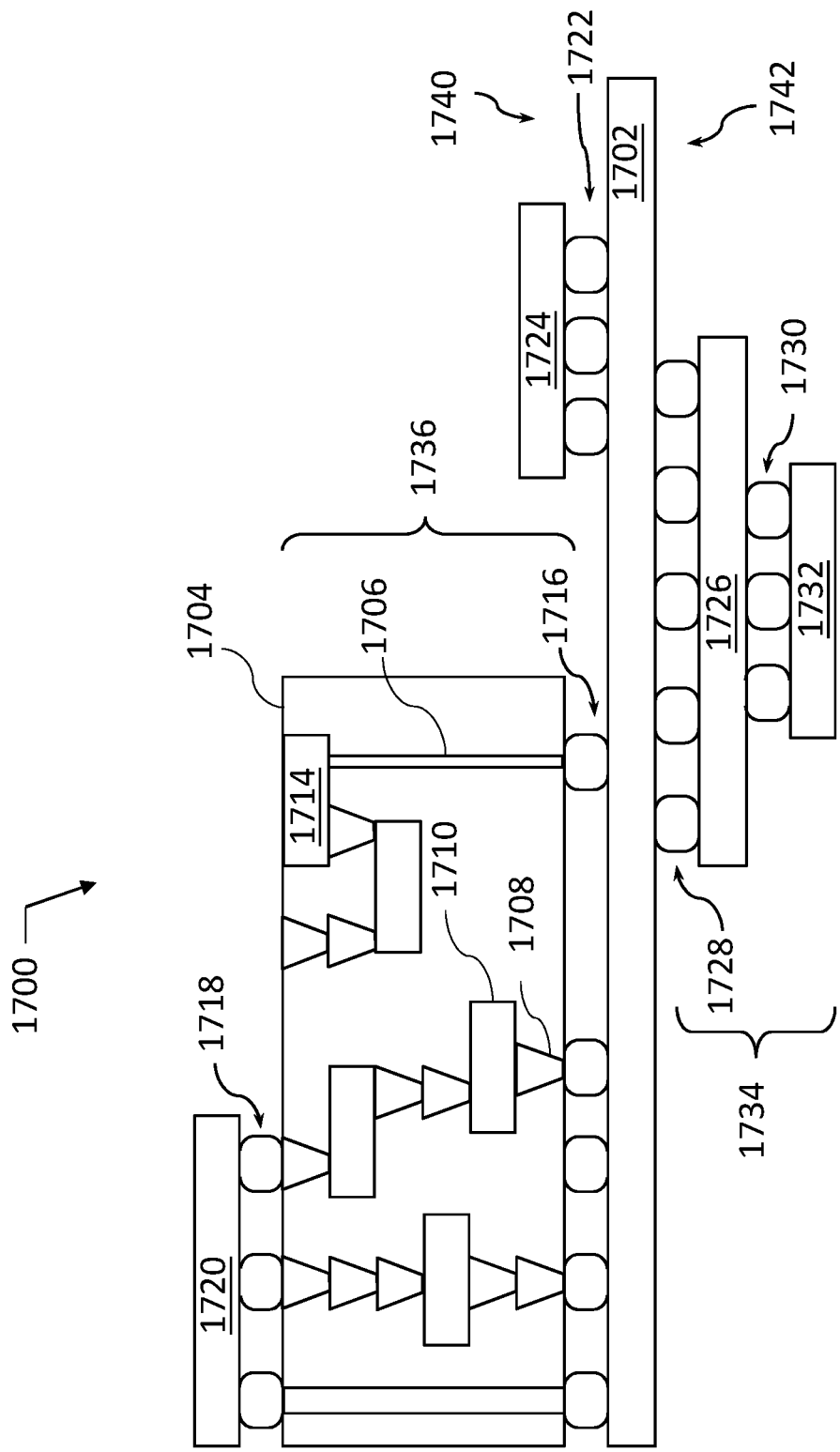
FIG. 15 is a cross-sectional side view of an IC device assembly that may include a patterned metal layer in accordance with any of the embodiments disclosed herein.

FIG. 15 is a cross-sectional side view of an IC device assembly 1700 that may include components having or being associated with (e.g., being electrically connected by means of) one or more devices including a patterned metal layer accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the a patterned metal layer as disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 13B), an IC device (e.g., the IC device 1600 of FIG. 14), or any other suitable component. In some embodiments, the IC package 1720 may include a patterned metal layer, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
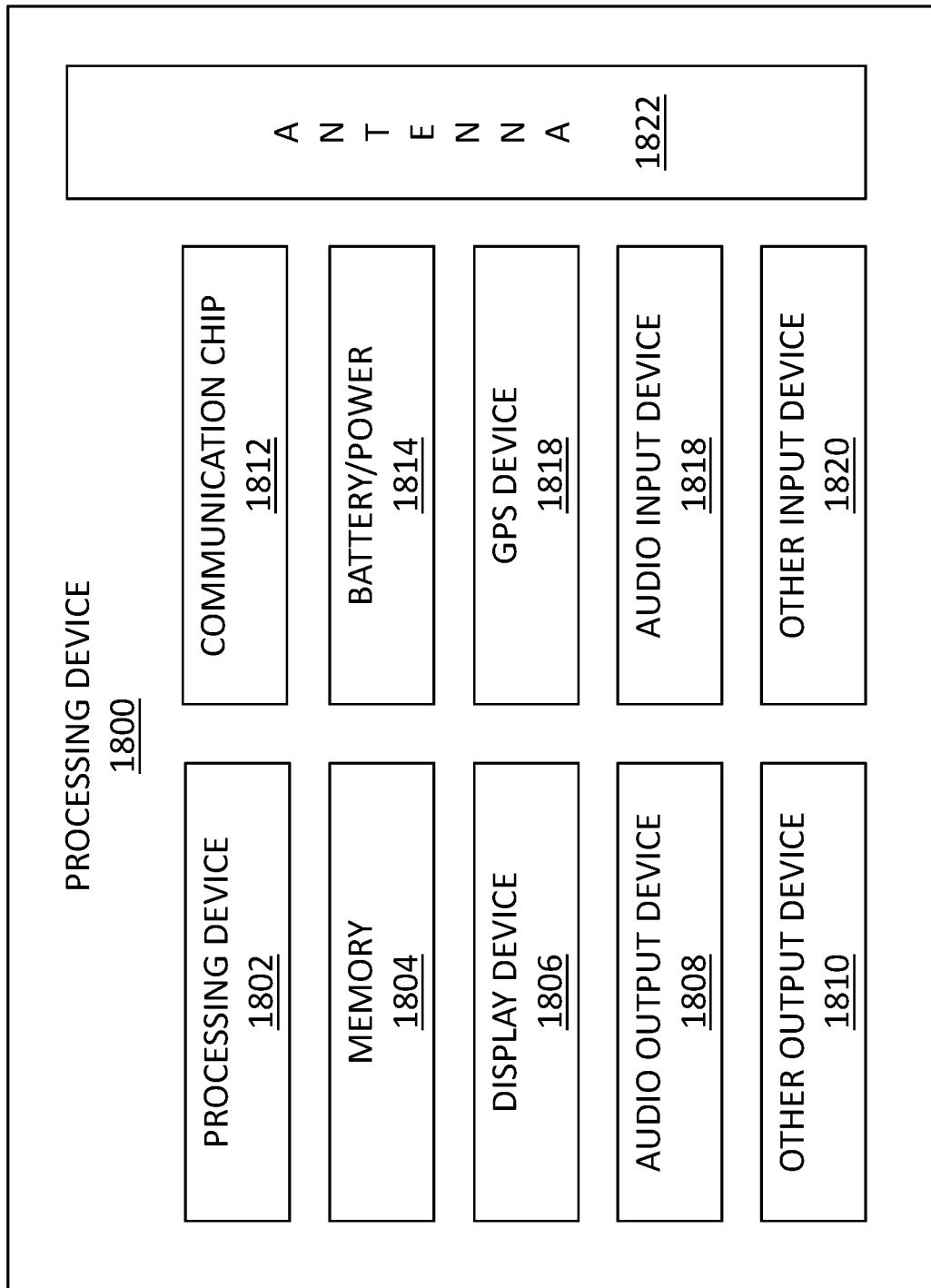
FIG. 16 is a block diagram of an example computing device that may include a patterned metal layer in accordance with any of the embodiments disclosed herein.

FIG. 16 is a block diagram of an example computing device 1800 that may include one or more components including one or more devices including a patterned metal layer in accordance with any of the embodiments disclosed herein. For example, any suitable ones of the components of the computing device 1800 may include a die (e.g., the die 1502 of FIG. 13B) having vias a patterned metal layer as described herein. Any one or more of the components of the computing device 1800 may include, or be included in, an IC device 1600 (FIG. 14). Any one or more of the components of the computing device 1800 may include, or be included in, an IC device assembly 1700 (FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides a method for subtractive metal patterning, the method including depositing a guiding pattern over a metal layer, the guiding pattern including a first anchoring material, the first anchoring material covering a plurality of regions of the metal layer; forming a first polymer over the guiding pattern, the first polymer formed over regions of the metal layer covered by the first anchoring material, and the first polymer arranged over the first anchoring material by DSA; depositing a spacer material over at least a portion the first polymer; and etching a portion of the metal layer exposed by the first polymer and the spacer material.

Example 2 provides the method of example 1, where forming the first polymer over the guiding pattern includes depositing a diblock copolymer including the first polymer and a second polymer over the guiding pattern; and annealing the diblock copolymer to form regions of the first polymer over the first anchoring material, where the second polymer is formed over an area of the metal layer not covered by the first anchoring material.

Example 3 provides the method of example 2, further including removing the second polymer to expose the area of the metal layer not covered by the first anchoring material.

Example 4 provides the method of example 1, where the guiding pattern further includes a second anchoring material, and the second anchoring material covers an area of the metal layer not covered by the first anchoring material.

Example 5 provides the method of any of the preceding examples, where depositing the spacer material includes depositing a first portion of the spacer material over a first region of the first polymer, and depositing a second portion of the spacer material over a second region of the first polymer.

Example 6 provides the method of example 5, where the first portion of the spacer material and the second portion of the spacer material are separated by an opening, the method further including depositing a plug material in the opening to form a plug over a second portion of the metal layer, where the second portion of the metal layer under the opening is not etched.

Example 7 provides the method of any of the preceding examples, where further including depositing a dielectric material in the etched portion of the metal layer, the dielectric material between a first metal region and a second metal region formed in the metal layer.

Example 8 provides the method of any of the preceding examples, further including, prior to depositing the guiding pattern depositing a mask over the metal layer; patterning the mask; etching a second portion of the metal layer exposed by the patterned mask; and depositing a dielectric material in the etched second portion of the metal layer.

Example 9 provides the method of example 8, where patterning the mask includes depositing a second guiding pattern over the metal layer, the second guiding pattern including a second anchoring material; forming a second polymer over the second guiding pattern, the second polymer formed over regions of the metal layer covered by the second anchoring material, and the second polymer arranged over the second anchoring material using DSA; depositing a second spacer material over at least a portion of the second polymer; and etching a portion of the mask exposed by the second polymer and the second spacer material.

Example 10 provides the method of example 8, where etching the second portion of the metal layer results in a metal pattern with a first minimum pitch, and etching the portion of the metal layer exposed by the first polymer and the spacer material results in a metal pattern with a second minimum pitch, where the second minimum pitch is half of the first minimum pitch.

Example 11 provides a method for subtractive metal patterning, the method including depositing a guiding pattern over a mask, the mask over a metal layer, the guiding pattern including a first anchoring material; forming a first polymer over the guiding pattern, the first polymer formed over regions of the mask covered by the first anchoring material, and the first polymer arranged over the first anchoring material by DSA; etching a portion of the mask exposed by the first polymer; and etching a portion of the metal layer exposed by the mask, where a surface area of a remaining portion of the metal layer is less than a surface area of the guiding pattern.

Example 12 provides the method of example 11, where forming the layer of the first polymer over the guiding pattern includes depositing a diblock copolymer including the first polymer and a second polymer over the guiding pattern; and annealing the diblock copolymer to form regions of the first polymer over the first anchoring material, where the second polymer is formed over an area of the mask not covered by the first anchoring material.

Example 13 provides the method of example 12, further including removing the second polymer to expose the area of the mask not covered by the first anchoring material.

Example 14 provides the method of any of examples 11-13, where etching the portion of the mask exposed by the first polymer includes etching regions of the mask under the first polymer, and a surface area of a remaining portion of the mask is less than the surface area of the guiding pattern.

Example 15 provides the method of example 14, where the surface area of a remaining portion of the metal layer is less than the surface area of the remaining portion of the mask.

Example 16 provides the method of any of examples 11-15, where the remaining portion of the metal layer includes two adjacent metal lines, and a width of the metal lines is less than half of a pitch between the metal lines.

Example 17 provides a method for forming a metal layer including patterning a mask over a metal layer, a first portion of the metal layer exposed by the patterned mask; etching the first portion of the metal layer exposed by the patterned mask, where a second portion of the metal layer is not etched; depositing a dielectric material in the etched first portion of the metal layer; depositing a guiding pattern over the metal layer, the guiding pattern including a first anchoring material; forming a first polymer over the first anchoring material, the first polymer formed using DSA; etching portions of the dielectric material exposed by the first polymer; and depositing a second metal in the etched portions of the dielectric material.

Example 18 provides the method of example 17, where patterning the mask over the metal layer includes depositing a second guiding pattern over the mask, the guiding pattern including a second anchoring material; forming a second polymer over the guiding pattern, the second polymer formed using DSA, the second polymer covering a first portion of the mask and exposing a second portion of the mask; and etching at least the second portion of the mask exposed by the second polymer.

Example 19 provides the method of example 17 or 18, where the first anchoring material is deposited over the second portion of the metal layer, and at least a portion of the dielectric material is not covered by the first anchoring material.

Example 20 provides the method of any of examples 17-19, where forming the first polymer over the first anchoring material includes depositing a diblock copolymer including the first polymer and a second polymer over the guiding pattern; and annealing the diblock copolymer to form regions of the first polymer over the first anchoring material, where the second polymer is formed over an area of the metal layer not covered by the first anchoring material.

Example 21 provides the method of example 20, further including removing the second polymer to expose the area of the metal layer not covered by the first anchoring material.

Example 22 provides the method of any of examples 17-21, further including depositing a spacer material over at least a portion of the first polymer; where etching portions of the dielectric material exposed by the first polymer includes etching a portion of the dielectric material exposed by the first polymer and the spacer material.

Example 23 provides the method of any of examples 17-22, where the first metal and the second metal include the same metal.

Example 24 provides the method of any of examples 17-22, where the first metal and the second metal include different metals.

Example 25 provides a method for forming narrow-pitch metal lines including patterning a metal oxide layer over a metal layer, the metal oxide layer including two metal oxide lines arranged at a first pitch, where a width of one of the metal oxide lines is less than half of the first pitch; depositing a first dielectric material between the two metal oxide lines; forming a patterned polymer layer over the metal oxide layer, the patterned polymer layer including two adjacent polymer lines arranged at a second pitch less than the first pitch; etching portions of the first dielectric material exposed by the patterned polymer layer; and etching portions of the metal layer exposed by the etched portions of the first dielectric material.

Example 26 provides the method of example 25, where forming the patterned polymer layer includes depositing a guiding pattern over the metal oxide layer and the first dielectric material, the guiding pattern including first anchoring material; and depositing a diblock copolymer including a first polymer and a second polymer over the guiding pattern, where the patterned polymer layer is formed from the diblock copolymer using DSA, and the two polymer lines are formed of the first polymer.

Example 27 provides the method of example 26, where the patterned polymer layer includes lines formed from the first polymer and lines formed from the second polymer, the method further including removing the second polymer to expose portions of the first dielectric material.

Example 28 provides the method of example 26 or 27, where the first anchoring material is deposited over metal oxide lines in the metal oxide layer, one of the two polymer lines is formed over one of the metal oxide lines, and the other of the two polymer lines is formed over the first dielectric material.

Example 29 provides the method of any of examples 25-28, further including depositing an insulating material in the etched portions of the metal layer to form a metal grating, the metal grating including a plurality of metal lines separated by the insulator.

Example 30 provides the method of example 29, further including depositing a mask over the metal grating; patterning a portion of the mask to expose one of the plurality of metal lines of the metal grating; etching the exposed metal line; and depositing a second insulating material in place of the etched metal line.

Example 31 provides an IC device including grating in an active region, the grating including a first plurality of conductive lines separated by a plurality of insulating lines, where a first pair of adjacent conductive lines in the first plurality of conductive lines are arranged at a pitch, the pitch less than 30 nanometers; and an inactive region adjacent to the active region, the inactive region including a second plurality of conductive lines, where one of the second plurality of conductive lines is offset from one of the plurality of first set of the plurality of conductive lines by less than the pitch.

Example 32 provides the IC device of example 31, where the one of the second plurality of conductive lines is coupled to the one of the first plurality of conductive lines.

Example 33 provides the IC device of example 31 or 32, where the pitch is a first pitch, and a second pair of adjacent conductive lines in the first plurality of conductive lines are arranged at a second pitch, and the second pitch is within +10% of twice the first pitch.

Example 34 provides the IC device of any of examples 31 through 33, where the first plurality of conductive lines include a first subset of conductive lines and a second subset of conductive lines, the first subset of conductive lines including a first metal, and the second subset of conductive lines including a second metal different from the first metal.

Example 35 provides the IC device of example 34, where one of the first subset of conductive lines including the first metal is positioned between two of the second subset of conductive lines including the second metal.

Example 36 provides the IC device of any of examples 31 through 35, where the second plurality of conductive lines form a fingerprint pattern.

Example 37 provides the IC device of any of examples 31 through 36, where one of the first plurality of conductive lines has a line width, the line width less than half the pitch.

Example 38 provides the IC device of example 37, where the line width is less than a third of the pitch.

Example 39 provides the IC device of any of examples 31 through 36, where one of the first plurality of conductive lines has a line width, the line width greater than half the pitch.

Example 40 provides the IC device of example 39, where the line width is greater than two thirds of the pitch.

Example 41 provides an IC package that includes an IC die, including one or more of the memory/IC devices according to any one of the preceding examples. The IC package may also include a further component, coupled to the IC die.

Example 42 provides the IC package according to example 41, where the further component is one of a package substrate, a flexible substrate, or an interposer.

Example 43 provides the IC package according to examples 41 or 42, where the further component is coupled to the IC die via one or more first level interconnects.

Example 44 provides the IC package according to example 43, where the one or more first level interconnects include one or more solder bumps, solder posts, or bond wires.

Example 45 provides a computing device that includes a circuit board; and an IC die coupled to the circuit board, where the IC die includes one or more of the memory/IC devices according to any one of the preceding examples (e.g., memory/IC devices according to any one of examples 1-40), and/or the IC die is included in the IC package according to any one of the preceding examples (e.g., the IC package according to any one of examples 41-44).

Example 46 provides the computing device according to example 45, where the computing device is a wearable computing device (e.g., a smart watch) or handheld computing device (e.g., a mobile phone).

Example 47 provides the computing device according to examples 45 or 46, where the computing device is a server processor.

Example 48 provides the computing device according to examples 45 or 46, where the computing device is a motherboard.

Example 49 provides the computing device according to any one of examples 45-48, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:
a grating in an active region, the grating comprising a first plurality of conductive lines separated by a plurality of insulating lines, wherein a first pair of adjacent conductive lines in the first plurality of conductive lines are arranged at a pitch, the pitch less than 30 nanometers, and the first plurality of conductive lines comprises:
a first subset of conductive lines comprising a first metal, and
a second subset of conductive lines comprising a second metal different from the first metal; and
an inactive region adjacent to the active region, the inactive region comprising a second plurality of conductive lines, wherein a first line of the first plurality of conductive lines is coupled to a second line of the second plurality of conductive lines, and the first line is offset from the second line by less than the pitch.

2. The IC device of claim 1, wherein the pitch is a first pitch, and a second pair of adjacent conductive lines in the first plurality of conductive lines are arranged at a second pitch, and the second pitch is within ±10% of twice the first pitch.

3. The IC device of claim 1, wherein one of the first subset of conductive lines comprising the first metal is positioned between two of the second subset of conductive lines comprising the second metal.

4. The IC device of claim 1, wherein the second plurality of conductive lines form a fingerprint pattern.

5. The IC device of claim 1, wherein the first line has a line width, the line width less than half the pitch.

6. The IC device of claim 5, wherein the line width is less than a third of the pitch.

7. The IC device of claim 1, wherein the first line has a line width, the line width greater than half the pitch.

8. The IC device of claim 7, wherein the line width is greater than two thirds of the pitch.

9. The IC device of claim 1, wherein the first line and the second line comprise a same conductive material.

10. A device comprising:
a first region;
a second region; and
a grating extending across at least a portion of the first region and a portion of the second region, the grating comprising a plurality of conductive lines, wherein a first pair of adjacent conductive lines are arranged at a pitch that is less than 30 nanometers, portions of the conductive lines in the first region are offset from portions of the conductive lines in the second region by less than the pitch, and one of the conductive lines comprises:
a first portion in the first region;
a second portion in the second region; and
a transition portion between the first portion and the second portion, wherein the transition portion is not parallel to the first portion or the second portion.

11. The device of claim 10, wherein the first portion of the conductive line in the first region extends in a direction parallel to the second portion of the conductive line in the second region.

12. The device of claim 10, wherein the pitch is a first pitch, and a second pair of adjacent conductive lines are arranged at a second pitch, and the second pitch is within ±10% of twice the first pitch.

13. The device of claim 10, wherein the conductive lines comprise a first subset of conductive lines and a second subset of conductive lines, the first subset of conductive lines comprising a first metal, and the second subset of conductive lines comprising a second metal different from the first metal.

14. The device of claim 10, the grating further comprising a floating metal line in the second region, wherein the floating metal line does not extend into the first region.

15. A system comprising:
a circuit board; and
a die coupled to the circuit board, the die having an active region and an inactive region, the die comprising:
a first grating in the active region, the first grating comprising a first plurality of conductive lines separated by a plurality of insulating lines, wherein a first pair of adjacent conductive lines in the first plurality of conductive lines are arranged at a pitch, the pitch less than 30 nanometers;
a second grating in the inactive region, the second grating comprising a second plurality of conductive lines, wherein a first line of the first plurality of conductive lines is coupled to a second line of the second plurality of conductive lines, and the first line is offset from the second line by less than the pitch; and
a transition region between the active region and the inactive region, the transition region comprising a transition segment between the first line and the second line, and the transition segment is not parallel to the first line or the second line.

16. The system of claim 15, wherein the first line and the second line comprise a same conductive material.

17. The system of claim 15, wherein the first line is parallel to the second line.

18. The system of claim 15, wherein the first plurality of conductive lines comprises:
   a first subset of conductive lines comprising a first metal, and
   a second subset of conductive lines comprising a second metal different from the first metal.

19. The system of claim 18, wherein one of the first subset of conductive lines is between a second pair of lines of the second subset of conductive lines.

20. The system of claim 15, wherein the second plurality of conductive lines form a fingerprint pattern.

* * * * *